(12) United States Patent
Kim

(10) Patent No.: US 12,339,318 B2
(45) Date of Patent: *Jun. 24, 2025

(54) NPU CAPABLE OF BEING TESTED DURING RUNTIME

(71) Applicant: DEEPX CO., LTD., Seongnam-si (KR)

(72) Inventor: Lok Won Kim, Seongnam-si (KR)

(73) Assignee: DEEPX CO., LTD., Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/626,451

(22) Filed: Apr. 4, 2024

(65) Prior Publication Data

US 2024/0264226 A1    Aug. 8, 2024

Related U.S. Application Data

(63) Continuation of application No. 17/562,979, filed on Dec. 27, 2021, now Pat. No. 11,988,709.

(30) Foreign Application Priority Data

Dec. 31, 2020  (KR) .................. 10-2020-0189414
Dec. 16, 2021  (KR) .................. 10-2021-0181082

(51) Int. Cl.
  *G01R 31/00*    (2006.01)
  *G01R 31/317*   (2006.01)
  *G06N 3/02*     (2006.01)

(52) U.S. Cl.
  CPC .  *G01R 31/31701* (2013.01); *G01R 31/31713* (2013.01); *G06N 3/02* (2013.01)

(58) Field of Classification Search
  CPC ............ G01R 31/2843; G01R 31/2853; G01R 31/31701; G01R 31/31713; G06N 3/02; G06N 3/045; G06N 3/063; G06F 11/27
  See application file for complete search history.

(56) References Cited

U.S. PATENT DOCUMENTS 6,085,332 A    7/2000  El-Batal
6,587,979 B1   7/2003  Lawrence et al.
8,397,188 B1   3/2013  Scheidt
(Continued)

FOREIGN PATENT DOCUMENTS

CA    3151195 A1   4/2021
CN    111417932 A  7/2020

*Primary Examiner* — Thang X Le
(74) *Attorney, Agent, or Firm* — Bridgeway IP Law Group, PLLC; Jihun Kim

(57) ABSTRACT

This disclosure proposes an inventive system capable of testing a component in the system during runtime. The system may comprise: a substrate; a plurality of functional components, of the plurality of functional components being mounted onto the substrate and including a circuitry; a system bus formed with electrically conductive pattern onto the substrate thereby allowing the plurality of functional components to communicate with each other; one or more wrappers, each of the one or more wrappers connected to one of the plurality of functional components; and an in-system component tester (ICT) configured to: select, as a component under test (CUT), at least one functional component, in an idle state, of the plurality of the functional components; and test, via the one or more test wrappers, the at least one functional component selected as the CUT.

20 Claims, 34 Drawing Sheets

(56) References Cited

U.S. PATENT DOCUMENTS

| | | | |
|---|---|---|---|
| 9,002,673 B2* | 4/2015 | Behzad | G01R 31/3025 |
| | | | 702/108 |
| 10,557,886 B2* | 2/2020 | Nahum | G01R 31/287 |
| 11,162,997 B2* | 11/2021 | Lee | H01H 47/002 |
| 11,467,830 B2 | 10/2022 | Deadman et al. | |
| 2003/0221140 A1 | 11/2003 | Bakke et al. | |
| 2005/0172172 A1 | 8/2005 | Beacom et al. | |
| 2005/0216644 A1 | 9/2005 | Dickens et al. | |
| 2007/0106923 A1 | 5/2007 | Aitken et al. | |
| 2007/0260934 A1 | 11/2007 | Smith et al. | |
| 2008/0010569 A1 | 1/2008 | Whetsel et al. | |
| 2012/0226942 A1 | 9/2012 | Gangasani et al. | |
| 2012/0233504 A1* | 9/2012 | Patil | G06F 11/2242 |
| | | | 714/E11.02 |
| 2013/0318399 A1* | 11/2013 | Srebranig | G06F 11/3692 |
| | | | 714/E11.178 |
| 2015/0293173 A1 | 10/2015 | Tsuboi et al. | |
| 2016/0011260 A1 | 1/2016 | Dervisoglu et al. | |
| 2016/0349320 A1 | 12/2016 | Laisne et al. | |
| 2017/0062074 A1* | 3/2017 | Kim | G11C 29/26 |
| 2019/0171538 A1 | 6/2019 | Gulati et al. | |
| 2019/0258251 A1 | 8/2019 | Ditty et al. | |
| 2019/0353696 A1 | 11/2019 | Hsu et al. | |
| 2020/0073774 A1 | 3/2020 | Deb et al. | |
| 2021/0183461 A1* | 6/2021 | Johnson | G11C 29/4401 |
| 2021/0194237 A1 | 6/2021 | Joos | |
| 2021/0286693 A1 | 9/2021 | Alben et al. | |
| 2021/0326229 A1 | 10/2021 | Sagar et al. | |
| 2022/0101887 A1* | 3/2022 | Han | G11C 5/025 |
| 2022/0215896 A1* | 7/2022 | Nadeau-Dostie | G11C 29/802 |

* cited by examiner

NPU CAPABLE OF BEING TESTED DURING RUNTIME

CROSS-REFERENCE TO RELATED APPLICATIONS

This application is a continuation application of the U.S. Utility patent application Ser. No. 17/562,979 filed on Dec. 27, 2021, which claims the priority of Korean Patent Application No. 10-2020-0189414 filed on Dec. 31, 2020 and No. 10-2021-0181082 filed on Dec. 16, 2021, in the Korean Intellectual Property Office, the disclosure of which is incorporated herein by reference.

BACKGROUND OF THE DISCLOSURE

Technical Field

The present disclosure relates to a detection of a failure of a system in a runtime.

Background Art

Artificial intelligence (AI) can refer to intelligence which artificially imitates human intelligence, to provide intelligence for recognition, classification, inference, prediction, control/decision making, etc.

Recently, in order to accelerate an operation speed for artificial intelligence (AI), a neural processing unit (NPU) is being developed.

Such NPUs can cooperate with a system having various semiconductor components implemented into a printed circuit board (PCB)-based board level system.

As high integration can be implemented in accordance with the development of a semiconductor manufacturing process technology, a "system on chip" (SoC) in which various semiconductor components such as processors, memories, and peripheral devices are implemented in one chip or a "system in package" (SiP) in which various semiconductor components such as processors, memories, and peripheral devices are implemented in one package is being proposed.

SoC refers to a semiconductor device (chip) which contains the entire system in one chip and refers to a technology in which major semiconductor elements such as arithmetic units, memory, and data conversion elements are implemented in one chip. SiP refers to a semiconductor device which contains the entire system in one package and refers to a technology in which major semiconductor elements such as arithmetic units, memory, and data conversion elements are implemented in one package. That is, a central processing unit (CPU) of a computer, a digital signal processing (DSP) chip, a microcontroller unit (MCU), and the like are integrated in one semiconductor die or package so that the chip or the package itself serves as one system. As described above, when a semiconductor device having various functions is combined into one chip, circuit board space is significantly reduced so that the sizes of various electronics may also be reduced. Further, as compared with a technology that separately manufactures a plurality of semiconductor devices, a semiconductor device manufacturing cost is significantly lowered so that the unit sales price of the electronics is also lowered. Accordingly, the SoC or SiP techniques which integrate many components and/or functions are emerging as a core component technology in the advanced digital era, which concentrates on high performance, low cost, and small size.

SUMMARY OF THE DISCLOSURE

The inventor of the present disclosure has recognized that when the NPU is integrated in the SoC or SiP, a size of the board substrate is reduced so that a size of the electronics may be reduced as well.

Further, the inventor of the present disclosure has recognized that when the NPU is integrated in the SoC or SiP, the manufacturing cost may be reduced as compared with the semiconductor devices which are individually manufactured.

However, the inventor of the present disclosure has also recognized that when a plurality of semiconductor components for the NPU is integrated in the SoC or SiP, the complexity is significantly increased, which increases a defect rate during the manufacturing process. Some defect(s) during the manufacturing process may be found during the testing phase before the shipment from the factory, but certain minute defects for some components which are integrated in the SoC or SiP may be difficult to be found during the testing phase before the factory shipment and thus unsatisfactory products may be handed over to users. Some minute defects may be gradually amplified due to a fatigue stress or a physical stress by repeated usage, which can ultimately cause an erroneous operation of the SoC or SiP.

When the SoC or SiP is implemented in relatively low-cost consumer goods, some types of erroneous operations may not be so problematic. However, the inventor of the present disclosure has recognized that when the SoC or SiP is mounted in high-performance mission-critical products, the situation is quite different.

Specifically, the inventor of the present disclosure has recognized a problem in that when the NPU in the SoC or SiP erroneously operates due to the failure, defect, or damage, unpredictable artificial intelligence (AI) operation results may be output.

For example, the inventor of the present disclosure has recognized that when the SoC or SiP including the NPU is used for an electronic device mounted in an autonomous driving vehicle, a drone, an urban air mobility (UAM) vehicle, an unmanned aerial vehicle (UAV) or used for an electronic device mounted in an AI robot, the unpredictable AI operation results may be output due to the failure, defect, or damage of the NPU.

Therefore, the inventor of the present disclosure has recognized that it is necessary to propose a method for performing certain types of testing before factory shipment, with respect to the SoC or SiP in the runtime.

In other words, the present inventor recognized that certain types of defects, with respect to artificial intelligence applications and technologies, should potentially be found through specific testing procedures or methods.

An aspect of this disclosure provides a system capable of testing a component in the system during runtime, the system comprising: a substrate; a plurality of functional components on the substrate and at least one of the functional components including circuitry; a system bus in a form of electrically conductive patterns on the substrate that allow the plurality of functional components to communicate with each other; one or more test wrappers, each of the one or more test wrappers connected to at least one of the plurality of functional components; and an in-system component tester (ICT) configured to: select, as a component under test (CUT), at least one functional component, in an idle state, of the plurality of the functional components; and test, via the one or more test wrappers, the at least one functional component selected as the CUT.

The ICT may be further configured to: monitor, via the one or more test wrappers, one or more states of the plurality of the functional components.

The ICT may be further configured to: stop the test with respect to the at least one functional component, based on a detection of a collision with an access from the system bus to the at least one functional component; and allow a connection of the at least one functional component to return back to the system bus, based on the stop.

The ICT may be further configured to: return to the select step, if the at least one functional component is in the idle state again, after the connection of the at least one functional component is returned back to the system bus.

The returning to the selection step may occur after a back-off timer with respect to the collision expires.

The plurality of functional components may include: one or more universal processing units (UPUs).

The UPU may include: one or more central processing units (CPUs); one or more graphic processing units (GPUs); and one or more neural processing units (NPUs) configured to perform operations for an artificial neural network (ANN) model.

The plurality of functional components may further include one or more of: at least one memory; at least one memory controller; and at least one input and output (I/O) controller.

The ICT may be further configured to: instruct, for the testing step, the one or more test wrappers to isolate from the system bus a connection of the at least one functional component.

The ICT may include at least one or more of: a detector configured to monitor one or more states of the plurality of the functional components; a scheduler configured to manage operations of the ICT; a generator configured to generate test input data; and a tester configured to inject the test input data into the CUT and analyze a test result acquired from the CUT processing the test input data.

The test input data may be a predefined test data or random bit streams which are generated based on a seed.

The ICT may be further configured to: perform an analysis of a test result acquired from the at least one functional component, after the testing step is completed; and allow a connection of the at least one functional component to the system bus or to another system connection, based on the at least one functional component found to be normal after the analysis.

The ICT may be further configured to: deactivate the at least one functional component, if the at least one functional component is found to be defective.

The system may further comprise: a field programmable gate array (FPGA) configured to imitate the at least one functional component that is found to be defective.

The FPGA's address may be revoked and replaced by an address of the at least one functional component that is found to be defective.

The deactivating step may include revoking an address of the at least one functional component that is found to be defective or includes powering off the at least one functional component that is found to be defective.

The deactivating step may include isolating the at least one functional component being analyzed as defective from the system bus by cutting off a system bus connection to the at least one functional component that is found to be defective.

The plurality of functional components may include a spare component that can replace the at least one functional component that is found to be defective; and wherein the ICT is further configured to activate the spare component.

The testing step may include a scan test, which is different from a function test, and wherein, for the scan test, the ICT is further configured to: connect a plurality of flip-flops in each CUT to each other, inject test input into at least one flip-flop, and acquire a test result from operations of combinational logics of the flip-flops to analyze whether the CUT is defective or normal during runtime.

The plurality of functional components may include a neural processing unit (NPU), the NPU including a plurality of processing element arrays and being configured to select and test at least one processing element of the plurality of processing element arrays.

The plurality of the test wrappers may structurally isolate the system bus from signal interference.

According to another aspect, this disclosure provides an apparatus comprising: a plurality of functional components respectively connected to a system bus via a respective one of a plurality of test wrappers; and an in-system component tester (ICT), operatively connected to the system bus and to the test wrappers, configured to perform operational testing of at least one functional component to determine whether the function component is normal or defective, wherein the operational testing is performed during an operational run-time of the apparatus, wherein the system bus, the test wrappers and the ICT are mounted together on a same substrate or a same board.

If the at least one functional component is detected to be in an idle state during the operational run-time of the apparatus, the functional component may be isolated from the system bus, and the ICT performs the operational testing on such isolated functional component.

If the functional component is found to be not defective, the functional component may be returned to the system bus.

If the functional component is found to be defective, such defective functional component may be kept isolated from the system bus.

The plurality of functional components may include a spare component that is capable of being activated when the functional component is found to be defective as a result of the operational testing.

The apparatus may further comprise: a field programmable gate array (FPGA), operatively connected to the system bus and to the ICT, capable of being adapted to perform at least some functionalities of the functional component that is found to be defective as a result of the operational testing.

The plurality of the test wrappers may have an arrangement that provides isolation for the system bus.

Even though the present disclosure mainly describes the SoC, the present disclosure is not limited to the SoC, but may be applied to a system in package (SIP) or a printed circuit board (PCB)-based board level system.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
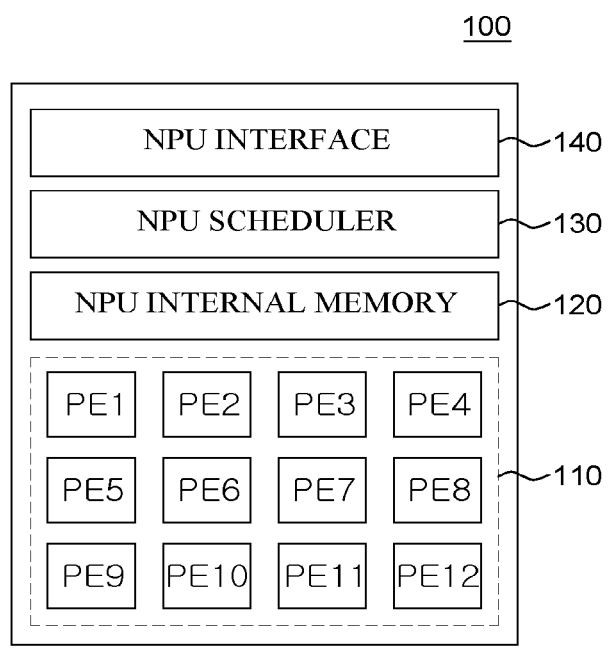
FIG. 1 is a schematic conceptual view illustrating a neural processing unit according to the present disclosure.

Specific structural or step-by-step descriptions for the embodiments according to the concept of the present disclosure disclosed in the present specification or application are merely illustrative for the purpose of describing the embodiments according to the concept of the present disclosure. The examples according to the concept of the present disclosure may be carried out in various forms and are not interpreted to be limited to the examples described in the present specification or application.

Various modifications and changes may be applied to the examples in accordance with the concept of the present disclosure and the examples may have various forms so that the examples will be described in detail in the specification or the application with reference to the drawings. However, it should be understood that the examples according to the concept of the present disclosure is not limited to the specific examples, but includes all changes, equivalents, or alternatives which are included in the technical scope of the present disclosure.

Terminologies such as first and/or second may be used to describe various components but the components are not limited by the above terminologies. The above terminologies are used to distinguish one component from the other component, for example, a first component may be referred to as a second component without departing from a scope in accordance with the concept of the present invention and similarly, a second component may be referred to as a first component.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is present therebetween. Other expressions which describe the relationship between components, for example, "between," "adjacent to," and "directly adjacent to" should be interpreted in the same manner.

Terminologies used in the present specification are used only to describe specific examples, and are not intended to limit the present disclosure. A singular form may include a plural form if there is no clearly opposite meaning in the context. In the present specification, it should be understood that terms "include" or "have" indicate that a feature, a number, a step, an operation, a component, a part, or a combination thereof described in the specification is present, but do not exclude a possibility of presence or addition of one or more other features, numbers, steps, operations, components, parts, or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if it is not clearly defined in this specification.

When the examples are described, a technology which is well known in the technical field of the present disclosure and is not directly related to the present disclosure will not be described. The reason is that unnecessary description is omitted to clearly transmit the gist of the present disclosure without obscuring the gist.

<Definition of Terminologies>

Here, in order to help the understanding of the disclosure proposed in the present specification, terminologies used in the present specification will be defined briefly hereafter.

NPU is an abbreviation for a neural processing unit and refers to a processor specialized for an operation of an artificial neural network model separately from the central processing unit (CPU).

ANN is an abbreviation for an artificial neural network and refers to a network which connects nodes in a layered structure by imitating the connection of the neurons in the human brain through a synapse to imitate the human intelligence.

Information about a structure of an artificial neural network includes information about the number of layers, the number of nodes in a layer, a value of each node, information about an operation processing method, and information about a weight matrix which is applied to each node.

Information about data locality of an artificial neural network is information which predicts an operation order of an artificial neural network model which is processed by the neural processing unit based on a data access request order which is requested to a separate memory by the neural processing unit.

DNN is an abbreviation for a deep neural network and may mean that the number of hidden layers of the artificial neural network is increased to implement higher artificial intelligence.

CNN is an abbreviation for a convolutional neural network and is a neural network which functions similar to the image processing performed in a visual cortex of the human brain. The convolutional neural network is known to be appropriate for image processing and is known to be easy to extract features of input data and identify the pattern of the features.

Kernel means a weight matrix which is applied to the CNN. Seed is a term in machine learning (ML) that means an initialization state of a pseudo random number generator. A seed value is set to ensure reproducibility of the result that an individual would have got by running a particular ML algorithm. Namely, the "seed" is a starting point for the sequence and the guarantee is that if you start from the same seed, you will get the same sequence of numbers.

Hereinafter, the present disclosure will be described in detail by explaining examples of the present disclosure with reference to the accompanying drawings.

FIG. 1 illustrates a neural processing unit according to the present disclosure.

A neural processing unit (NPU) 100 illustrated in FIG. 1 is a processor specialized to perform an operation for an artificial neural network.

The artificial neural network refers to a network in which are collected artificial neurons which, when various inputs or entry stimulations, multiply a weight by the inputs or stimulations, add the multiplied values, and convert a value obtained by additionally adding a deviation using an active function to transmit. The artificial neural network trained as described above may be used to output an inference result from input data.

The neural processing unit 100 may be a semiconductor device implemented by an electric/electronic circuit. The electric/electronic circuit may refer to a circuit including a large number of electronic elements (transistors, capacitors, etc.). The neural processing unit 100 includes a processing element (PE) array 110 (shown in FIG. 1 to have PE1 through PE12, but not limited hereto), an NPU internal memory 120, an NPU scheduler 130, and an NPU interface 140. Each of the processing element array 110, the NPU internal memory 120, the NPU scheduler 130, and the NPU interface 140 may be a semiconductor circuit to which a large number of the electronic elements are connected. Therefore, some of the electronic elements may be difficult to identify or be distinguished with the naked eye, but may be identified only by its operation. For example, an arbitrary circuit may operate as the processing element array 110 or operate as the NPU scheduler 130.

The neural processing unit 100 may include the processing element array 110, the NPU internal memory 120 configured to store an artificial neural network model inferred from the processing element array 110, and the NPU scheduler 130 configured to control the processing element array 110 and the NPU internal memory 120 based on data locality information or information about a structure of the artificial neural network model. Here, the artificial neural network model may include the data locality information or the information about the structure of the artificial neural network. The artificial neural network model may refer to an AI recognition model trained to perform a specific inference function.

The processing element array 110 may perform an operation for an artificial neural network. For example, when input data is input, the processing element array 110 may allow the artificial neural network to perform certain learning operations. When the input data is input after completing the learning procedure(s), the processing element array 110 may perform an operation of deducing an inference result through the artificial neural network which completes the learning.

Figure 5A:
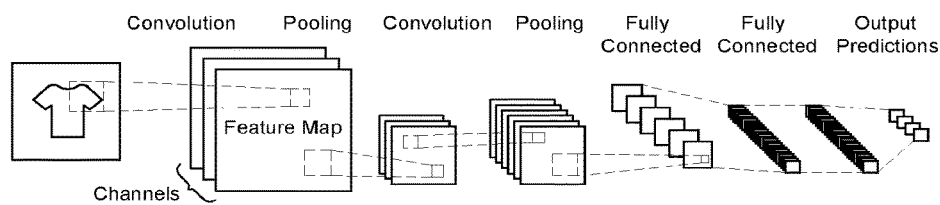
FIG. 5A is a view illustrating a basic structure of a convolution neural network.
Figure 6A:
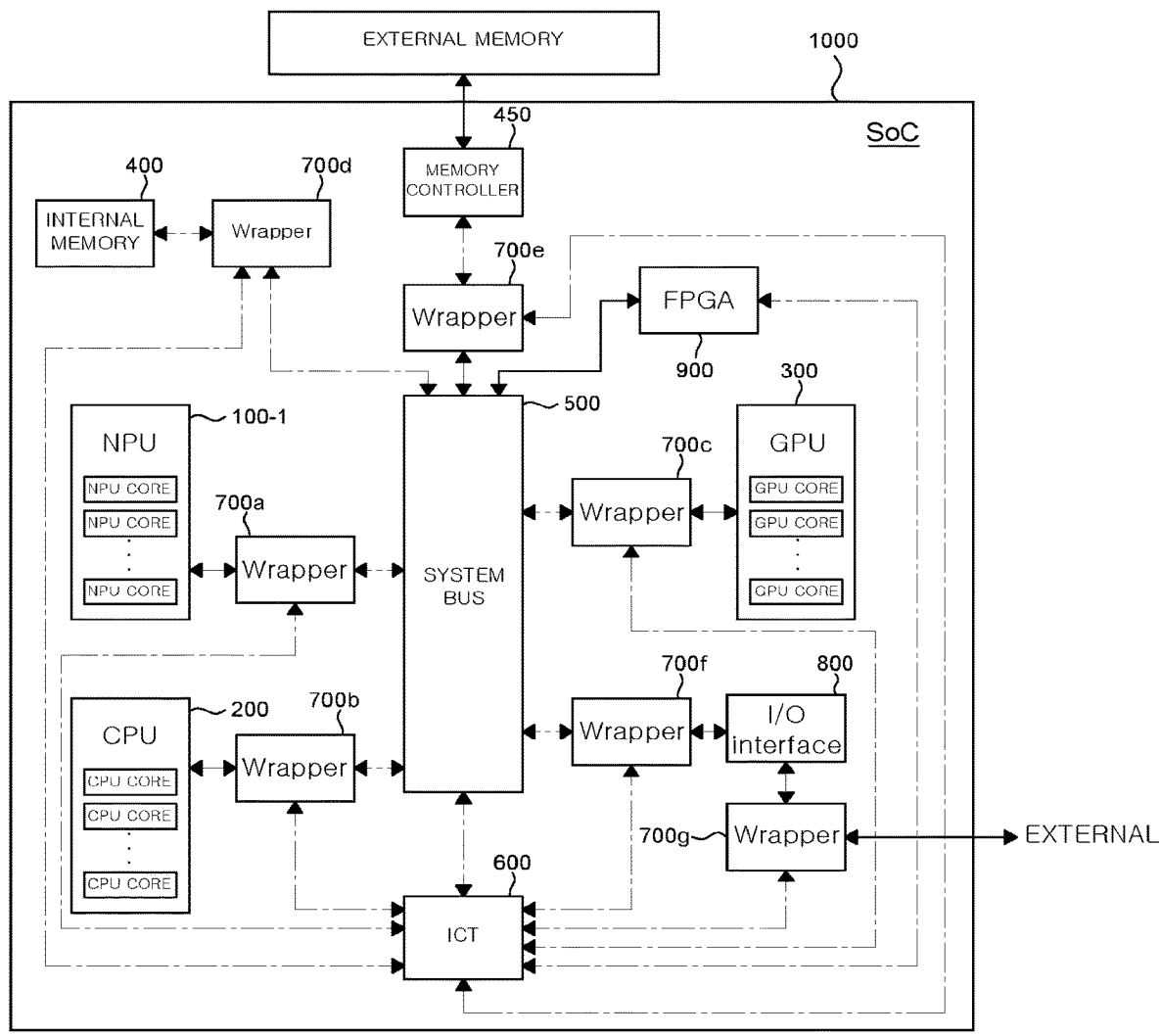
FIG. 6A is a view illustrating an exemplary architecture of a system on chip (SoC) including an NPU of FIG. 1 or 3.
Figure 6B:
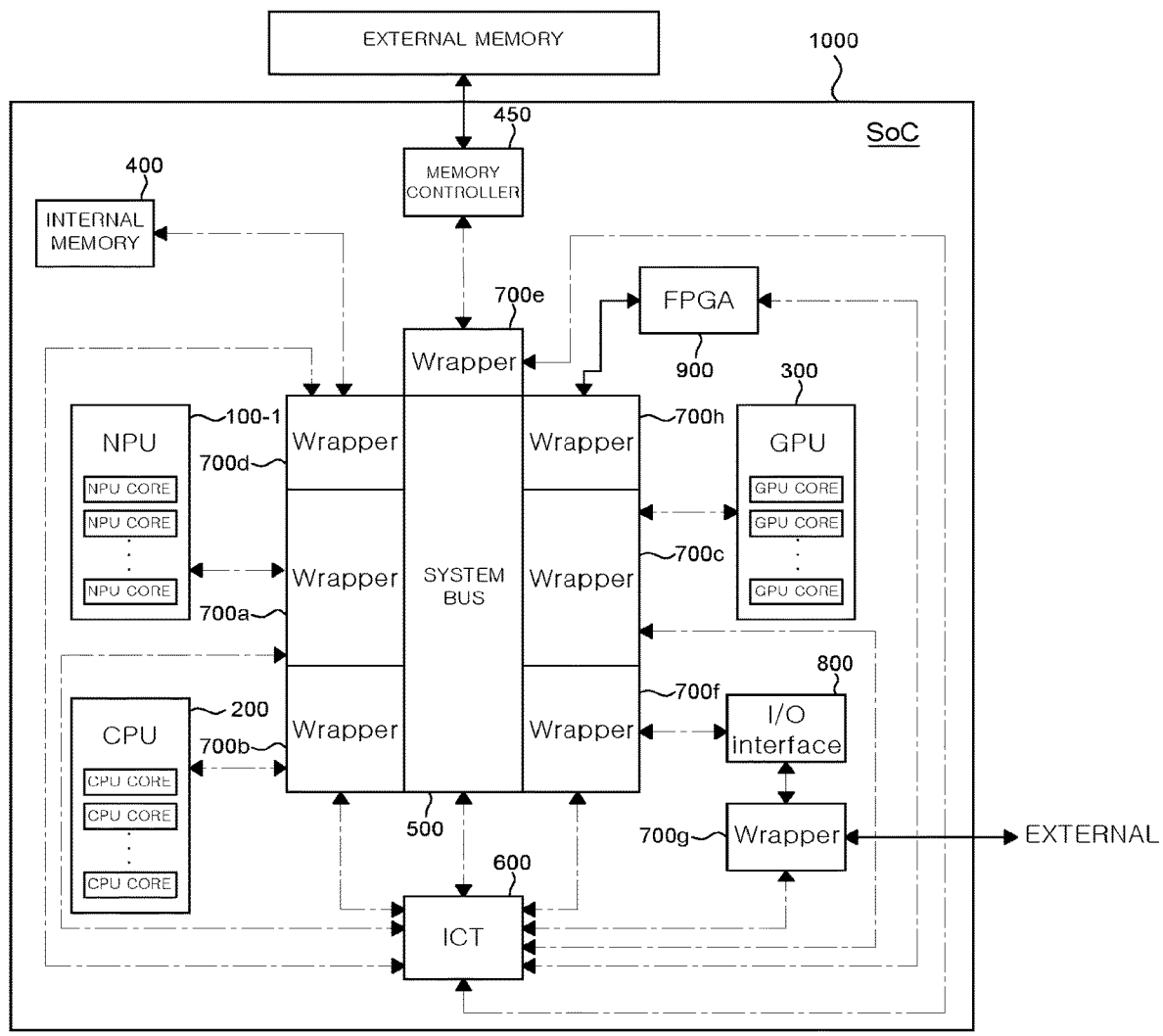
FIG. 6B is a view illustrating a first modified example of FIG. 6A.

The NPU interface 140 may communicate with various components in an ANN driving device of FIG. 5A, 6A, or 6B, for example, memories, via a system bus.

For example, the neural processing unit 100 may call data of the artificial neural network model stored in a memory 200 of FIG. 5A, 6A, or 6B, through the NPU interface 140 into the NPU internal memory 120.

The NPU scheduler 130 is configured to control an operation of the processing element array 110 and read/write instructions of the NPU internal memory 120 for an inference operation of the neural processing unit 100.

The NPU scheduler 130 may be configured to analyze the data locality information or the information about the structure of the artificial neural network model to control the processing element array 110 and the NPU internal memory 120.

The NPU scheduler 130 may analyze or receive information related to a structure of an artificial neural network model which may operate in the processing element array 110. Data of the artificial neural network, which may be included in the artificial neural network model, may store node data of each layer, placement data locality information of layers or information about the structure, and weight data of each of connection networks connecting the nodes of the layers. The data of the artificial neural network may be stored in a memory provided in the NPU scheduler 130 or the NPU internal memory 120. The NPU scheduler 130 may access the memory 200 of FIG. 5A, 6A, or 6B to utilize necessary data. However, it is not limited thereto, so that the data locality information or the information about the structure of the artificial neural network model may be generated based on data such as node data and weight data of the artificial neural network model. The weight data may also be referred to as a weight kernel. The node data is also referred to as a feature map. For example, data which defines a structure of the artificial neural network model may be generated when an artificial neural network model is designed or the learning is completed, but the present disclosure is not limited thereto.

The NPU scheduler 130 may schedule an operation order of the artificial neural network model based on the data locality information or the information about the structure of the artificial neural network model.

The NPU scheduler 130 may acquire a memory address value in which node data of a layer of the artificial neural network model and weight data of the connection network are stored based on the data locality information or the information about the structure of the artificial neural network model. For example, the NPU scheduler 130 may acquire the memory address value in which the node data of the layer of the artificial neural network model and the weight data of the connection network which are stored in the memory are stored. Accordingly, the NPU scheduler 130 may acquire node data of a layer of an artificial neural network model to be driven, and weight data of a connection network from the memory 200, to store the acquired data in the NPU internal memory 120. Node data of each layer may have a corresponding memory address value. The weight data of each connection network may have a corresponding memory address value.

The NPU scheduler 130 may schedule an operation order of the processing element array 110 based on the data locality information or the information about the structure of the artificial neural network model, for example, the placement data locality information of layers of the artificial neural network or the information about the structure of the artificial neural network model.

The NPU scheduler 130 performs scheduling operations based on the data locality information or the information about the structure of the artificial neural network model so that the NPU scheduler may operate in a different way from a scheduling concept of a normal CPU. The scheduling of the normal CPU operates to provide the highest efficiency in consideration of at least one among fairness, efficiency, stability, and reaction time. That is, the normal CPU schedules to perform the most processing during the same time in consideration of a priority and an operation time.

A known CPU uses an algorithm which schedules a task in consideration of data such as a priority or an operation processing time of each processing. In contrast, the NPU scheduler 130 may determine a processing order based on the data locality information or the information about the structure of the artificial neural network model.

Moreover, the NPU scheduler 130 may determine the processing order based on the data locality information or the information about the structure of the artificial neural network model and/or data locality information or information about a structure of a neural processing unit 100 to be used.

However, the present disclosure is not limited to the data locality information or the information about the structure of the neural processing unit 100. For example, the data locality information or the information about the structure of the neural processing unit 100 may determine the processing order by utilizing at least one data of a memory size of the NPU internal memory 120, a hierarchy structure of the NPU internal memory 120, number (size) data of processing elements PE1 to PE12, and an operator structure of the processing elements PE1 to PE12. That is, the data locality information or the information about the structure of the neural processing unit 100 may include at least one data of a memory size of the NPU internal memory 120, a hierarchy structure of the NPU internal memory 120, number data of processing elements PE1 to PE12, and an operator structure of the processing elements PE1 to PE12. However, the present disclosure is not limited to the data locality information or the information about the structure of the neural processing unit 100. The memory size of the NPU internal memory 120 includes information about a memory capacity. The hierarchy structure of the NPU internal memory 120 includes information about a connection relationship between specific layers for each hierarchy structure. The operator structure of the processing elements PE1 to PE12 includes information about components in the processing elements.

The neural processing unit 100 according to an example of the present disclosure may include at least one processing element, the NPU internal memory 120 which stores an artificial neural network model inferred from the at least one processing element, and the NPU scheduler 130 configured to control the at least one processing element and the NPU internal memory 120 based on data locality information or information about the structure of the artificial neural network model. The NPU scheduler 130 may be configured to be further supplied with the data locality information or the information about the structure of the neural processing unit 100. Further, the data locality information or the information about the structure of the neural processing unit 100 may include at least one data of a memory size of the NPU internal memory 120, a hierarchy structure of the NPU internal memory 120, number (size) data of at least one processing element, and an operator structure of the at least one processing element.

According to the structure of the artificial neural network model, the operation for each layer is sequentially performed. That is, when the structure of the artificial neural network model is confirmed, the operating order for every layer may be determined. The order of the operation or an order of the data flow in accordance with the structure of the artificial neural network model may be defined as a data locality of an artificial neural network model at an algorithm level.

When a compiler compiles the artificial neural network model to be executed in the neural processing unit 100, the artificial neural network data locality of the artificial neural network model at a neural processing unit-memory level may be reconstructed.

That is, the data locality of the artificial neural network model at a neural processing unit-memory level may be constructed in accordance with the compiler, algorithms applied to the artificial neural network model and an operation characteristic of the neural processing unit 100.

For example, even in the same artificial neural network model, the artificial neural network data locality of the artificial neural network model to be processed may be differently configured in accordance with a method of operating the artificial neural network model by the neural processing unit 100, such as feature map tiling or stationary technique of a processing element, the number of processing elements of the neural processing unit 100, a cache memory capacity such as a feature map or a weight in the neural processing unit 100, a memory hierarchy structure in the neural processing unit 100, and an algorithm characteristic of a compiler which determines an order of an operation of the neural processing unit 100 to operate the artificial neural network model. This is because even though the same artificial neural network model is computed by the above-mentioned factors, the neural processing unit 100 may determine differently the order of data necessary at every moment in the unit of clock cycles.

The compiler may determine the order of data required for a physical operation processing by constructing the artificial neural network data locality of the artificial neural network model at the neural processing unit-memory level in the unit of words.

In other words, the artificial neural network data locality of the artificial neural network model which is present at the neural processing unit-memory level may be defined as information which predicts an operating order of the artificial neural network model processed by the neural processing unit 100 based on a data access request order which is requested to the memory 200 by the neural processing unit 100.

The NPU scheduler 130 may be configured to store the data locality information or the information about the structure of the artificial neural network.

That is, even though only the data locality information or the information about the structure of the artificial neural network of the artificial neural network model is utilized, the NPU scheduler 130 may determine a processing order (sequence). That is, the NPU scheduler 130 may determine the operating sequence by utilizing the data locality information or the information about the structure from an input layer of the artificial neural network to an output layer. For example, an input layer operation may be scheduled first, and an output layer operation may be scheduled last. Accordingly, when the NPU scheduler 130 is provided with the data locality information or the information about the structure of the artificial neural network model, it is possible to know all the operating sequences of the artificial neural network model. As a result, it is possible to determine all scheduling orders.

Moreover, the NPU scheduler 130 may determine the processing order by considering the data locality information or the information about the structure of the artificial neural network model and data locality information or information about a structure of the neural processing unit 100 and optimize the processing for every determined order.

Accordingly, when the NPU scheduler 130 is provided with all the data locality information or the information about the structure of the artificial neural network model and data locality information or information about a structure of a neural processing unit 100, it is possible to further improve the operating efficiency of each of the scheduling order determined by the data locality information or the information about the structure of the artificial neural network model. For example, the NPU scheduler 130 may acquire connection network data having weight data of four artificial neural network layers and three layers which connect the layers. In this case, a method of scheduling the processing order based on the data locality information or the information about the structure of the artificial neural network model by the NPU scheduler 130 will be described below with examples.

For example, the NPU scheduler 130 may set input data for an inference operation as node data of a first layer which is an input layer of the artificial neural network model and schedule to perform a multiply and accumulate (MAC) operation of node data of the first layer and weight data of a first connection network corresponding to the first layer first. However, the examples of the present disclosure are not limited to the MAC operation and the artificial neural network operation may be performed by utilizing a multiplier and an adder which may be modified in various forms. Hereinafter, for the convenience of description, the corresponding operation is referred to as a first operation, a result of the first operation is referred to as a first operation value, and the corresponding scheduling may be referred to as first scheduling.

For example, the NPU scheduler 130 may set the first operation value as node data of a second layer corresponding to the first connection network and schedule to perform the MAC operation of the node data of the second layer and weight data of a second connection network corresponding to the second layer after the first scheduling. Hereinafter, for the convenience of description, the corresponding operation is referred to as a second operation, a result of the second operation is referred to as a second operation value, and the corresponding scheduling may be referred to as second scheduling.

For example, the NPU scheduler 130 may set the second operation value as node data of a third layer corresponding to the second connection network and schedule to perform the MAC operation of the node data of the third layer and weight data of a third connection network corresponding to the third layer during the second scheduling. Hereinafter, for the convenience of description, the corresponding operation is referred to as a third operation, a result of the third operation is referred to as a third operation value, and the corresponding scheduling may be referred to as third scheduling.

For example, the NPU scheduler 130 may set the third operation value as node data of a fourth layer which is an output layer corresponding to a third connection network and schedule to store an inference result which is stored in the node data of the fourth layer, in the NPU internal memory 120. Hereinafter, for the convenience of description, the corresponding scheduling may be referred to as fourth scheduling.

In summary, the NPU scheduler 130 may control the NPU internal memory 120 and the processing element array 110 to perform the operation in the order of the first scheduling, the second scheduling, the third scheduling, and the fourth scheduling. That is, the NPU scheduler 130 may be configured to control the NPU internal memory 120 and the processing element array 110 to perform the operation in accordance with the set scheduling order.

In summary, the neural processing unit 100 according to the examples of the present disclosure may be configured to schedule the processing order based on structures of the layers of the artificial neural network and operating order data corresponding to the structure.

For example, the NPU scheduler 130 may be configured to schedule the processing order based on the data locality information or the information about the structure from the input layer to the output layer of the artificial neural network of the artificial neural network model.

The NPU scheduler 130 may improve an operation operating rate of the neural processing unit and a memory reusability by controlling the NPU internal memory 120 by utilizing the scheduling order based on the data locality information or the information about the structure of the artificial neural network model.

In accordance with the characteristic of the artificial neural network operation which is driven in the neural processing unit 100 according to examples of the present disclosure, an operation value of one layer may serve as input data of a subsequent layer.

Therefore, the neural processing unit 100 controls the NPU internal memory 120 in accordance with the scheduling order to improve the memory reusability of the NPU internal memory 120. The reuse of the memory may be determined by the number of times that the data stored in the memory is read. For example, after specific data is stored in the memory, when the specific data is read only one time and then deleted or overwritten, the memory reusability may become 100%. For example, after specific data is stored in the memory, when the specific data is read four times and then deleted or overwritten, the memory reusability may become 400%. That is, the memory reusability may be determined as the number of times of reusing the data which has been stored once. That is, the memory reuse may refer to the reuse of data stored in the memory or a specific memory address in which the specific data is stored.

Specifically, when the NPU scheduler 130 is configured to be provided with the data locality information or the information about the structure of the artificial neural network model and figure out order data in which the operation of the artificial neural network is performed by the provided data locality information or information about the structure of the artificial neural network model, the NPU scheduler 130 recognizes that an operation result of node data of a specific layer of the artificial neural network model and weight data of a specific connection network serves as node data of a corresponding subsequent layer.

Accordingly, the NPU scheduler 130 may reuse a value of a memory address, in which the specific operation result is stored, for a subsequent operation. Therefore, the memory reusability may be improved.

For example, the first operation value of the first scheduling is set as node data of a second layer of the second scheduling. To be more specific, the NPU scheduler 130 may reset a memory address value corresponding to the first operation value of the first scheduling stored in the NPU internal memory 120 as a memory address value corresponding to node data of the second layer of the second scheduling. That is, the memory address value may be reused. Accordingly, the NPU scheduler 130 reuses data of the memory address of the first scheduling so that the NPU internal memory 120 may utilize as the second layer node data of the second scheduling without a separate memory writing operation.

For example, the second operation value of the second scheduling is set as node data of a third layer of the third scheduling. To be more specific, the NPU scheduler 130 may reset a memory address value corresponding to the second operation value of the second scheduling stored in the NPU internal memory 120 as a memory address value corresponding to node data of the third layer of the third scheduling. That is, the memory address value may be reused. Accordingly, the NPU scheduler 130 reuses data of the memory address of the second scheduling so that the NPU internal memory 120 may utilize the data as the third layer node data of the third scheduling without a separate memory writing operation.

For example, the third operation value of the third scheduling is set as node data of a fourth layer of the fourth scheduling. To be more specific, the NPU scheduler 130 may reset a memory address value corresponding to the third operation value of the third scheduling stored in the NPU internal memory 120 as a memory address value corresponding to node data of the fourth layer of the fourth scheduling. That is, the memory address value may be reused. Accordingly, the NPU scheduler 130 reuses data of the memory address of the third scheduling so that the NPU internal memory 120 may utilize the data as the fourth layer node data of the fourth scheduling without a separate memory writing operation.

Moreover, the NPU scheduler 130 may be configured to determine whether to reuse the scheduling order and the memory to control the NPU internal memory 120. In this case, the NPU scheduler 130 analyzes the data locality information or the information about the structure of the artificial neural network model to provide an efficient scheduling. Further, data required for an operation which is capable of reusing a memory is not repeatedly stored in the NPU internal memory 120 so that the memory usage amount may be reduced. Further, the NPU scheduler 130 may increase the efficiency of the NPU internal memory 120 by calculating the memory usage amount which is reduced as much as the memory is reused.

Moreover, the NPU scheduler 130 may be configured to monitor a resource usage amount of the NPU internal memory 120 and resource usage amounts of the processing elements PE1 to PE12 based on the data locality information or the information about the structure of the neural processing unit 100. Therefore, a hardware resource utilization efficiency of the neural processing unit 100 may be improved.

The NPU scheduler 130 of the neural processing unit 100 according to the examples of the present disclosure may have an effect of reusing a memory by utilizing the data locality information or the information about the structure of the artificial neural network model.

In other words, when the artificial neural network model is a deep neural network, the number of layers and the number of connection networks may be significantly increased so that, in that case, the effect of the memory reuse may be maximized to a greater degree.

That is, when the neural processing unit 100 does not figure out the data locality information or the information about the structure of the artificial neural network model and the operating order, the NPU scheduler 130 may not determine whether to reuse the memory of the values stored in the NPU internal memory 120. Therefore, the NPU scheduler 130 unnecessarily generates a memory address required for each processing and copies the substantially same data from one memory address to another memory address. Therefore, unnecessary memory reading and writing tasks are generated and duplicate values are stored in the NPU internal memory 120, which may cause a problem in that the memory is unnecessarily wasted.

The processing element array 110 refers to a configuration in which a plurality of processing elements PE1 to PE12 configured to operate node data of the artificial neural network and weight data of a connection network is disposed. Each processing element may include a multiply and accumulate (MAC) operator and/or an arithmetic logic unit (ALU) operator, but the examples according to the present disclosure are not limited thereto.

Even though FIG. 1 illustrates a plurality of processing elements as an example, operators implemented by a plurality of multiplier and adder trees may also be configured to be disposed in parallel in one processing element, instead of the MAC. In this case, the processing element array 110 may also be referred to as at least one processing element including a plurality of operators.

The processing element array 110 is configured to include a plurality of processing elements PE1 to PE12. The plurality of processing elements PE1 to PE12 of FIG. 1 is just an example for the convenience of description and the number of the plurality of processing elements PE1 to PE12 is not limited. A size or the number of processing element arrays 110 may be determined by the number of the plurality of processing elements PE1 to PE12. The size of the processing element array 110 may be implemented by an N×M matrix. Here, N and M are integers greater than zero. The processing element array 110 may include N×M processing elements. That is, one or more processing elements may be provided.

A size of the processing element array 110 may be designed in consideration of the characteristic of the artificial neural network model in which the neural processing unit 100 operates. For additional explanation, the number of processing elements may be determined in consideration of a data size, a required operating speed, and a required power consumption of the artificial neural network model to operate. The data size of the artificial neural network model may be determined so as to correspond to the number of layers of the artificial neural network model and a weight data size of each layer.

Accordingly, the size of the processing element array 110 of the neural processing unit 100 according to the examples of the present disclosure is not limited. As the number of processing elements of the processing element array 110 is increased, a parallel arithmetic ability of the artificial neural network model which operates is increased, but the manufacturing cost and a physical size of the neural processing unit 100 may be increased.

For example, the artificial neural network model which operates in the neural processing unit 100 may be an artificial neural network which is trained to detect thirty specific keywords, that is, an AI keyword recognition model. In this case, the size of the processing element array 110 of the neural processing unit 100 may be designed to be 4×3 in consideration of the characteristic of the operating amount. In other words, the neural processing unit 100 may include twelve processing elements. However, it is not limited thereto and the number of the plurality of processing elements PE1 to PE12 may be selected in the range of 8 to 16,384. That is, the examples of the present disclosure are not limited to the number of processing elements.

The processing element array 110 is configured to perform a function such as addition, multiplication, and accumulation required for the artificial neural network operation. In other words, the processing element array 110 may be configured to perform a multiplication and accumulation (MAC) operation.

Hereinafter, a first processing element PE1 among the processing element array 110 will be explained with an example.

Figure 2:
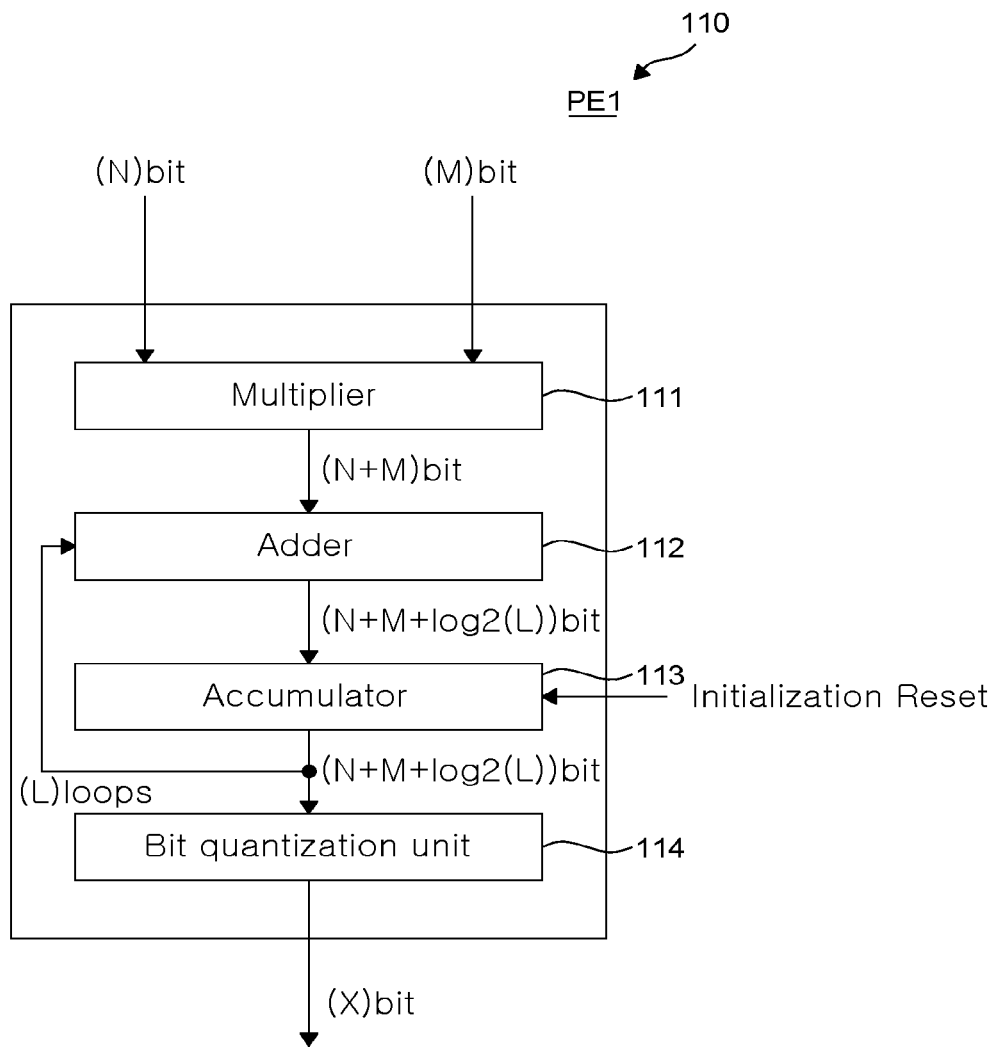
FIG. 2 is a schematic conceptual view illustrating one processing element of a processing element array applicable to the present disclosure.

FIG. 2 illustrates one processing element of a processing element array applicable to the present disclosure.

The neural processing unit 100 according to the examples of the present disclosure may include the processing element array 110, the NPU internal memory 120 configured to store an artificial neural network model inferred from the processing element array 110, and the NPU scheduler 130 configured to control the processing element array 110 and the NPU internal memory 120 based on data locality information or information about a structure of the artificial neural network model. The processing element array 110 is configured to perform the MAC operation and the processing element array 110 is configured to quantize and output the MAC operation result, but the examples of the present disclosure are not limited thereto.

The NPU internal memory 120 may store all or a part of the artificial neural network model in accordance with the memory size and the data size of the artificial neural network model.

The first processing element PE1 may include a multiplier 111, an adder 112, an accumulator 113, and a bit quantization unit 114. However, the examples according to the present disclosure are not limited thereto and the processing element array 110 may be modified in consideration of the operation characteristic of the artificial neural network.

The multiplier 111 multiplies input (N) bit data and (M) bit data. The operation value of the multiplier 111 is output as (N+M) bit data. Here, N and M are integers greater than zero. A first input unit which receives (N) bit data may be configured to receive a value having a characteristic of a variable and a second input unit which receives (M) bit data may be configured to receive a value having a characteristic of a constant. When the NPU scheduler 130 distinguishes the variable value and constant value characteristics, the NPU scheduler 130 may increase a memory reusability of the NPU internal memory 120. However, the input data of the multiplier 111 is not limited to the constant value and the variable value. That is, according to the examples of the present disclosure, the input data of the processing element may operate by understanding characteristics of the constant value and the variable value so that the operating efficiency of the neural processing unit 100 may be improved. However, the neural processing unit 100 is not limited to the feature of the constant value and the variable value of the input data.

Here, the value having a characteristic of a variable or the variable refers that a value of a memory address in which a corresponding value is stored is updated whenever the entering input data is updated. For example, node data of each layer may be a MAC operation value to which weight data of the artificial neural network model is reflected. When object recognition of moving image data and the like is inferred by the artificial neural network model, the input image is changed at every frame so that the node data of each layer is changed.

Here, the value having a characteristic of a constant is stored regardless of the update of the entering input data, where the constant may refer to a value of a memory address in which a corresponding value is stored. For example, even though the object recognition of the moving image data and the like is inferred by the artificial neural network model with unique inference determination criteria of the artificial neural network model, the weight data of the connection network may not be changed.

That is, the multiplier 111 may be configured to receive one variable and one constant. For additional explanation, a variable value input to the first input unit may be node data of a layer of the artificial neural network and the node data may be input data of an input layer of the artificial neural network, an accumulated value of a hidden layer, and an accumulated value of an output layer. The constant value which is input to the second input unit may be weight data of the connection network of the artificial neural network.

The NPU scheduler 130 may be configured to improve the memory reusability in consideration of the characteristic of the constant value.

The variable value is an operation value of each layer and the NPU scheduler 130 may recognize a reusable variable value based on the data locality information or the information about the structure of the artificial neural network model and control the NPU internal memory 120 to reuse the memory.

The constant value is weight data of each connection network and the NPU scheduler 130 may recognize a constant value of a connection network which is repeatedly used based on the data locality information or the information about the structure of the artificial neural network model and control the NPU internal memory 120 to reuse the memory.

That is, the NPU scheduler 130 may be configured to recognize the reusable variable value and the reusable constant value based on the data locality information or the information about the structure of the artificial neural network model and control the NPU internal memory 120 to reuse the memory.

The processing element knows that when 0 is input to one of the first input unit and the second input unit of the multiplier 111, the operation result is 0 even though the operation is not performed. Therefore, the processing element may limit the operation of the multiplier 111 so as not to perform the operation.

For example, when 0 is input to one of the first input unit and the second input unit of the multiplier 111, the multiplier 111 may be configured to operate in a zero-skipping method.

A bit width of data which is input to the first input unit and the second input unit may be determined in accordance with the quantization of the node data and the weight data of each layer of the artificial neural network model. For example, when the node data of the first layer may be quantized to five bits and the weight data of the first layer may be quantized to seven bits. In this case, the first input unit may be configured to receive five-bit data and the second input unit may be configured to receive seven-bit data.

The neural processing unit 100 may control the quantized bit width to be converted in real time when the quantized data which is stored in the NPU internal memory 120 is input to the input units of the processing elements. That is, each layer may have a different quantized bit width and when the bit width of the input data is converted, the processing element may be configured to receive bit width information in real time from the neural processing unit 100 and convert the bit width in real time to generate the input data.

The accumulator 113 accumulates an operation value of the multiplier 111 and an operation value of the accumulator 113 using the adder 112 as many times as the number of (L) loops. Therefore, a bit width of data of an output unit and an input unit of the accumulator 113 may be output to (N+M+log 2(L)) bits. Here, L is an integer greater than zero.

When the accumulation is completed, the accumulator 113 is applied with an initialization reset to initialize the data stored in the accumulator 113 to zero, but the examples according to the present disclosure are not limited thereto.

The bit quantization unit 114 may reduce the bit width of the data output from the accumulator 113. The bit quantization unit 114 may be controlled by the NPU scheduler 130. The bit width of the quantized data may be output to (X) bits. Here, X is an integer greater than zero. According to the above-described configuration, the processing element array 110 is configured to perform the MAC operation and the processing element array 110 may quantize the MAC operation result to output the result. The quantization may have an effect that the larger the (L) loops, the smaller the power consumption. Further, when the power consumption is reduced, the heat generation may also be reduced. Specifically, when the heat generation is reduced, the possibility of the erroneous operation of the neural processing unit 100 due to the high temperature may be reduced.

Output data (X) bits of the bit quantization unit 114 may serve as node data of a subsequent layer or input data of a convolution. When the artificial neural network model is quantized, the bit quantization unit 114 may be configured to be supplied with quantized information from the artificial neural network model. However, it is not limited thereto and the NPU scheduler 130 may also be configured to extract quantized information by analyzing the artificial neural network model. Accordingly, the output data (X) bit is converted to a quantized bit width to be output so as to correspond to the quantized data size. The output data (X) bit of the bit quantization unit 114 may be stored in the NPU internal memory 120 with a quantized bit width.

The processing element array 110 of the neural processing unit 100 according to the examples of the present disclosure includes a multiplier 111, an adder 112, an accumulator 113, and a bit quantization unit 114. The processing element array 110 may reduce data with a bit width of (N+M+log 2(L)) bit output from the accumulator 113 to a bit width of (X) bits by the bit quantization unit 114. The NPU scheduler 130 may control the bit quantization unit 114 to reduce the bit width of the output data by a predetermined bit from a least significant bit (LSB) to a most significant bit (MSB). When the bit width of the output data is reduced, the power consumption, the operation amount, and the memory usage amount may be reduced. However, when the bit width is reduced below a specific length, there may be a problem in that an inference accuracy of the artificial neural network model sharply deteriorates. Accordingly, the bit width reduction of the output data, that is, a quantization level may be determined by comparing a reduced amount of the power consumption, the operation amount, and the memory usage amount with a reduced level of the inference accuracy of the artificial neural network model. The quantization level may be determined by determining a target inference accuracy of the artificial neural network model and testing by gradually reducing the bit width. The quantization level may be determined for every operation value of each layer.

According to the above-described first processing element PE1, the processing element array 110 may reduce the power consumption while improving the MAC operation speed by adjusting the bit widths of the (N) bit data and the (M) bit data of the multiplier 111 and reducing the bit width of the operation value (X) bits by the bit quantization unit 114. Further, the convolution operation of the artificial neural network may be more efficiently performed.

The NPU internal memory 120 of the neural processing unit 100 may be a memory system configured in consideration of the MAC operation characteristic and the power consumption characteristic of the processing element array 110.

For example, the neural processing unit 100 may be configured to reduce the bit width of the operation value of the processing element array 110 in consideration of the MAC operation characteristic and the power consumption characteristic of the processing element array 110.

The NPU internal memory 120 of the neural processing unit 100 may be configured to minimize the power consumption of the neural processing unit 100.

The NPU internal memory 120 of the neural processing unit 100 may be a memory system configured to control the memory at a low power in consideration of the data size and the operation step of the ongoing artificial neural network model.

The NPU internal memory 120 of the neural processing unit 100 may be a lower power memory system configured to reuse a specific memory address in which weight data is stored in consideration of the data size and the operation step of the ongoing artificial neural network model.

The neural processing unit 100 may provide various activation functions to impart non-linearity. For example, the neural processing unit 100 may provide a sigmoid function, a hyperbolic tangent function, or an ReLU (Rectified Linear Unit) function. The activation function may be selectively applied after the MAC operation. An operation value to which the activation function is applied may be referred to as an activation map.

Figure 3:
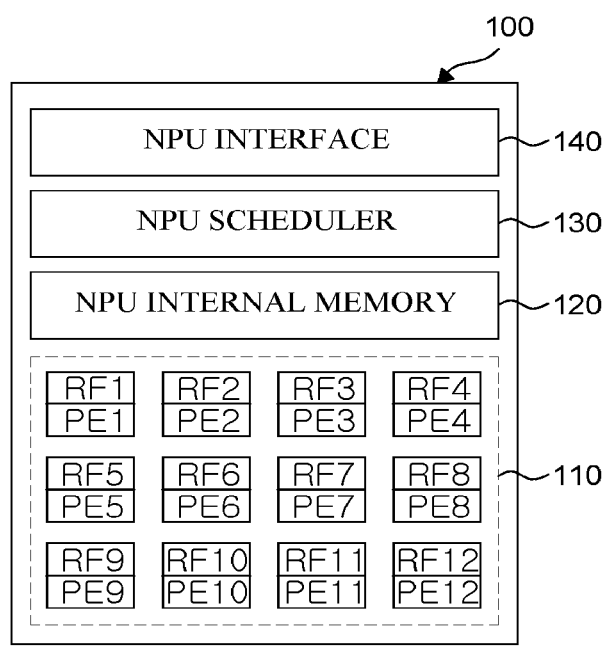
FIG. 3 is an exemplary view illustrating a modified example of the neural processing unit 100 of FIG. 1.

FIG. 3 illustrates a modified example of the neural processing unit 100 of FIG. 1.

The neural processing unit 100 of FIG. 3 is substantially the same as the processing unit 100 exemplarily illustrated in FIG. 1, except for the processing element array 110. Thus, redundant description will be omitted for the convenience of description.

The processing element array 110 exemplarily illustrated in FIG. 3 may further include register files RF1 to RF12 corresponding to processing elements PE1 to PE12 in addition to a plurality of processing elements PE1 to PE12.

The plurality of processing elements PE1 to PE12 and the plurality of register files RF1 to RF12 of FIG. 3 are just an example for the convenience of description and the number of the plurality of processing elements PE1 to PE12 and the plurality of register files RE1 to RE12 is not limited.

A size of, or the number of, processing element arrays 110 may be determined by the number of the plurality of processing elements PE1 to PE12 and the plurality of register files RF1 to RF12. The size of the processing element array 110 and the plurality of register files RF1 to RF12 may be implemented by an N×M matrix. Here, N and M are integers greater than zero.

An array size of the processing element array 110 may be designed in consideration of the characteristic of the artificial neural network model in which the neural processing unit 100 operates. For additional explanation, the memory size of the register file may be determined in consideration of a data size, a required operating speed, and a required power consumption of the artificial neural network model to operate.

The register files RF1 to RF12 of the neural processing unit 100 are static memory units which are directly connected to the processing elements PE1 to PE12. For example, the register files RF1 to RF12 may be configured by flip-flops and/or latches. The register files RF1 to RF12 may be configured to store the MAC operation value of the corresponding processing elements RF1 to RF12. The register files RF1 to RF12 may be configured to provide or be provided with the weight data and/or node data to or from the NPU system memory 120.

Figure 4:
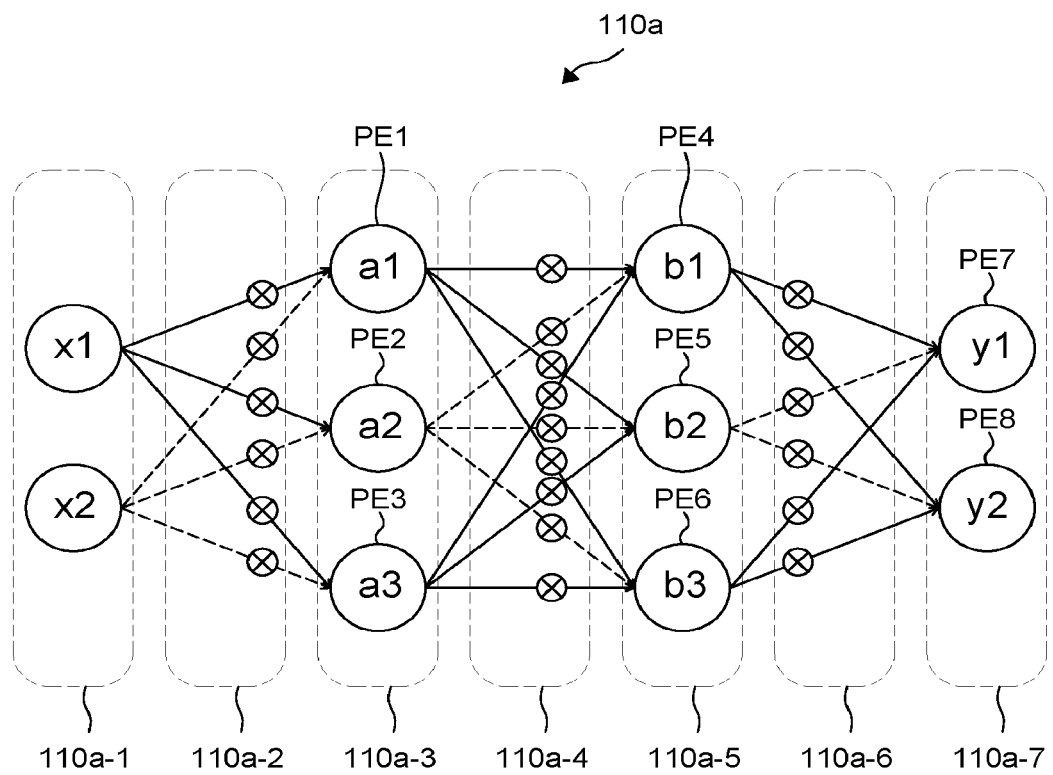
FIG. 4 is a schematic conceptual view illustrating an exemplary artificial neural network model.

FIG. 4 illustrates an exemplary artificial neural network (ANN) model.

Hereinafter, an operation of an exemplary artificial neural network model 110*a* which may operate in the neural processing unit 100 will be explained.

The exemplary artificial neural network model 110*a* of FIG. 4 may be an artificial neural network which is trained in the neural processing unit 100 or trained in a separate machine learning device. The artificial neural network model 110*a* may be an artificial neural network which is trained to perform various inference functions such as object recognition or voice recognition.

The artificial neural network model 110*a* may be a deep neural network (DNN).

However, the artificial neural network model 110*a* according to the examples of the present disclosure is not limited to the deep neural network.

For example, the artificial neural network model 110*a* may be implemented by a model such as a fully convolutional network (FCN) having VGG, VGG16, DenseNET, and an encoder-decoder structure, a deep neural network (DNN) such as SegNet, DeconvNet, DeepLAB, V3+, or U-net, or SqueezeNet, Alexnet, ResNet18, MobileNet-v2, GoogLeNet, Resnet-v2, Resnet50, Resnet101, and Inception-v3, but the present disclosure is not limited thereto. Further, the artificial neural network model 110*a* may be an ensemble model based on at least two different models.

The artificial neural network model 110*a* may be stored in the NPU internal memory 120 of the neural processing unit 100. Alternatively, the artificial neural network model 110*a* may be implemented to be stored in a memory 200 and then loaded in the neural processing unit 100 during the operation of the artificial neural network model 110*a*.

Hereinafter, an inference process by the exemplary artificial neural network model 110*a*, being performed by the neural processing unit 100, will be described with reference to FIG. 4.

The artificial neural network model 110*a* may be an exemplary deep neural network model including an input layer 110*a*-1, a first connection network 110*a*-2, a first hidden layer 110*a*-3, a second connection network 110*a*-4, a second hidden layer 110*a*-5, a third connection network 110*a*-6, and an output layer 110*a*-7. However, the present disclosure is not limited only to the artificial neural network model illustrated in FIG. 4. The first hidden layer 110*a*-3 and the second hidden layer 110*a*-5 may also be referred to as a plurality of hidden layers.

The input layer 110*a*-1 may exemplarily include input nodes x1 and x2. That is, the input layer 110*a*-1 may include information about two input values. The NPU scheduler 130 illustrated in FIG. 1 or FIG. 3 may set a memory address in which information about an input value from the input layer 110*a*-1 is stored, in the NPU internal memory 120 of FIG. 1 or FIG. 3.

For example, the first connection network 110*a*-2 may include information about six weight values for connecting nodes of the input layer 110*a*-1 to nodes of the first hidden layer 110*a*-3, respectively. The NPU scheduler 130 of FIG. 1 or FIG. 3 may set a memory address, in which information about a weight value of the first connection network 110*a*-2 is stored, in the NPU internal memory 120. Each weight value is multiplied with the input node value, and an accumulated value of the multiplied values is stored in the first hidden layer 110*a*-3.

For example, the first hidden layer 110*a*-3 may include nodes a1, a2, and a3. That is, the first hidden layer 110*a*-3 may include information about three node values. The NPU scheduler 130 illustrated in FIG. 1 or FIG. 3 may set a memory address for storing information about a node value of the first hidden layer 110*a*-3, in the NPU internal memory 120.

For example, the second connection network 110*a*-4 may include information about nine weight values for connecting nodes of the first hidden layer 110*a*-3 to nodes of the second hidden layer 110*a*-5, respectively. The NPU scheduler 130 of FIG. 1 or FIG. 3 may set a memory address for storing, in the NPU internal memory 120, information about a weight value of the second connection network 110*a*-4. The weight value of the second connection network 110*a*-4 is multiplied with the node value input from the corresponding first hidden layer 110a-3 and the accumulated value of the multiplied values is stored in the second hidden layer 110a-5.

For example, the second hidden layer 110a-5 may include nodes b1, b2, and b3. That is, the second hidden layer 110a-5 may include information about three node values. The NPU scheduler 130 may set a memory address for storing information about a node value of the second hidden layer 110a-5, in the NPU internal memory 120.

For example, the third connection network 110a-6 may include information about six weight values which connect nodes of the second hidden layer 110a-5 and nodes of the output layer 110a-7, respectively. The NPU scheduler 130 may set a memory address for storing, in the NPU internal memory 120, information about a weight value of the third connection network 110a-6. The weight value of the third connection network 110a-6 is multiplied with the node value input from the second hidden layer 110a-5, and the accumulated value of the multiplied values is stored in the output layer 110a-7.

For example, the output layer 110a-7 may include nodes y1 and y2. That is, the output layer 110a-7 may include information about two node values. The NPU scheduler 130 may set a memory address for storing, in the NPU internal memory 120, information about a node value of the output layer 110a-7.

That is, the NPU scheduler 130 may analyze or receive a structure of an artificial neural network model which may operate in the processing element array 110. Information of the artificial neural network, which may be included in the artificial neural network model, may include information about a node value of each layer, placement data locality information of layers or information about the structure, and information about a weight value of each of connection networks connecting the nodes of the layers.

The NPU scheduler 130 is provided with data locality information or information about a structure of the exemplary artificial neural network model 110a so that the NPU scheduler 130 may determine an operation order from input to output of the artificial neural network model 110a.

Accordingly, the NPU scheduler 130 may set the memory address in which the MAC operation values of each layer are stored, in the NPU internal memory 120, in consideration of the scheduling order. For example, a specific memory address may be a MAC operation value of an input layer 110a-1 and the first connection network 110a-2 and also may be input data of the first hidden layer 110a-3. However, the present disclosure is not limited to the MAC operation value, and the MAC operation value may also be referred to as an artificial neural network operation value.

At this time, the NPU scheduler 130 knows that the MAC operation result of the input layer 110a-1 and the first connection network 110a-2 serves as an input of the first hidden layer 110a-3 so that it is controlled to use the same memory address. That is, the NPU scheduler 130 may reuse the MAC operation value based on the data locality information or the information about the structure of the artificial neural network model. Therefore, the memory reusable function of the NPU system memory 120 may be provided.

That is, the NPU scheduler 130 may store the MAC operation value of the artificial neural network model 110a in accordance with the scheduling order in a specific area specified in an arbitrary memory address of the NPU internal memory 120 and use the MAC operation value as input data of a MAC operation in a subsequent scheduling order in the specific area in which the MAC operation value is stored.

MAC Operation from Viewpoint of First Processing Element PE1

The MAC operation will be described in detail from a viewpoint of the first processing element PE1. The first processing element PE1 may be designated to perform the MAC operation of the node a1 of the first hidden layer 110a-3.

First, the first processing element PE1 inputs node x1 data of the input layer 110a-1 to the first input unit of the multiplier 111 and inputs weight data between the node x1 and the node a1 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the first processing element PE1 inputs node x2 data of the input layer 110a-1 to the first input unit of the multiplier 111 and inputs weight data between the node x2 and the node a1 to the second input unit. The adder 112 adds an operation value of the multiplier 111 and an operation value of the accumulator 113. At this time, when (L) loops are 1, the node x1 data which is calculated in a previous step and a weight multiplied value between the node x1 and the node a1 are stored. Accordingly, the adder 112 generates a MAC operation value of the node x1 and the node x2 corresponding to the node a1.

Third, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0.

The bit quantization unit 114 may be appropriately adjusted in accordance with the accumulated value. In other words, as the (L) loops are increased, the bit width of the output value may be increased. At this time, the NPU scheduler 130 may remove a predetermined lower bit so that the bit width of the operation value of the first processing element PE1 is (x) bits.

MAC Operation from Viewpoint of Second Processing Element PE2

The MAC operation will be described in detail from a viewpoint of the second processing element PE2. The second processing element PE2 may be designated to perform the MAC operation of the node a2 of the first hidden layer 110a-3.

First, the second processing element PE2 inputs node x1 data of the input layer 110a-1 to the first input unit of the multiplier 111 and inputs weight data between the node x1 and the node a2 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the second processing element PE2 inputs node x2 data of the input layer 110a-1 to the first input unit of the multiplier 111 and inputs weight data between the node x2 and the node a2 to the second input unit. The adder 112 adds an operation value of the multiplier 111 and an operation value of the accumulator 113. At this time, when (L) loops are 1, the node x1 data which is calculated in a previous step and a weight multiplied value between the node x1 and the node a2 are stored. Accordingly, the adder 112 generates a MAC operation value of the node x1 and the node x2 corresponding to the node a2.

Third, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

MAC Operation from Viewpoint of Third Processing Element PE3

The MAC operation will be described in detail from a viewpoint of the third processing element PE3. The third processing element PE3 may be designated to perform the MAC operation of the node a3 of the first hidden layer 110a-3.

First, the third processing element PE3 inputs node x1 data of the input layer 110a-1 to the first input unit of the multiplier 111 and inputs weight data between the node x1 and the node a3 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the third processing element PE3 inputs node x2 data of the input layer 110a-1 to the first input unit of the multiplier 111 and inputs weight data between the node x2 and the node a3 to the second input unit. The adder 112 adds an operation value of the multiplier 111 and an operation value of the accumulator 113. At this time, when (L) loops are 1, the node x1 data which is calculated in a previous step and a weight multiplied value between the node x1 and the node a3 are stored. Accordingly, the adder 112 generates a MAC operation value of the node x1 and the node x2 corresponding to the node a3.

Third, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

Accordingly, the NPU scheduler 130 of the neural processing unit 100 may perform the MAC operation of the first hidden layer 110a-3 by simultaneously using three processing elements PE1 to PE3.

MAC Operation from Viewpoint of Fourth Processing Element PE4

The MAC operation will be described in detail from a viewpoint of the fourth processing element PE4. The fourth processing element PE4 may be designated to perform the MAC operation of the node b1 of the second hidden layer 110a-5.

First, the fourth processing element PE4 inputs node a1 data of the first hidden layer 110a-3 to the first input unit of the multiplier 111 and inputs weight data between the node a1 and the node b1 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the fourth processing element PE4 inputs node a2 data of the first hidden layer 110a-3 to the first input unit of the multiplier 111 and inputs weight data between the node a2 and the node b1 to the second input unit. The adder 112 adds an operation value of the multiplier 111 and an operation value of the accumulator 113. At this time, when (L) loops are 1, the node a1 data which is calculated in a previous step and a weight multiplied value between the node a1 and the node b1 are stored. Accordingly, the adder 112 generates a MAC operation value of the node a1 and the node a2 corresponding to the node b1. At this time, a counter value of (L) loops may be 2.

Third, the fourth processing element PE4 inputs node a3 data of the input layer 110a-1 to the first input unit of the multiplier 111 and inputs weight data between the node a3 and the node b1 to the second input unit. The adder 112 adds an operation value of the multiplier 111 and an operation value of the accumulator 113. At this time, when (L) loops are 2, the MAC operation value of the node a1 and the node a2 corresponding to the node b1 which is calculated in a previous step is stored. Accordingly, the adder 112 generates a MAC operation value of the node a1, the node a2, and the node a3 corresponding to the node b1.

Fourth, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

MAC Operation from Viewpoint of Fifth Processing Element PE5

The MAC operation will be described in detail from a viewpoint of the fifth processing element PE5. The fifth processing element PE5 may be designated to perform the MAC operation of the node b2 of the second hidden layer 110a-5.

First, the fifth processing element PE5 inputs node a1 data of the first hidden layer 110a-3 to the first input unit of the multiplier 111 and inputs weight data between the node a1 and the node b2 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the fifth processing element PE5 inputs node a2 data of the first hidden layer 110a-3 to the first input unit of the multiplier 111 and inputs weight data between the node a2 and the node b2 to the second input unit. The adder 112 adds an operation value of the multiplier 111 and an operation value of the accumulator 113. At this time, when (L) loops are 1, the node a1 data which is calculated in a previous step and a weight multiplied value between the node a1 and the node b2 are stored. Accordingly, the adder 112 generates a MAC operation value of the node a1 and the node a2 corresponding to the node b2. At this time, a counter value of (L) loops may be 2.

Third, the fifth processing element PE5 inputs node a3 data of the input layer 110a-1 to the first input unit of the multiplier 111 and inputs weight data between the node a3 and the node b2 to the second input unit. The adder 112 adds an operation value of the multiplier 111 and an operation value of the accumulator 113. At this time, when (L) loops are 2, the MAC operation value of the node a1 and the node a2 corresponding to the node b2 which is calculated in a previous step is stored. Accordingly, the adder 112 generates a MAC operation value of the node a1, the node a2, and the node a3 corresponding to the node b2.

Fourth, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

MAC Operation from Viewpoint of Sixth Processing Element PE6

The MAC operation will be described in detail from a viewpoint of the sixth processing element PE6. The sixth processing element PE6 may be designated to perform the MAC operation of the node b3 of the second hidden layer 110a-5.

First, the sixth processing element PE6 inputs node a1 data of the first hidden layer 110a-3 to the first input unit of the multiplier 111 and inputs weight data between the node a1 and the node b3 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the sixth processing element PE6 inputs node a2 data of the first hidden layer 110a-3 to the first input unit of the multiplier 111 and inputs weight data between the node a2 and the node b3 to the second input unit. The adder 112 adds an operation value of the multiplier 111 and an operation value of the accumulator 113. At this time, when (L) loops are 1, the node a1 data which is calculated in a previous step and a weight multiplied value between the node a1 and the node b3 are stored. Accordingly, the adder 112 generates a MAC operation value of the node a1 and the node a2 corresponding to the node b3. At this time, a counter value of (L) loops may be 2.

Third, the sixth processing element PE6 inputs node a3 data of the input layer 110a-1 to the first input unit of the multiplier 111 and inputs weight data between the node a3 and the node b3 to the second input unit. The adder 112 adds an operation value of the multiplier 111 and an operation value of the accumulator 113. At this time, when (L) loops are 2, the MAC operation value of the node a1 and the node a2 corresponding to the node b3 which is calculated in a previous step is stored. Accordingly, the adder 112 generates a MAC operation value of the node a1, the node a2, and the node a3 corresponding to the node b3.

Fourth, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

Accordingly, the NPU scheduler 130 of the neural processing unit 100 may perform the MAC operation of the second hidden layer 110a-5 by simultaneously using three processing elements PE4 to PE6.

MAC Operation from Viewpoint of Seventh Processing Element PE7

The MAC operation will be described in detail from a viewpoint of the seventh processing element PE7. The seventh processing element PE7 may be designated to perform the MAC operation of the node y1 of the output layer 110a-7.

First, the seventh processing element PE7 inputs node b1 data of the second hidden layer 110a-5 to the first input unit of the multiplier 111 and inputs weight data between the node b1 and the node y1 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the seventh processing element PE7 inputs node b2 data of the second hidden layer 110a-5 to the first input unit of the multiplier 111 and inputs weight data between the node b2 and the node y1 to the second input unit. The adder 112 adds an operation value of the multiplier 111 and an operation value of the accumulator 113. At this time, when (L) loops are 1, the node b1 data which is calculated in a previous step and a weight multiplied value between the node b1 and the node y1 are stored. Accordingly, the adder 112 generates a MAC operation value of the node b1 and the node b2 corresponding to the node y1. At this time, a counter value of (L) loops may be 2.

Third, the seventh processing element PE7 inputs node b3 data of the input layer 110a-1 to the first input unit of the multiplier 111 and inputs weight data between the node b3 and the node y1 to the second input unit. The adder 112 adds an operation value of the multiplier 111 and an operation value of the accumulator 113. At this time, when (L) loops are 2, the MAC operation value of the node b1 and the node b2 corresponding to the node y1 which is calculated in a previous step is stored. Accordingly, the adder 112 generates a MAC operation value of the node b1, the node b2, and the node b3 corresponding to the node y1.

Fourth, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

MAC Operation from Viewpoint of Eighth Processing Element PE8

The MAC operation will be described in detail from a viewpoint of the eighth processing element PE8. The eighth processing element PE8 may be designated to perform the MAC operation of the node y2 of the output layer 110a-7.

First, the eighth processing element PE8 inputs node b1 data of the second hidden layer 110a-5 to the first input unit of the multiplier 111 and inputs weight data between the node b1 and the node y2 to the second input unit. The adder 112 adds an operation value of the multiplier 111 and an operation value of the accumulator 113. At this time, when (L) loops are 0, there is no accumulated value so that the accumulated value is 0. Accordingly, the operation value of the adder 112 may be equal to the operation value of the multiplier 111. At this time, a counter value of (L) loops may be 1.

Second, the eighth processing element PE8 inputs node b2 data of the second hidden layer 110a-5 to the first input unit of the multiplier 111 and inputs weight data between the node b2 and the node y2 to the second input unit. The adder 112 adds an operation value of the multiplier 111 and an operation value of the accumulator 113. At this time, when (L) loops are 1, the node b1 data which is calculated in a previous step and a weight multiplied value between the node b1 and the node y2 are stored. Accordingly, the adder 112 generates a MAC operation value of the node b1 and the node b2 corresponding to the node y2. At this time, a counter value of (L) loops may be 2.

Third, the eighth processing element PE8 inputs node b3 data of the input layer 110a-1 to the first input unit of the multiplier 111 and inputs weight data between the node b3 and the node y2 to the second input unit. The adder 112 adds an operation value of the multiplier 111 and an operation value of the accumulator 113. At this time, when (L) loops are 2, the MAC operation value of the node b1 and the node b2 corresponding to the node y2 which is calculated in a previous step is stored. Accordingly, the adder 112 generates a MAC operation value of the node b1, the node b2, and the node b3 corresponding to the node y2.

Fourth, the NPU scheduler 130 may complete the MAC operation of the first processing element PE1 based on the data locality information or the information about the structure of the artificial neural network model. At this time, the initialization reset is input to initialize the accumulator 113. That is, the counter value of (L) loops may be initialized to 0. The bit quantization unit 114 may be appropriately adjusted in accordance with the accumulated value.

Accordingly, the NPU scheduler 130 of the neural processing unit 100 may perform the MAC operation of the output layer 110a-7 by simultaneously using two processing elements PE7 and PE8.

When the MAC operation of the eighth processing element PE8 is completed, the inference operation of the artificial neural network model 110a may be finished. That is, the artificial neural network model 110a may determine that the inference operation of one frame is completed. If the neural processing unit 100 infers moving image data in real time, image data of a subsequent frame may be input to the input nodes x1 and x2 of the input layer 110a-1. At this time, the NPU scheduler 130 may store image data of a subsequent frame in a memory address in which input data of the input layer 110a-1 is stored. When this process is repeated at every frame, the neural processing unit 100 may process the inference operation in real time. Further, a memory address which has been set may be reused.

According to the summary of the artificial neural network model 110a of FIG. 4, the NPU scheduler 130 of the neural processing unit 100 may determine an operation scheduling order based on the data locality information or the information about the structure of the artificial neural network model 110a, for the purpose of the inference operation of the artificial neural network model 110a. The NPU scheduler 130 may set a memory address required for the NPU internal memory 120 based on the operation scheduling order. The NPU scheduler 130 may set a memory address that reuses the memory, based on the data locality information or the information about the structure of the artificial neural network model 110a. The NPU scheduler 130 designates processing elements PE1 to PE8 required for the inference operation to perform the inference operation.

In other words, when the number of weight data connected to one node is increased to L, the number of (L) loops of the accumulator of the processing element may be set to L−1. That is, even though the weight data of the artificial neural network is increased, the accumulator increases the number of times that the accumulator is accumulated to easily perform the inference operation.

That is, the NPU scheduler 130 of the neural processing unit 100 according to the examples of the present disclosure may control the processing element array 110 and the NPU internal memory 120 based on the data locality information and the information about the structure of the artificial neural network model including data locality information and information about a structure of the input layer 110a-1, the first connection network 110a-2, the first hidden layer 110a-3, the second connection layer 110a-4, the second hidden layer 110a-5, the third connection layer 110a-6, and the output layer 110a-7.

That is, the NPU scheduler 130 may set memory address values corresponding to node data of the input layer 110a-1, weight data of the first connection network 110a-2, node data of the first hidden layer 110a-3, weight data of the second connection layer 110a-4, node data of the second hidden layer 110a-5, weight data of the third connection layer 110a-6, and node data of the output layer 110a-7 in the NPU memory system 110.

Hereinafter, the scheduling of the NPU scheduler 130 will be described in detail. The NPU scheduler 130 may schedule an operation order of the artificial neural network model based on the data locality information or the information about the structure of the artificial neural network model.

The NPU scheduler 130 may acquire a memory address value in which node data of the layer of the artificial neural network model and weight data of the connection network are stored based on the data locality information or the information about the structure of the artificial neural network model.

For example, the NPU scheduler 130 may acquire the memory address value in which the node data of the layer of the artificial neural network model and the weight data of the connection network which are stored in a main memory are stored. Accordingly, the NPU scheduler 130 may take node data of a layer of an artificial neural network model to be driven and weight data of a connection network from the main memory to store the data in the NPU internal memory 120. Node data of each layer may have a corresponding memory address value. The weight data of each connection network may have a corresponding memory address value.

The NPU scheduler 130 may schedule an operation order of the processing element array 110 based on the data locality information or the information about the structure of the artificial neural network model, for example, the placement data locality information or the information about the structure of layers of the artificial neural network of the artificial neural network model.

For example, the NPU scheduler 130 may acquire weight data having weight values of four artificial neural network layers and three layers which connect the layers, that is, connection network data. In this case, a method of scheduling the processing order based on the data locality information or the information about the structure of the artificial neural network model by the NPU scheduler 130 will be described below with examples.

For example, the NPU scheduler 130 may set input data for an inference operation as node data of a first layer which is an input layer 110a-1 of the artificial neural network model 110a and schedule to perform a multiply and accumulate (MAC) operation of node data of the first layer and weight data of a first connection network corresponding to the first layer first. Hereinafter, for the convenience of description, the corresponding operation is referred to as a first operation, a result of the first operation is referred to as a first operation value, and the corresponding scheduling may be referred to as first scheduling.

For example, the NPU scheduler 130 may set the first operation value as node data of a second layer corresponding to the first connection network and schedule to perform the MAC operation of the node data of the second layer and weight data of a second connection network corresponding to the second layer after the first scheduling. Hereinafter, for the convenience of description, the corresponding operation is referred to as a second operation, a result of the second operation is referred to as a second operation value, and the corresponding scheduling may be referred to as second scheduling.

For example, the NPU scheduler 130 may set the second operation value as node data of a third layer corresponding to the second connection network and schedule to perform the MAC operation of the node data of the third layer and weight data of a third connection network corresponding to the third layer during the second scheduling. Hereinafter, for the convenience of description, the corresponding operation is referred to as a third operation, a result of the third operation is referred to as a third operation value, and the corresponding scheduling may be referred to as third scheduling.

For example, the NPU scheduler 130 may set the third operation value as node data of a fourth layer which is an output layer 110a-7 corresponding to a third connection network and schedule to store an inference result which is stored in the node data of the fourth data, in the NPU internal memory 120. Hereinafter, for the convenience of description, the corresponding scheduling may be referred to as fourth scheduling. The inference result value is transmitted to various components to be utilized.

For example, when the inference result value is a result value of detecting a specific keyword, the neural processing unit 100 transmits an inference result to the central processing unit to perform an operation corresponding to a specific keyword.

For example, the NPU scheduler 130 may drive the first to third processing elements PE1 to PE3 in the first scheduling.

For example, the NPU scheduler 130 may drive the fourth to sixth processing elements PE4 to PE6 in the second scheduling.

For example, the NPU scheduler 130 may drive the seventh and eighth processing elements PE7 and PE8 in the third scheduling.

For example, the NPU scheduler 130 may output an inference result in the fourth scheduling.

In summary, the NPU scheduler 130 may control the NPU internal memory 120 and the processing element array 110 to perform the operation in the order of the first scheduling, the second scheduling, the third scheduling, and the fourth scheduling. That is, the NPU scheduler 130 may be configured to control the NPU internal memory 120 and the processing element array 110 to perform the operation in accordance with the set scheduling order.

In summary, the neural processing unit 100 according to the examples of the present disclosure may be configured to schedule the processing order based on structures of the layers of the artificial neural network and operating order data corresponding to the structure. The order of processing to be scheduled may be at least one. For example, the neural processing unit 100 may predict all operation orders, so that it is possible to schedule a subsequent operation and it is also possible to schedule an operation in a specific order.

The NPU scheduler 130 may improve a memory reusability by controlling the NPU internal memory 120 by utilizing the scheduling order based on the data locality information or the information about the structure of the artificial neural network model.

In accordance with the characteristic of the artificial neural network operation, which is driven in the neural processing unit 100 according to examples of the present disclosure, an operation value of one layer may serve as input data of a subsequent layer.

Therefore, when the neural processing unit 100 controls the NPU internal memory 120 in accordance with the scheduling order, it is possible to improve the memory reusability of the NPU internal memory 120.

Specifically, when the NPU scheduler 130 is configured to be provided with the data locality information or the information about the structure of the artificial neural network model and figure out an order in which the operation of the artificial neural network is performed by the provided data locality information or information about the structure of the artificial neural network model, the NPU scheduler 130 may recognize that an operation result of node data of a specific layer of the artificial neural network model and weight data of a specific connection network serves as node data of a corresponding subsequent layer. Accordingly, the NPU scheduler 130 may reuse, for a subsequent operation, a value of a memory address in which the corresponding operation result is stored.

For example, the first operation value of the first scheduling is set as node data of a second layer of the second scheduling. To be more specific, the NPU scheduler 130 may reset a memory address value corresponding to the first operation value of the first scheduling stored in the NPU internal memory 120 as a memory address value corresponding to node data of the second layer of the second scheduling. That is, the memory address value may be reused. Accordingly, the NPU scheduler 130 reuses the memory address value of the first scheduling so that the NPU internal memory 120 may utilize the data as the second layer node data of the second scheduling without a separate memory writing operation.

For example, the second operation value of the second scheduling is set as node data of a third layer of the third scheduling. To be more specific, the NPU scheduler 130 may reset a memory address value corresponding to the second operation value of the second scheduling stored in the NPU internal memory 120 as a memory address value corresponding to node data of the third layer of the third scheduling. That is, the memory address value may be reused. Accordingly, the NPU scheduler 130 reuses the memory address value of the second scheduling so that the NPU internal memory 120 may utilize the data as the third layer node data of the third scheduling without a separate memory writing operation.

For example, the third operation value of the third scheduling is set as node data of a fourth layer of the fourth scheduling. To be more specific, the NPU scheduler 130 may reset a memory address value corresponding to the third operation value of the third scheduling stored in the NPU internal memory 120 as a memory address value corresponding to node data of the fourth layer of the fourth scheduling. That is, the memory address value may be reused. Accordingly, the NPU scheduler 130 reuses the memory address value of the third scheduling so that the NPU internal memory 120 may utilize the data as the fourth layer node data of the fourth scheduling without a separate memory writing operation.

Moreover, the NPU scheduler 130 may be configured to determine whether to reuse the scheduling order and the memory to control the NPU internal memory 120. In this case, the NPU scheduler 130 analyzes the data locality information or the information about the structure of the artificial neural network model to provide an optimized scheduling. Further, data required for an operation which is capable of reusing a memory is not repeatedly stored in the NPU internal memory 120 so that the memory usage amount may be reduced. Further, the NPU scheduler 130 may optimize the NPU internal memory 120 by calculating the memory usage amount which is reduced as much as the memory is reused.

The neural processing unit 100 according to examples of the present disclosure may be configured such that a variable value is input to (N) bit input which is a first input of the first processing element PE1 and a constant value is input to (M) bit input which is a second input. Further, this configuration may be set in the other processing elements of the processing element array 110 in the same way. That is, one input of the processing element may be configured to receive a variable value and the other input may be configured to receive a constant value. Therefore, the number of times of updating data of the constant value may be reduced.

At this time, the NPU scheduler 130 utilizes the data locality information or the information about the structure of the artificial neural network model 110a to set node data of the input layer 110a-1, the first hidden layer 110a-3, the second hidden layer 110a-5, and the output layer 110a-7 as variables and set weight data of the first connection network 110a-2, weight data of the second connection network 110a-4, and weight data of the third connection network 110a-6 as constants. That is, the NPU scheduler 130 may distinguish the constant value and the variable value. However, the present disclosure is not limited to constant and variable data types, but a value which frequently varies is distinguished from a value which does not vary to improve the reusability of the NPU internal memory 120.

That is, the NPU system memory 120 may be configured to preserve weight data of connection networks stored in the NPU system memory 120 while the inference operation of the neural processing unit 100 is maintained. Therefore, the memory reading and writing operations may be reduced.

That is, the NPU system memory 120 may be configured to reuse the MAC operation value stored in the NPU system memory 120 while the inference operation is maintained.

That is, the number of times of updating data of the memory address in which input data (N) bit of the first input unit of the processing element of the processing element array 110 is stored may be larger than the number of times of updating data of the memory address in which input data (M) bit of the second input unit is stored. That is, the number of times of updating data of the second input unit may be smaller than the number of times of updating data of the first input unit.

Hereinafter, a convolutional neural network (CNN) which is one type of a deep neural network (DNN) among the artificial neural networks will be mainly described.

The convolutional neural network may be a combination of one or a plurality of convolutional layers, pooling layers, and fully connected layers. The CNN has a structure appropriate for the learning of two-dimensional data and inference and may be trained by a backpropagation algorithm.

FIG. 5A illustrates a basic structure of a convolution neural network.

Referring to FIG. 5A, the input image may be represented by a two-dimensional matrix configured by a row with a specific size and a column with a specific size. The input image may have a plurality of channels and the channel may indicate the number of color components of an input data image.

The convolution process refers that a convolutional operation with a kernel is performed while visiting the input image at a specified interval.

When the convolutional neural network moves from a current layer to a next layer, a weight value between the layers is reflected by the convolution to transmit the weight value to the next layer.

For example, the convolution is defined by two main parameters and a size of an input image (generally, 1×1, 3×3, and 5×5 matrixes) and a depth (the number of kernels) of an output feature map may be computed by the convolution. The convolution may start from a depth 32, continue to a depth 64, and end at a depth 128 or 256.

The convolution may operate by sliding a window having a 3×3 or 5×5 size on a 3D input feature map, stopping in all positions, and extracting a 3D patch of a neighboring feature.

The 3D patch may be converted by a 1D vector by a tensor product having the same learning weight matrix called a weight. The vector may be spatially reassembled to a 3D output map. All space positions of the output feature map may correspond to the same position of the input feature map.

The convolutional neural network may include a convolutional layer which performs a convolution operation between a kernel (that is, a weight matrix) which is trained over many iterations of gradient update during the learning process and input data. If (m,n) is set as a kernel size and W is set as a weight value, the convolutional layer calculates an inner product to perform the convolution of the input data and the weight matrix.

The step size that the kernel slides across the input data is called a step, and the kernel area (m×n) may be called the receptive field. The same convolution kernel is applied over different positions of the input, which may reduce the number of kernels to be learned. This also enables position invariant learning and if a significant pattern is present in the input, a convolution filter may learn that pattern regardless of the position of the sequence.

The convolutional neural network may be adjusted or trained such that the input data is connected to a specific output estimate. The convolutional neural network may be adjusted using a backpropagation based on the comparison between the output estimate and the ground truth until the output estimate gradually matches or approximates the ground truth.

The convolutional neural network may be trained by adjusting a weight between neurons based on the difference between the ground through and an actual output.

Figure 5B:
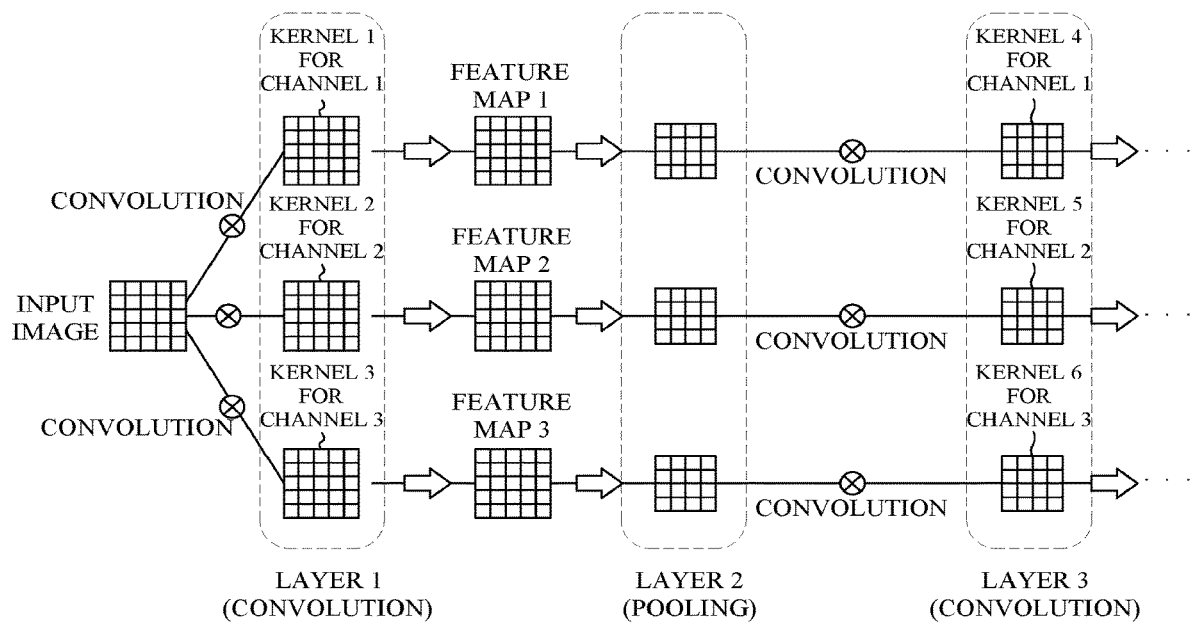
FIG. 5B is a view illustrating an overall operation of a convolution neural network.

FIG. 5B illustrates an overall operation of a convolution neural network.

Referring to FIG. 5B, the input image is a two-dimensional matrix that is 5×5 in size. Further, in FIG. 5B, three nodes, that is, a channel 1, a channel 2, and a channel 3, are used.

First, a convolution operation of the layer 1 will be described.

The input image is convoluted with a kernel 1 for a channel 1 at a first node of the layer 1, and a feature map 1 is output as a result. Further, the input image is convoluted with a kernel 2 for a channel 2 at a second node of the layer 1, and a feature map 2 is output as a result. The input image is convoluted with a kernel 3 for a channel 3 at a third node, and a feature map 3 is output as a result.

Next, a pooling operation of the layer 2 will be described.

The feature map 1, the feature map 2, and the feature map 3 output from the layer 1 are input to three nodes of the layer 2. Layer 2 receives feature maps output from the layer 1 as inputs to perform the pooling. The pooling may reduce a size or emphasize a specific value in the matrix. The pooling method may include max pooling, average pooling, and minimum pooling. The max pooling is used to collect maximum values in a specific area of the matrix, and the average pooling is used to calculate an average in a specific area.

In the example of FIG. 5B, a feature map of a 5×5 matrix is reduced to a 4×4 matrix by the pooling.

Specifically, the first node of the layer 2 performs the pooling with the feature map 1 for the channel 1 as an input, and then outputs a 4×4 matrix. The second node of the layer 2 performs the pooling with the feature map 2 for the channel 2 as an input, and then outputs a 4×4 matrix. The third node of the layer 2 performs the pooling with the feature map 3 for the channel 3 as an input, and then outputs a 4×4 matrix.

Next, a convolution operation of the layer 3 will be described.

A first node of the layer 3 receives the output from the first node of the layer 2 as an input to perform the convolution with a kernel 4 and output a result thereof. A second node of the layer 3 receives the output from the second node of the layer 2 as an input to perform the convolution with a kernel 5 for the channel 2 and outputs a result thereof. Similarly, a third node of the layer 3 receives the output from the third node of the layer 2 as an input to perform the convolution with a kernel 6 for the channel 3 and outputs a result thereof.

As described above, the convolution and the pooling are repeated and finally, as illustrated in FIG. 5A, a fully connected layer may be output. The output may be input to the artificial neural network for image recognition again.

Hereinafter, SoC will be mainly explained, but the disclosure of the present specification is not limited to the SoC and the contents of the present disclosure is also applicable to a system in package (SIP) or a printed circuit board (PCB)-based board level system. For example, each functional component is implemented by an independent semiconductor chip and is connected by a system bus which is implemented by an electrically conductive pattern formed on the PCB.

FIG. 6A illustrates an exemplary architecture of a system on chip (SoC) including an NPU of FIG. 1 or FIG. 3.

Referring to FIG. 6A, an exemplary SoC 1000 includes a plurality of functional components, a system bus 500, an in-system component tester (ICT) 600, and a plurality of test wrappers 700a, 700b, . . . , and 700g, collectively denoted as test wrappers 700.

A (test) wrapper can adapt the interfaces of the components that communicate with each other. Accordingly, the (test) wrapper may also be referred to as an interface circuit. A so-called NPU test wrapper may include various components, such as interfaces for inputs and outputs, an interface controller, a test wrapper controller, a test access mechanism, and the like.

The plurality of functional components may include an array 100-1 of NPU cores, an array 200 of central processing unit (CPU) cores, an array 300 of graphics processing unit (GPU) cores, an internal memory 400, a memory controller 450, an input/output (I/O) interface 800, and a field programmable gate array (FPGA) 900.

The examples of the present disclosure are not limited thereto, and at least some of the plurality of functional components may be removed. The examples of the present disclosure are not limited thereto and may further include other functional components other than the plurality of functional components described above.

The NPU, CPU, and GPU are collectively called universal processing units (UPI), application processing units (APU), or application-dedicated processing units (ADPU).

The individual NPU core in the array 110-1 may refer to the NPU 100 of FIG. 1 or FIG. 3. In other words, an array 110-a in which the plurality of NPUs 100 of FIG. 1 or 3 is included is illustrated in FIG. 6.

Similarly, a plurality of CPU cores may be included in the array 200. A plurality of GPU cores may be included in the array 300.

The array 100-1 of the NPU cores may be connected to the system bus 500 via the wrapper 700a. Similarly, the array 200 of the CPU cores may be connected to the system bus 500 via the wrapper 700b. Similarly, the array 300 of the GPU cores may be connected to the system bus 500 via the wrapper 700c.

The internal memory 400 may be connected to the system bus 500 via the wrapper 700d. The internal memory 400 may be shared by the CPU core, the GPU core, and the NPU core.

The memory controller 450 which is connected to the external memory may be connected to the system bus 500 via the wrapper 700e.

The system bus 500 may be implemented by an electrically conductive pattern formed on a semiconductor die. The system bus enables high speed communication. For example, the CPU core, the GPU core, and the NPU core may read out data from the internal memory 400 or write data in the internal memory 400, by means of the system bus 500. Further, the CPU core, the GPU core, and the NPU core may read out data from the external memory or write data in the external memory by means of the memory controller 450.

The ICT 600 may be connected to the system bus 500 by means of a dedicated signaling channel. Further, the ICT 600 may be connected to the plurality of wrappers 700 (700a~700g) by means of a dedicated signaling channel.

Each wrapper 700 (700a~700g) may be connected to the ICT 600 by means of a dedicated signaling channel. Further, each wrapper 700 may be connected to the system bus 500 by means of a dedicated signaling channel. Further, each wrapper 700 may be connected to the respective functional components in the SoC by means of a dedicated signaling channel.

To this end, each wrapper 700 may be designed to be located between the respective functional components in the SoC and the system bus 500.

For example, a first wrapper 700a may be connected to the array 100-1 of the NPU cores, the system bus 500, and the ICT 600 by means of dedicated signaling channels. A second wrapper 700b may be connected to the array 200 of the CPU cores, the system bus 500, and the ICT 600 by means of dedicated signaling channels. A third wrapper 700c may be connected to the array 300 of the GPU cores, the system bus 500, and the ICT 600 by means of dedicated signaling channels. A fourth wrapper 700d may be connected to the internal memory 200, the system bus 500, and the ICT 600 by means of dedicated signaling channels. A fifth wrapper 700e may be connected to the memory controller 450, the system bus 500, and the ICT 600 by means of dedicated signaling channels. A sixth wrapper 700f may be connected to the I/O interface 800, the system bus 500, and the ICT 600 by means of dedicated signaling channels. A seventh wrapper 700g may be further connected to the I/O interface 800. It may be configured to communicate with the outside through the seventh wrapper 700g.

The ICT 600 may directly monitor the system bus 500 or monitor states of the plurality of functional components by means of each wrapper 700. Each functional component may be in an idle state or a busy state.

When a functional component in an idle state is found, the ICT 600 may select the corresponding functional component as a component under test (CUT).

If a plurality of functional components are in an idle state, the ICT 600 may select any one functional component as a CUT in accordance with a predetermined rule.

If a plurality of functional components are in an idle state, the ICT 600 may randomly select any one functional component as a CUT. By doing this, the ICT 600 may cut off the connection between the functional component selected as the CUT and the system bus 500 or isolate such from the system bus 500. To this end, the ICT 600 may instruct the particular wrapper 700 (among 700a~700g) connected to the functional component selected as the CUT to cut off or isolate. To be more specific, the ICT 600 cuts off the connection between the functional component selected as the CUT and the system bus 500 by means of the wrapper 700 and then may instruct the wrapper 700 to transmit a signal to the system bus 500, instead of the functional component selected as the CUT. At this time, the signal which is transmitted to the system bus 500 may be a signal which is transmitted to the system bus 500 when the functional component selected as the CUT is in an idle state. To this end, when the functional component selected as the CUT is in an idle state, the wrapper 700 may monitor (or overhear) and store the signal which is transmitted to the system bus 500. The corresponding wrapper 700 regenerates the stored signal to transmit the regenerated signal to the system bus 500. In the meantime, the corresponding wrapper 700 may detect a signal from the system bus 500.

Thereafter, the ICT 600 may test the functional component selected as the CUT in order to determine whether any defects are present.

Specifically, the rule may include one or more of a priority rule according to the mission to be performed, a rule for priority between functional components, a rule according to the presence or absence of a spare for the corresponding functional component, a rule defined by the number of tests, and a rule defined by a previous test result.

For example, when the priority rule according to the mission instructs that an operation by the GPU has a higher priority than the operation by the CPU, between the CPU and the GPU in the idle state, the GPU may be preferentially tested. When the rule for priority between functional components instructs that the priority of the CPU is higher than the priority of the GPU, between the CPU and the GPU in the idle state, the CPU may be preferentially tested. According to the rule according to the presence or absence of a spare, when the GPU has three cores and the CPU has six cores, the GPU having less cores may be preferentially tested. According to the rule defined by the number of tests, when the CPU is tested three times and the GPU is tested five times, the CPU which was is tested may be preferentially tested. According to the rule defined by a previous test result, when as the previous test result for the CPU, an abnormality is discovered and the previous test result for the GPU is normal, the CPU may be preferentially tested.

When a (signal) collision occurs due to access from the system bus 500 to a functional component selected as the CUT at the time of starting the test or during the test, the ICT 600 may detect such collision.

If so, the ICT 600 may stop (interrupt) the test and drive a back-off timer with respect to the collision. Here, it can be understood that other types of test pausing techniques may be used (instead of stopping or interrupting), and that other types of timers or mechanisms can be employed (instead of the back-off timer).

The ICT 600, depending upon certain conditions, may reinstate the connection of the functional component selected as the CUT to the system bus 500.

When the back-off time of the back-off timer for the conflict expires, the ICT 600 may monitor whether the functional components enter the idle state again. If the functional component enters the idle state again, the ICT 600 may select the functional component as a CUT again, if necessary.

If the conflict (or collision) is not detected, the ICT 600 may continue the test and when the test is completed, analyze the test result.

The test may be for verifying whether a component of the system is defective in its manufacture, has been compromised, or has broken down. The compromising or the breakdown may be caused by a fatigue stress due to repeated usage or a physical stress such as heat or electromagnetic pulse (EMP). That is, it may be configured to detect a defect based on the test result.

Hereafter, the test being performed on the NPU will be described in an exemplary manner. As it will be described below, there are two types of tests including a function test and a scan test.

First, when the function test is performed on the NPU, the ICT 600 may input a predetermined or particular ANN test model and a test input to the NPU. When the NPU outputs an inference result for the test input using the input ANN test model, the ICT 600 compares an intended inference result and the inference result from the NPU to analyze whether the NPU is normal or defective. For example, when the ANN test model is a predetermined or particular CNN and the test input is a simple test image, the NPU performs the convolution and the pooling on the test image using the ANN test model to output a fully connected layer.

Next, when the scan test is performed on the NPU, as it will be described below, the ICT 600 may thread the flip-flops in the NPU with a scan chain. The ICT 600 may inject the test input to at least one flip-flop and acquire a test result from an operation of a combinational logic of the flip-flop to analyze whether the NPU is defective or normal during the runtime.

The test performed by the ICT 600 may be used to determine a fair quality before the SoC which is mass-produced in the factory comes out. According to the present disclosure, it is noted that the test for determining a fair quality may also be performed during the runtime of the SoC. That is, a test for determining a fair quality may be possible only before the SoC comes out from the factory. However, according to the present disclosure, functional components in the idle state are found from a plurality of functional components in the SoC to be sequentially tested so that the fair quality test may be performed on the SoC in the runtime (i.e., during actual use).

As a test analysis result, when the corresponding functional component is determined as normal, the ICT 600 returns back the connection with the functional component to the system bus 500. Specifically, the ICT 600 may disconnect the connection between the wrapper 700 and the system bus 500 and resume the connection between the functional component and the system bus 500. To be more specific, the ICT 600 may initialize the functional component to be connected to the system bus 500 and then instruct the wrapper 700 to stop a signal which is transmitted to the system bus 500.

However, if the test analysis result indicates that the component is defective, the ICT 600 may repeat the test several times in order to further check the result.

When as a result of several repeated tests, the functional component could be finally determined as being defective, that is, when it is determined that the functional component in the SoC is defective in its manufacture, has been compromised, or has broken down, the ICT 600 may deactivate the functional component.

As an alternative, when an error code included in a one-time test analysis result indicates that the functional component in the SoC is defective in its manufacture, has been compromised, or has broken down, the ICT 600 may deactivate the functional component.

In order to deactivate the functional component, the ICT 600 may cut-off or disconnect the connection of the functional component determined as defective to isolate the functional component determined as defective from the system bus 500. Alternatively, in order to deactivate the defective functional component, the ICT 600 may power off (i.e., turn off) the functional component. When the functional component is powered off, the erroneous operation of the defective functional component is prevented (or minimized) and the power consumption of the SoC may be reduced accordingly.

Further, in order to deactivate the defective functional component, the ICT 600 may revoke the address of the functional component on the system bus 500 or transmit a signal for deleting to the system bus 500. That is, the ICT 600 may transmit a signal for deleting an address of the defective functional component to a component having addresses used on the system bus 500.

When the deactivation is completed, the ICT 600 may determine whether there is a spare component that can be used to replace or in lieu of the functional component that was found to be defective. Even though a spare may exist, when the spare is not in an active state, the ICT 600 may activate the spare. That is, the ICT 600 may transmit a signal including a request for updating an address of the activated spare in an address table to a component having the table of addresses used on the system bus 500.

When an address on the system bus 500 is not allocated to the spare in the deactivated state, the ICT 600 may transmit a signal for reallocating an address of the defective functional component to the spare to the system bus 500.

After monitoring whether the spare is in an idle state, the ICT 600 may perform the test.

When there is no spare for the deactivated functional component, the ICT 600 may allow the FPGA 900 to be programmed to imitate the same (or similar) operation as the deactivated functional component. Information for programming the FPGA 900 may be stored in the internal memory 400. Alternatively, the information for programming the FPGA 900 may be stored in a cache memory of the FPGA 900. Here, it can be understood that other ways of allowing the FPGA 900 to take over (or emulate) some or all of the operations of a deactivated component can be implemented.

As described above, when the FPGA 900 is programmed to imitate the same operation as the deactivated functional component, the ICT 600 may transmit a signal including a request for updating an address table used in the system bus 500. As an alternative, a signal including a request for reallocating the address of the defective functional component to the FPGA 900 may be transmitted to the system bus 500. In other words, the existing address of the FPGA 900 may be revoked and replaced by an address of the defective functional component.

On the other hand, unlike in FIG. 6A, the FPGA 900 may lack a direct connection to the system bus 500, and may be connected to the system bus 500 through a separate wrapper. That is, a separate wrapper may be added between the system bus 500 and the FPGA 900.

When at least one functional component is determined as being defective, the SoC may be configured to display a warning message on a display device which is communicable with the SoC.

When at least one functional component is determined as being defective, the SoC may be configured to transmit a warning message to a server which is communicable with the SoC. Here, the server may be a manufacturer's server or a server in a service center. As described above, according to the present disclosure, the ICT and the wrapper are combined in the SoC, and testing for defects may be performed during the runtime (or operation) of the SoC.

FIG. 6B is a view illustrating a first modified example of FIG. 6A.

Hereinafter, only the contents different from the description of FIG. 6A will be described, and substantially the same contents will be referred to above-described content.

First, unlike in FIG. 6A, in FIG. 6B, the wrappers 700, that is, 700a, 700b, 700c, 700d, 700e, 700f, and 700g may be arranged or positioned to be immediately adjacent to the system bus 500. In this case, the advantage is that SoC design and manufacturing can be much simpler. The implementation of this arrangement is not merely a simple matter of design choice, but numerous technical considerations need to be taken into account. For example, arranging the wrappers next to the system bus has some technical hurdles. Also, there are manufacturing issues with respect to implementing such wrappers with the system bus.

As a specific example, as shown in FIG. 6B, the wrappers 700 may be arranged to partially or completely surround the system bus 500. When the wrappers 700 are arranged to surround the system bus 500 in this way, the system bus 500 can be safely isolated. Specifically, since the system bus 500 can be safely isolated by using the architecture or structure as shown in FIG. 6B, it is possible to suppress or minimize erroneous information/instruction from being transmitted to any one of functional components through the system bus 500. In addition, since the system bus 500 can be safely isolated by using the architecture shown in FIG. 6B, even if any of functional components malfunctions, it is possible to block the detrimental influence onto other functional components.

On the other hand, unlike FIG. 6A, the FPGA 900 may be not directly connected to the system bus 500, but is connected to the system bus 500 through a wrapper 700h. That is, a wrapper 700h may be added between the system bus 500 and the FPGA 900.

Figure 6C:
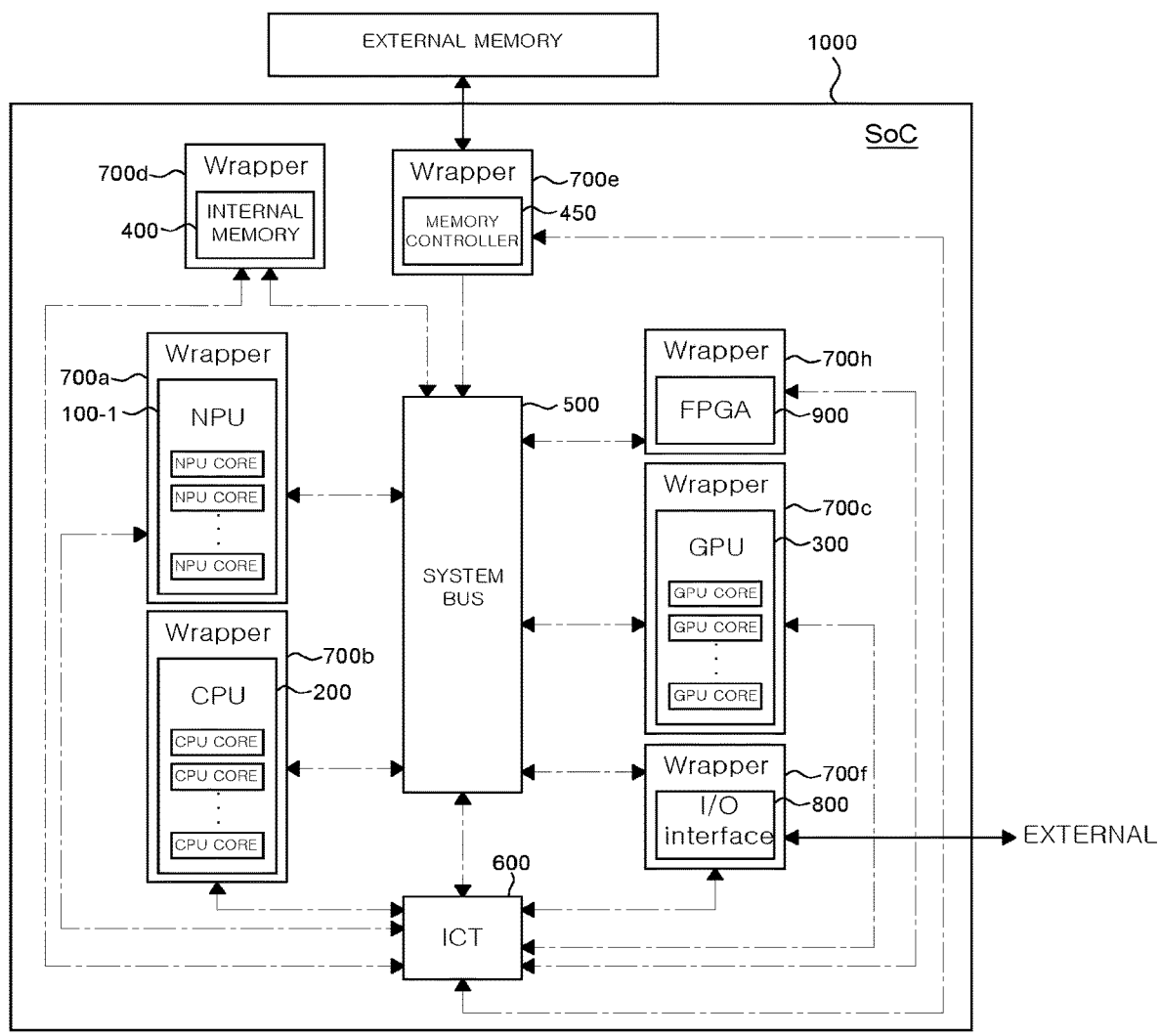
FIG. 6C is a view illustrating a second modified example of FIG. 6A.

FIG. 6C is an exemplary view illustrating a second modified example of FIG. 6A.

Hereinafter, only the contents different from the description of FIG. 6A or FIG. 6B will be described, and substantially the same contents will be referred to the above-described content.

First, unlike those shown in FIG. 6A or 6B, in FIG. 6C, each wrapper may be arranged to partially or completely surround each functional component. In other words, each functional component may be implemented in the form of an independent island or dedicated section within the wrapper. In addition, a channel through which each functional component is connected to the system bus is implemented in the form of a gate bridge, and the channel in the form of the gate bridge may be (partially or completely) opened and closed by each wrapper under the control of the ICT 600. Specifically, in the first wrapper 700a, the NPU 100-1 may be implemented in the form of an island. Similarly, the CPU 200 may be implemented in the form of an island in the second wrapper 700b. The GPU 300 may be implemented in the form of an island in the third wrapper 700c. The internal memory 400 may be implemented in the form of an island in the fourth wrapper 700d. The memory controller 450 may be implemented in the form of an island in the fifth wrapper 700e. In the sixth wrapper 700f, the I/O interface 800 may be implemented in the form of an island. The FPGA 900 may be implemented in the form of an island in the seventh wrapper 700h.

Figure 6D:
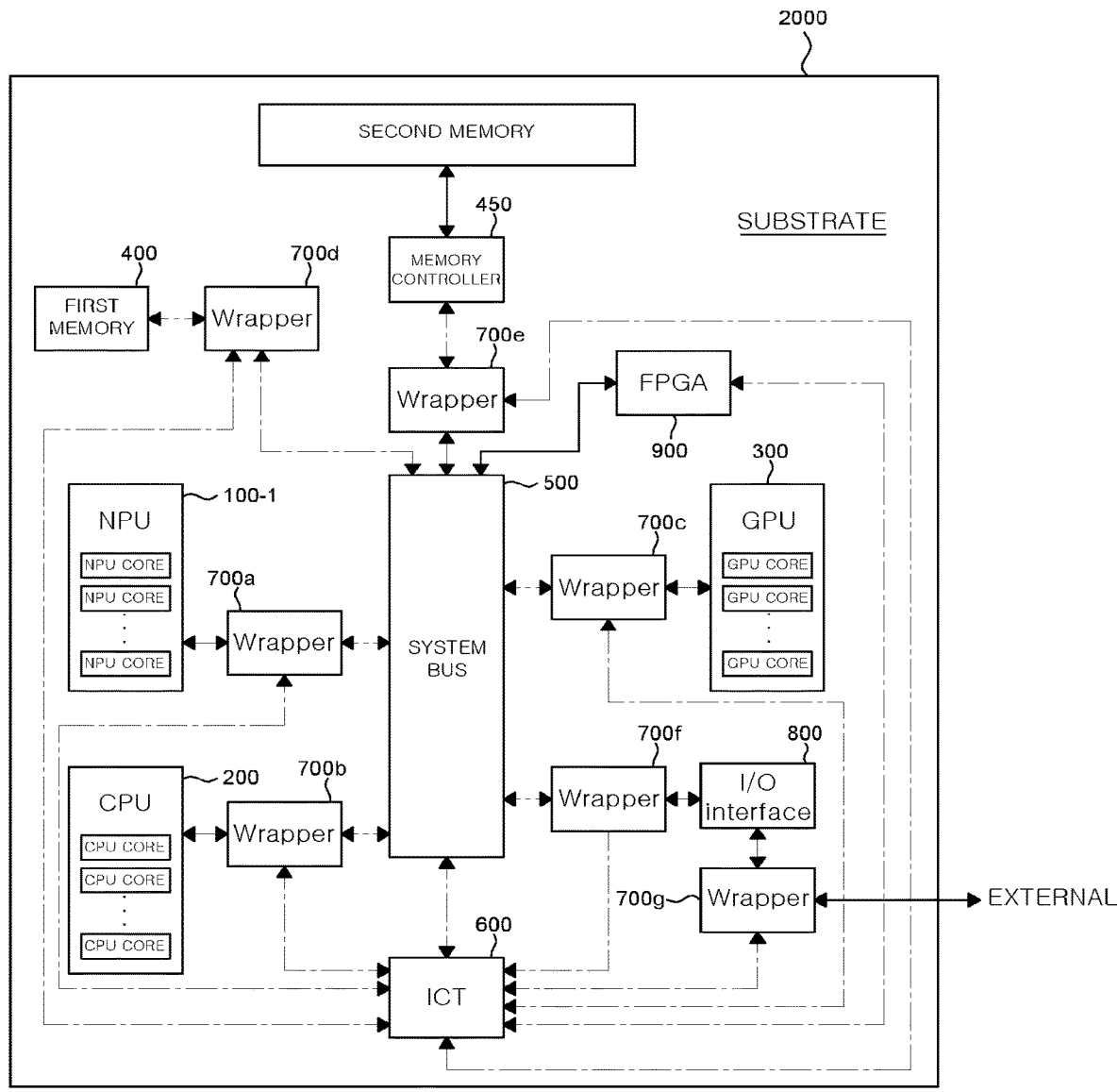
FIG. 6D is a diagram illustrating an exemplary architecture of a computing system including the NPU shown in FIG. 1 or FIG. 3.

FIG. 6D is an exemplary diagram illustrating an exemplary architecture of a computing system including the NPU shown in FIG. 1 or FIG. 3.

Hereinafter, only the contents different from the description of FIG. 6A will be described, and substantially the same contents will be referred to above-described content.

First, unlike that shown in FIG. 6A, in FIG. 6D, a plurality of functional components, a system bus 500, ICT 600, and wrappers 700 may be mounted on a board substrate 2000 rather than an SoC. The board substrate may be a printed circuit board (PCB) or some other type of substrate. Alternatively, the implementation shown in FIG. 6D may be a system in package (SiP).

The plurality of functional components may include an NPU 100-1, a central processing unit (CPU) 200, a graphics processing unit (GPU) 300, an internal (first) memory 400, a memory controller 450, a second memory 470, an input output (I/O) interface 800, and a field programmable gate array (FPGA) 900.

The first memory 400 can be implemented in various forms such as a dynamic RAM (DRAM), a synchronous dynamic random access memory (SDRAM), a static RAM (SRAM), a magnetic random access memory (MRAM), a resistive random access memory (RRAM), and a high bandwidth memory (HBM). However, the present disclosure is not limited thereto.

The first memory 400 may include a memory controller. However, in FIG. 6D, the memory controller 450 for the second memory 470 is shown to exist independently.

Similarly, the second memory 470 can be implemented in various forms such as a dynamic RAM (DRAM), a synchronous dynamic random access memory (SDRAM), a static RAM (SRAM), a magnetic random access memory (MRAM), a resistive random access memory (RRAM), and a high bandwidth memory (HBM). However, the present disclosure is not limited thereto.

The first memory 400 or the second memory 470 may be configured to store at least one of inference data, weight data, and feature map data of an artificial neural network model being processed by the NPU 100-1. The inference data may be an input signal of an artificial neural network model.

Figure 6E:
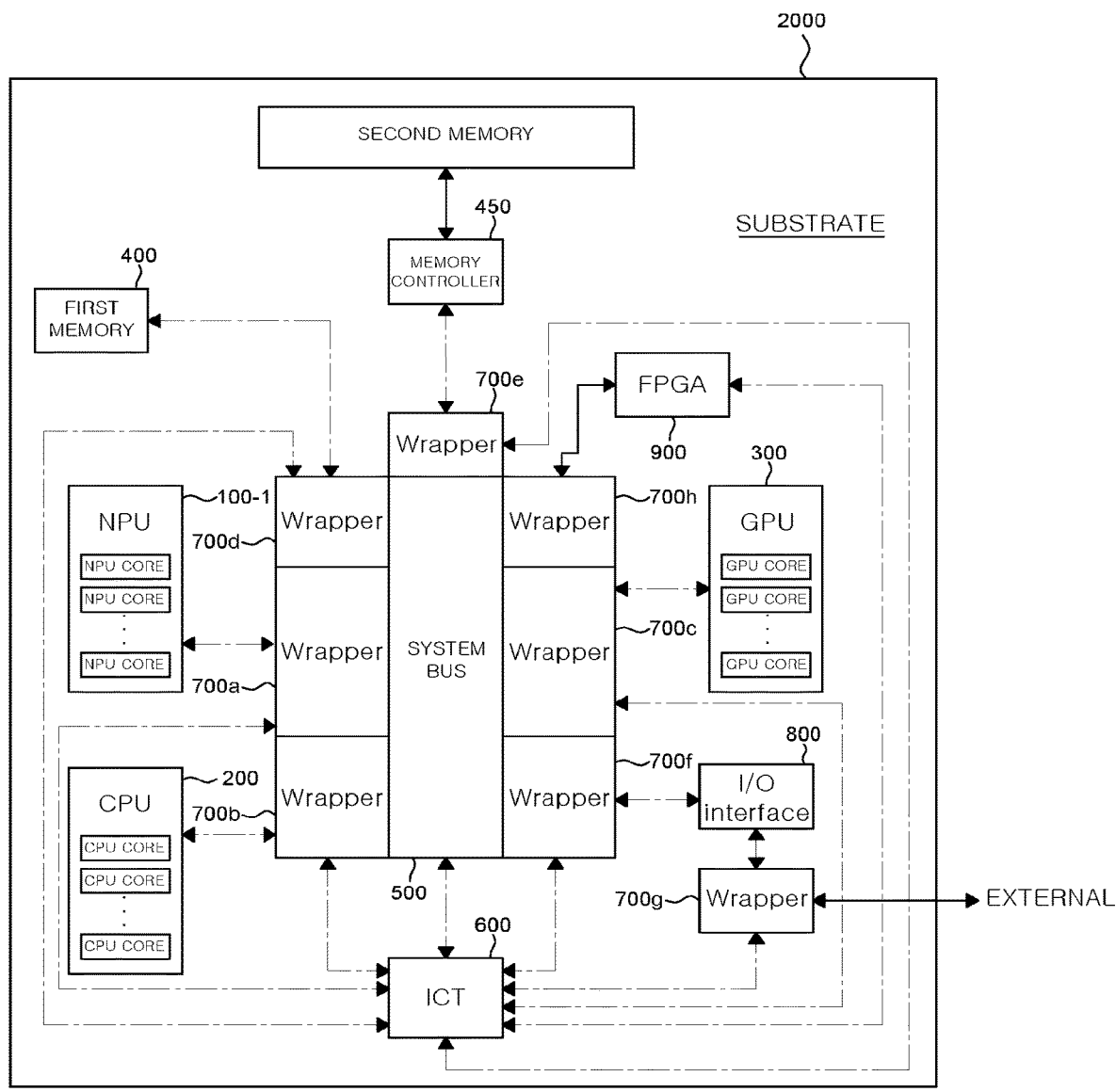
FIG. 6E is a view illustrating a first modified example of FIG. 6D.

FIG. 6E is an exemplary view illustrating a first modified example of FIG. 6D.

Hereinafter, only the contents different from the content described above will be described, and substantially the same contents will be referred to above-described content.

First, unlike shown in FIG. 6D, in FIG. 6E, the wrappers 700, that is, 700a, 700b, 700c, 700d, 700e, 700f, and 700g may be arranged to be positioned immediately adjacent to the system bus 500. In this case, it is advantageous that designing and manufacturing can be simpler and/or more cost effective.

As a specific example, as shown in FIG. 6E, the wrappers 700 may be arranged to at least partially surround the system bus 500. When the wrappers 700 are arranged to surround the system bus 500 in this way, the system bus 500 can be safely isolated. Specifically, since the system bus 500 can be safely isolated by using the architecture as shown in FIG. 6E, it is possible to suppress incorrect information/instructions from being transmitted to any one of functional component through the system bus 500. In addition, since the system bus 500 can be safely isolated by using the architecture shown in FIG. 6E, even if any one of functional component malfunctions, it is possible to block the influence on other functional components.

On the other hand, unlike FIG. 6D, the FPGA 900 is not directly connected to the system bus 500, but is connected to the system bus 500 through a wrapper 700h. That is, a wrapper 700h may be added between the system bus 500 and the FPGA 900.

Figure 6F:
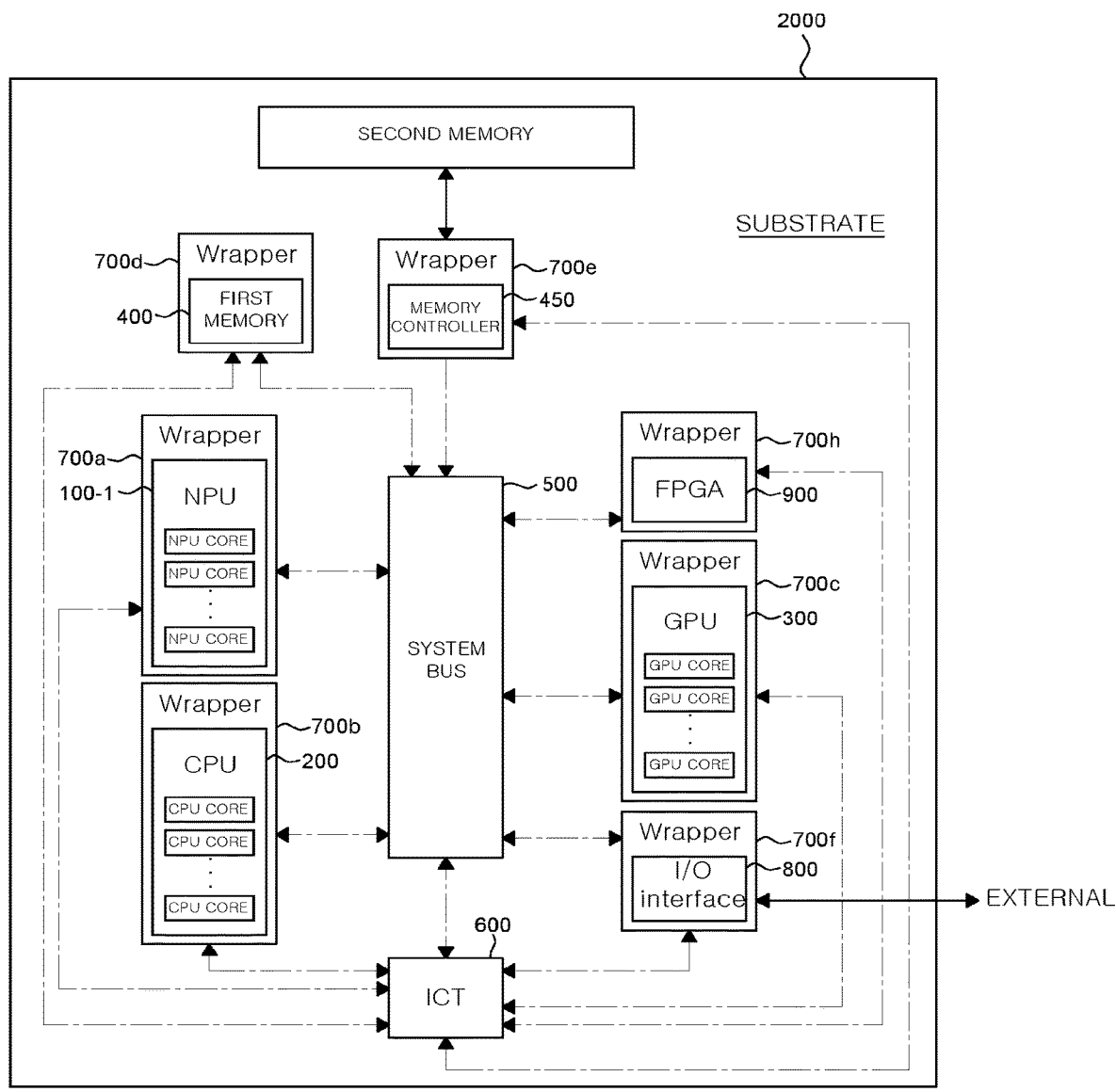
FIG. 6F is a view illustrating a second modified example of FIG. 6D.

FIG. 6F is an exemplary view illustrating a second modified example of FIG. 6D.

Hereinafter, only the contents different from the description of FIG. 6D or 6E will be described, and substantially the same contents will be referred to above-described content.

First, unlike those shown in FIG. 6D or 6E, in FIG. 6F, each wrapper may be disposed to surround each functional component. In other words, each functional component may be implemented in the form of an independent island within the wrapper. In addition, a channel through which each functional component is connected to the system bus is implemented in the form of a gate bridge, and the channel in the form of the gate bridge may be opened and closed by each wrapper under the control of the ICT 600.

Hereinafter, for deeper understanding of the above-mentioned content, it will be described in more detail with a table of contents.

I. Why Test During the Runtime is Important

In order to prevent or minimize potential accidents which may be caused by hardware defects in the autonomous computing system, various studies have been conducted.

Among various tests, a pre-deployment test is included. According to this test technique, all hardware designs are checked before selling the product to the clients. After the manufacturing, the design is tested from various viewpoints to detect and correct various problems which may be found during the actual operation. For example, in order to test a chip design, a test pattern is provided to perform the scanning of an input and inspection for an output result. Even though this technique may minimize a potential problem for the hardware design before the shipment of the products, the problems of the defect during the runtime which may be caused due to the aging of the integrated circuits (ICs), external environments, and vulnerabilities of the complex designs cannot be solved.

As described above, the above-described pre-deployment test cannot effectively solve the hardware defects so that the inventor began to be interested in test methods during the runtime.

From the viewpoint of a test mechanism, the pre-deployment test and the post-deployment test seem to be similar, but there is an obvious difference in when the test can be performed. Specifically, the pre-deployment test may be performed only at a specific time and generally may be allowed only shortly after the manufacturing. In contrast, the test during the runtime may be performed at any time in a normal operation situation.

There may be two test techniques for the test during the runtime including a function test and a scan test.

According to the function test, a test input is generated and an output result obtained by inputting the generated test input to an original design is compared with an intended pattern. Alternatively, based on an original design, according to the function test, input and output signals are monitored to detect an abnormality.

According to the scan test, architectures for the scan test are inserted into the original design and various test patterns need to be created as many as possible. As described, after preparing the scan architectures and the test patterns, the test during the runtime may be performed in various ways.

In order to perform the scan test, the ICT may connect the plurality of flip-flops in each CUT, inject the test input to at least one flip-flop, and acquire a test result from an operation of a combinational logic of the flip-flop to analyze whether the CUT is defective or normal during the runtime.

Figure 7:
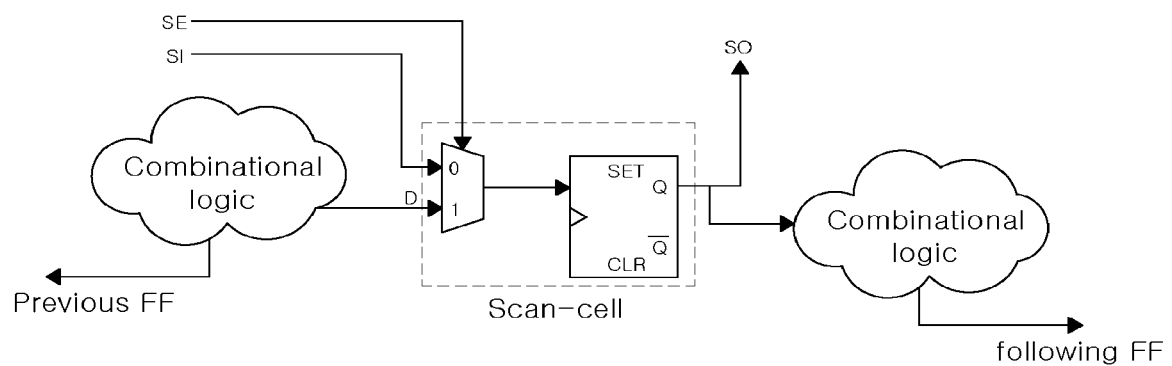
FIG. 7 is a view illustrating an example of scanning a flip-flop.

FIG. 7 illustrates an example of scanning a flip-flop structure.

In order to more easily design the hardware and minimize potential manufacturing defects, it is very important to apply a proper design for testability (DFT).

To this end, an architecture for the scan test is reflected to the design and a test range with a specific ratio for all detectable defects is defined to perform the test.

When a D-type flip-flop is used, the architecture for the scan test may be easily reflected to the design. During the test, all flip-flops in the CUT may operate as scan flip-flops including the D-flip-flops and multiplexers.

As compared with the normal D-type flip-flop, as illustrated in FIG. 7, the flip-flop may use two additional pins, that is, a scan enable (SE) pin and a scan in (SI) pin. The SI pin is for test input and the SE pin enables the switching between an input (D pin) for a normal operation and a test input (SI) for a test operation.

Figure 8:
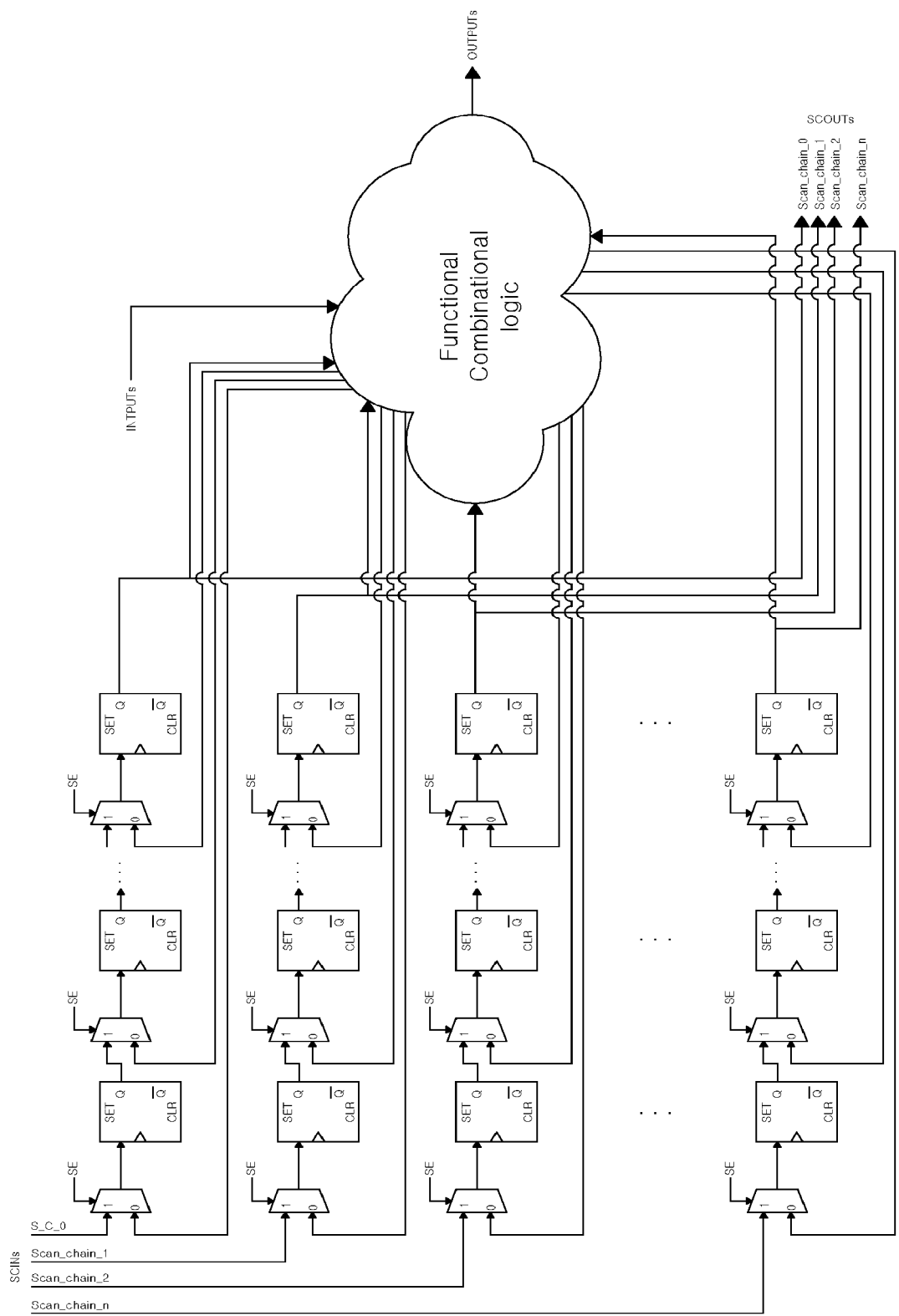
FIG. 8 is a view illustrating an example in which an architecture for scan test is added in a hardware design.

FIG. 8 illustrates an example in which an architecture for scan test is added in a hardware design.

As illustrated in FIG. 8, all SE pins in the scan flip-flop are connected to the scan_enable (SE) ports and an SI pin of each flip-flop is connected to a Q pin of a previous flip-flop or a scan input port, and a Q pin of each flip-flop is connected to an SI pin of a subsequent flip-flop.

These connections create multiple scan chains. That is, the flip-flops are threaded to each other to create a scan chain.

When the SE (scan_enable) port is enabled, all scan flip-flops transmit data from the SI pin to the Q pin via the flip-flop and thus the data may be transmitted from a scan_in port to a corresponding scan_out port. All the flip-flops on each scan chain shift the test input from the scan_in port to the scan_out port.

The smaller the number of flip-flops on the scan chain, the faster the speed of shifting the data. However, the number of flip-flops on each scan chain and the number of scan chains are dependent on each other. The more the scan chains created, the smaller the flip-flops on each scan chain.

II. Test Via ICT

The above-described test is performed as a background task so that the test may be performed without degrading a system performance. Based on the monitoring of an operation of a component to be tested, the ICT may determine whether the component is in an idle state. When the component is in an idle state, the test is performed so that the degradation of the system performance may not be caused. The ICT consistently monitors the operation state of the CUT on the system bus and the CUT may respond to an unexpected access. When there is access to the CUT, an operation of the CUT is switched from a test operation to a normal operation to recover the CUT and come back the CUT to the normal operation. A slight time delay may occur for the switching. According to the present disclosure, the system bus may be efficiently used during the time delay to minimize the degradation of the system performance due to the recovery.

II-1. Increase of Complexity of SoC or SiP Architecture

The design of the integrated circuit (IC) is becoming more complex day by day, and the degree of integration is also increasing significantly. The SoC or SiP is a semiconductor device having a very high degree of integration so that the defects of some functional components may cause the degradation of the entire system performance. Accordingly, it is becoming increasingly important to perform the test to find out the defect of the functional components in the SoC.

Figure 9A:
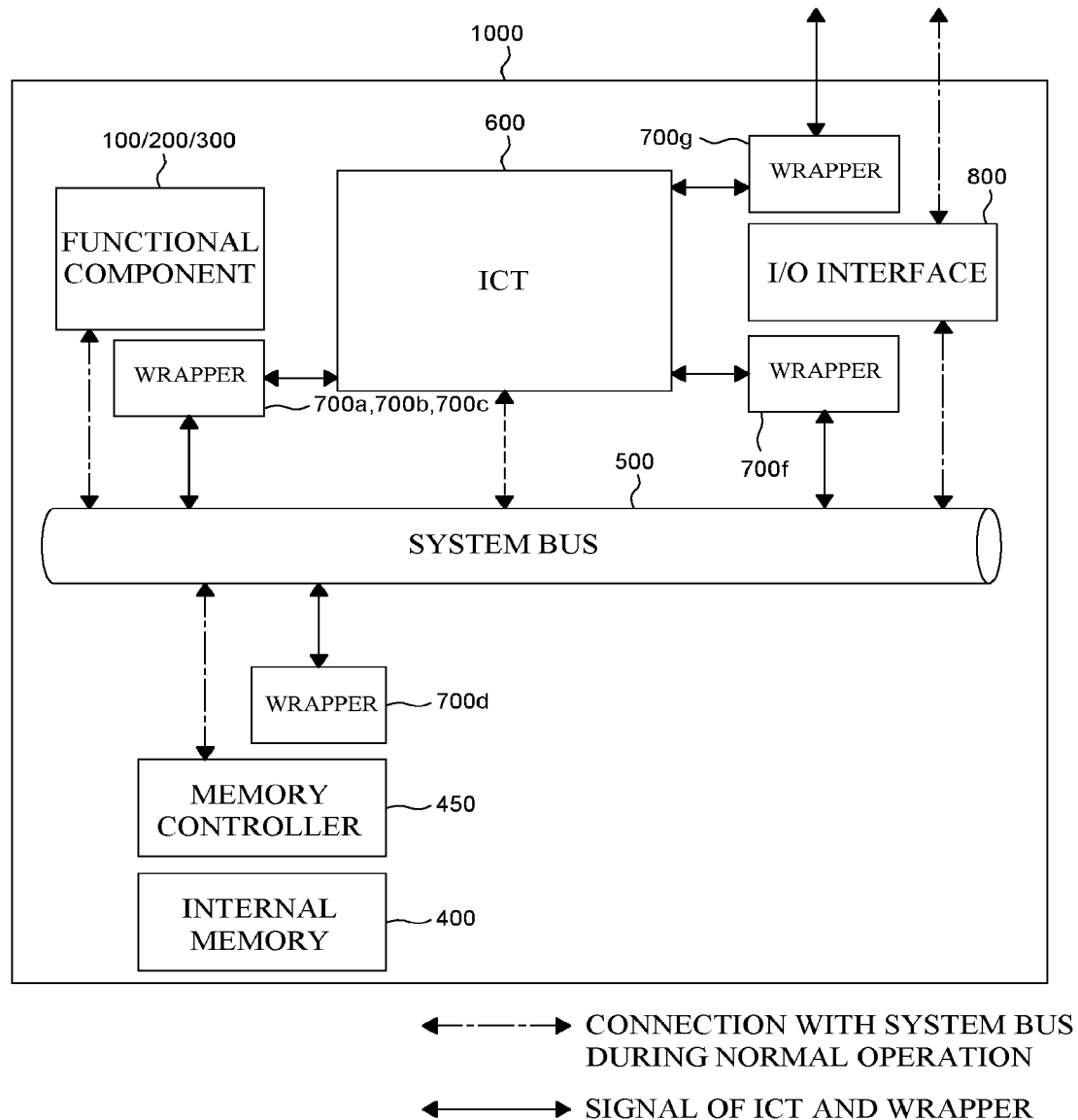
FIG. 9A is an exemplary view simply illustrating the SoC of FIGS. 6A through 6C or a system of FIGS. 6D through 6F from a viewpoint of an operation.

FIG. 9A illustrates the SoC of FIGS. 6A through 6C or the system of FIGS. 6D through 6F from a viewpoint of an operation.

The functional component (or IP) may be divided into three types: 1) an internal processor, 2) an interface or a communication controller, and 3) a memory. FIG. 9 shows a functional component (or IP) 100/200/300, an internal memory 400, a memory controller 450, a system bus 500, an ICT 600, a plurality of wrappers 700a, 700b, 700c, 700d, 700f, and 700g (collectively denoted by 700), and an I/O interface 800.

The functional component (or IP) 100/200/300 may perform functions related to encoding, decoding, encrypting, decrypting, and computing. The functional component (or IP) 100/200/300 acquires raw data from the internal memory 400 and processes the data with a specific algorithm. When the processing is completed, output data may be transmitted together with a signal notifying the completion.

The internal memory 400 may be a read only memory (ROM) or a random access memory (RAM). The ROM corresponds to a non-volatile memory and the RAM corresponds to a volatile memory.

The volatile memory is a memory in which data is stored only when a power is supplied and the stored data is lost when the power is interrupted. The volatile memory may include a static random access memory (SRAM) and a dynamic random access memory (DRAM).

The internal memory 400 may include a solid state drive (SSD), a flash memory, a magnetic random access memory (MRAM), a phase change RAM (PRAM), a ferroelectric RAM (FeRAM), a hard disk, or a flash memory. The internal memory 400 may also include a synchronous random access memory (SRAM) and a dynamic random access memory (DRAM).

The I/O interface may support various protocols and functions to allow the SoC or SiP to communicate with various external hardware.

However, when the SoC or SiP is built in an autonomous system to be used, the SoC or SiP may be compromised due to the aging of an electronic element (e.g., a transistor), a physical impact, or a usage environment. Specifically, when the functional component (or IP) in the SoC handles important data, the compromised functional component may generate wrong output data, which may significantly deteriorate the accuracy of the autonomous system.

In order to prevent this problem, as illustrated in FIG. 9A, the ICT 600 monitors the system bus 500 and monitors states of the functional component 100/200/300, the internal memory 400, the memory controller 450, and the I/O interface 800 via the wrapper 700 or the system bus 500. When the functional component in an idle state is found, the ICT 600 selects the functional component as a CUT to perform the test.

In FIG. 9A, a connection with the system bus during a normal system operation is represented with dotted lines and signals of the ICT and the wrapper are represented with solid lines.

Figure 9B:
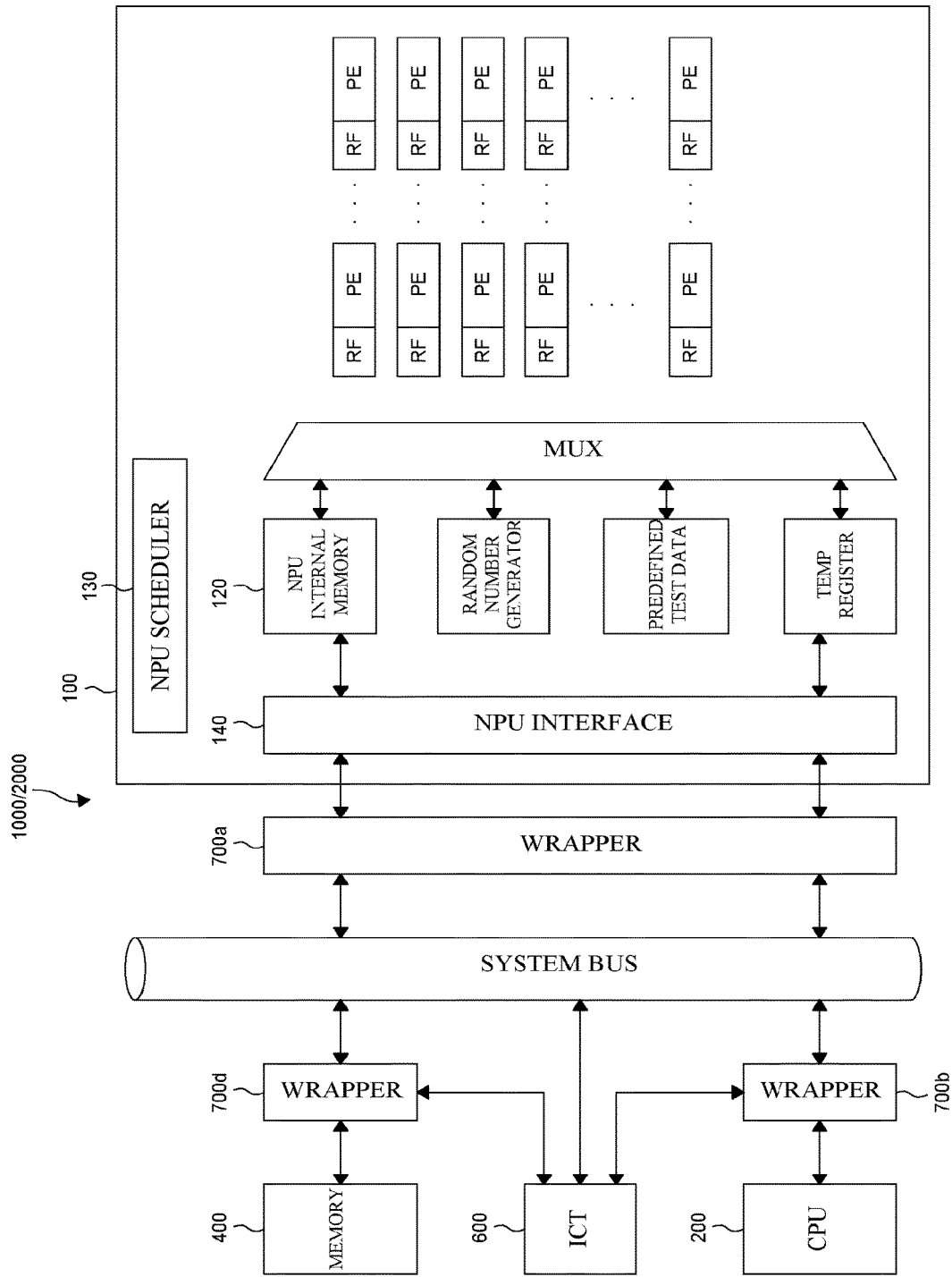
FIG. 9B is an exemplary view illustrating a configuration for testing the NPU.

FIG. 9B illustrates an exemplary configuration for testing the NPU.

Referring to FIG. 9B, the NPU 100 may further include another component to test the NPU. Specifically, referring to FIG. 9B, at least one of a random number generator, a predetermined test data storage, a temp register may be selectively further included in the NPU 100 as well as the components illustrated in FIG. 1 or 3. The MUX (multiplexer) may be disposed between the NPU internal memory 120 and the processing element array 110 to perform the internal test of the NPU 100. The MUX may be configured to switch a component configured to test the processing element array 110 and the NPU internal memory 120.

A method of testing the processing element array 110 using a random number will be described. The random number generator in the NPU 100 illustrated in FIG. 9B may generate a random number based on a predetermined seed. At least one of the processing element arrays 110 is selected by the MUX to test whether the NPU 100 is defective.

The ICT 600 monitors the state of the NPU 100 via the wrapper 700a and when the NPU 100 is determined to be in an idle state, the ICT 600 may command the NPU 100 to start the test.

As a specific example, the ICT 600 selects at least one of the plurality PEs included in the NPU 100 to command to start the test.

As a specific example, when the ICT 600 determines that a certain percentage of PEs (for example, 20% of PEs among all PEs) among the plurality of PEs included in the NPU 100 is in an idle state, the ICT 600 may command the NPU 100 to start the test. In other words, when a ratio of idle PEs among all the PEs is greater than or equal to a threshold value, the ICT may command to start the test.

As a specific example, when the ICT 600 selects a certain percentage of PEs (for example, 50% of PEs among all PEs) among the plurality of PEs included in the NPU 100 to command the NPU 100 to start the test.

When the test of the NPU 100 is performed, the inference speed of the NPU, that is, inference per second (IPS) may be degraded. Specifically, the inference per second may be lowered in accordance with the number of PEs to be tested. As a specific example, when 50% of PEs among all the PEs is tested, the inference per second may be lowered by approximately 50% and when the 30% of PEs among all the PEs is tested, the inference per second may be lowered by approximately 30%.

Accordingly, according to examples, the NPU 100 may further include extra PEs to improve the lowering of the speed due to the test.

As another example, when the NPU 100 operates at a value lower than a predetermined (or particular) IPS value, the ICT 600 may instruct the NPU 100 to perform the test. Specifically, when it is assumed that the NPU 100 operates at a maximum of 100 IPSs and a threshold IPS value is 30 IPS, if the NPU 100 operates at 30 IPS or higher, the ICT 600 may instruct the NPU 100 to perform the test during the remaining time. For example, when the NPU 100 operates at 40 IPS, the test may be performed using the remaining 60 IPS. Accordingly, the substantial speed lowering of the NPU may not be caused.

As another example, when the data which is transmitted to the NPU internal memory 120 in the memory 400 is delayed so that the NPU 100 is in an idle state or enters a data shortage period, the ICT 600 may instruct the NPU 100 to perform the test.

When the test is performed on the NPU 100, a register file RF corresponding to each PE in the NPU 100 is initialized to predetermined test input data and a corresponding PE may perform inference in accordance with test input data in the register file RF. The predetermined test input data may be a function test of the NPU or a partial function test.

When the NPU 100 is tested, as described above, the random number generator in the NPU 100 generates a random number. By doing this, the register file RF is initialized by the generated random number and the corresponding PE performs the inference in accordance with the random number in the register file RF.

As an alternative, the ICT 600 commands the CPU 200 via the wrapper 700b to inject test input data into the register file RF in the NPU 100.

When the NPU 100 is tested, a plurality of register files RFs in the NPU 100 is initialized to single test input data and a corresponding PE may perform inference in accordance with test input data in the register file RF. Specifically, the plurality of PEs in the NPU 100 may be tested based on the same single test input data and output the inference result.

As an alternative, when the NPU 100 is tested, some register files RFs in the NPU 100 are initialized based on specific test input data and a corresponding PE may perform inference in accordance with test input data in the register file RF.

The register file RF may reset the flip-flops in each PE and transmit the test input data to the PEs as described above.

For example, a size of each RF may be 1 Kb.

II-2. Necessity of Wrapper(s)

Figure 10:
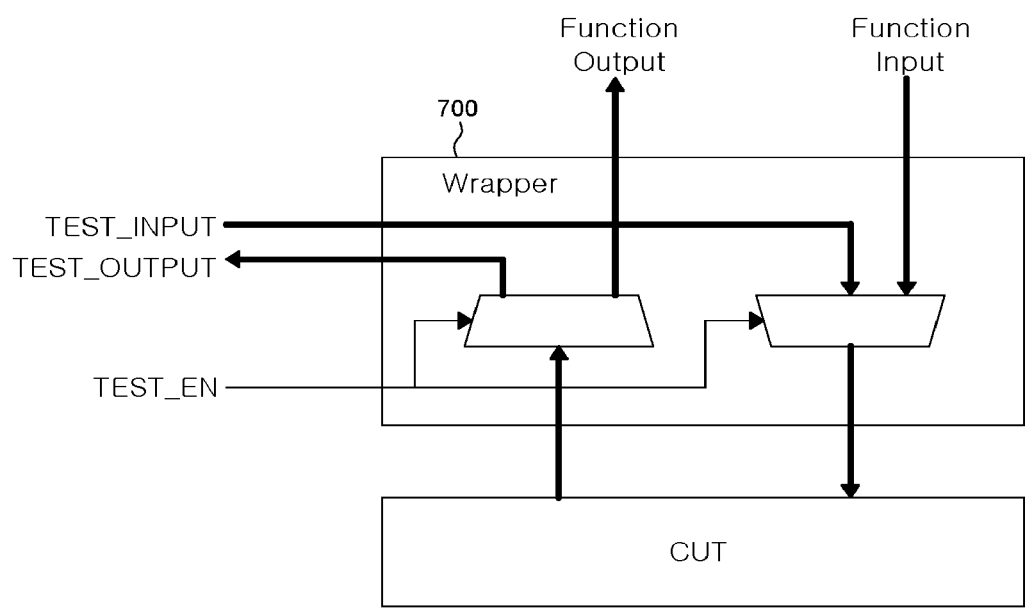
FIG. 10 is an exemplary view illustrating an operation of a wrapper.

FIG. 10 illustrates an exemplary operation of a wrapper.

As described above, the ICT may test many functional components (that is, IP, I/O interfaces, memories, etc.) in the SoC or SiP during the runtime of the SoC or SiP. To this end, during the test of the functional component selected as a CUT, a collision problem due to the access to the functional component from the system bus needs to be solved.

In order to solve the collision problem, after monitoring whether the functional component is in an idle state, when the functional component is monitored to be in an idle state, the functional component is switched from a normal operation mode to a test operation mode and then the test needs to be performed. When the collision is detected during the test, the functional component needs to be switched to the normal operation mode. After switching the operation to the normal operation mode, the functional component needs to correctly process the input data.

To this end, the illustrated wrapper 700 needs to be disposed between the functional components and the system bus 500. The wrapper 700 may include multiplexer gates which selectively control the input and the output for each operation mode.

As illustrated in the drawing, when a TEST_ENABLE port is on, a test vector may be input to the CUT and a TEST_OUTPUT port may transmit the output. General data output from the wrapper 700 may be transmitted to other functional components via the system bus. In contrast, the test result may be directly transmitted to the ICT 600. The ICT 600 may receive a test vector for the test from an external memory or an internal memory and store the test result in the internal memory or the external memory or transmit the test result to the outside.

In order to test the SoC or SiP in the runtime, the ICT 600 may perform a plurality of processes. First, the ICT 600 may select a functional component to be tested as a CUT based on a predetermined rule. Since the SoC or SiP is in the runtime, the CUT needs to respond to the access from the system bus. Accordingly, it is effective to select a functional component in an idle state as a CUT as much as possible. To this end, the ICT 600 may monitor whether the functional component enters the idle state. When the functional component enters the idle state, the wrapper 700 may turn on the TEST_ENABLE port. The ICT 600 may inject the test vector to the CUT via the TEST_ENABLE port.

The ICT 600 may collect and analyze the test result from the CUT via the TEST_OUTPUT port of the wrapper 700. When the test result indicates that a problem is detected, the ICT 600 may perform a post action. During the test, when a general access to the CUT from the system bus 500 is detected, the ICT 600 may temporally delay the access from the system bus 500 and then may immediately stop (interrupt) the test operation. Thereafter, the ICT 600 may recover previous values for register setting of the CUT and turn off the TEST_ENABLE port of the wrapper 700. When a normal operation of the CUT is ready, the ICT 600 may control the wrapper 700 to return back the connection for input and output with the CUT to the system bus 500.

Figure 11:
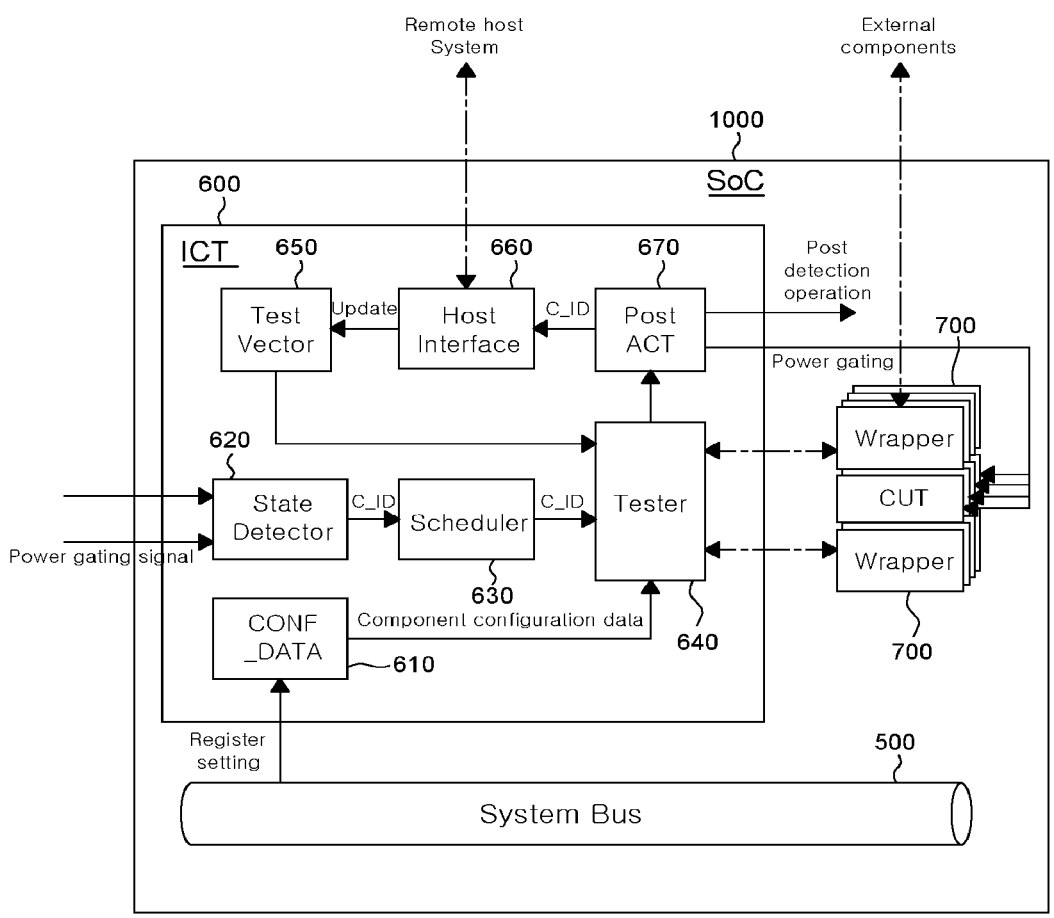
FIG. 11 is an exemplary view illustrating an internal configuration of an ICT.

FIG. 11 illustrates an exemplary internal configuration of an ICT.

Referring to FIG. 11, the ICT 600 may include a configuration data (CONF_DATA) restorer 610, a state detector 620, a scheduler 630, a tester 640, a test vector generator 650, a host interface 660, and a post action (POST_ACT) unit 670.

The state detector 620 may detect whether the functional components in the SoC chip or SiP are in an idle state or a busy state (or a processing state). When an arbitrary functional component enters an idle state, the state detector 620 transmits an ID (C_ID) of the functional component to the scheduler 630 to perform the test.

The scheduler 630 may manage an overall operation of the ICT 600. The scheduler 630 may receive a state of the functional component from the state detector 620 and trigger the test. The scheduler 630 may transmit the ID of the component to the tester.

The tester 640 controls the wrapper 700, transmits a test vector, acquires a test result, and then compares whether the test result matches an intended test result. Thereafter, the tester 640 may transmit the test result to the post-action unit 670. The tester 640 may restore the register setting for the functional component selected as the CUT to its original value.

The test vector generator 650 may generate a test vector (or a predefined test input data) and a corresponding intended test result. The test vector generator 650 may include a buffer, a memory interface, a memory which stores the test vector and the intended test result, and a random number generator. When the test starts, a test pattern for generating the test vector may be loaded in the buffer. The random number generator may be used to generate the test vector. The random number generator may allow the memory not to store all the test vectors, but generate various test vectors.

When the ID (for example, C_ID) of the functional component from which a problem is found is received from the tester 640, the post action unit 670 may perform the post action. The post action may isolate the defective functional component or notify a defect to the user or a remote host device.

The host interface 660 may report the functional component from which the problem is found during the test process to the user or the remote host device. If there is a change related to the test operation, the host interface 660 may notify the remote host device.

When the test is completed or the access to the functional component selected as CUT from the system bus 500 is detected during the test process, the configuration data restorer 610 may restore the register setting of the CUT to allow the tester 640 to switch the CUT to the normal operation mode. Most of the functional components may have a specific register setting value for a normal operation. Accordingly, the configuration data restorer 610 may store the register setting value of the functional component before performing the test and restore the register setting value to the functional component when the CUT needs to be switched to the normal operation mode.

II-3. To Detect Idle State of Functional Component

Figure 12:
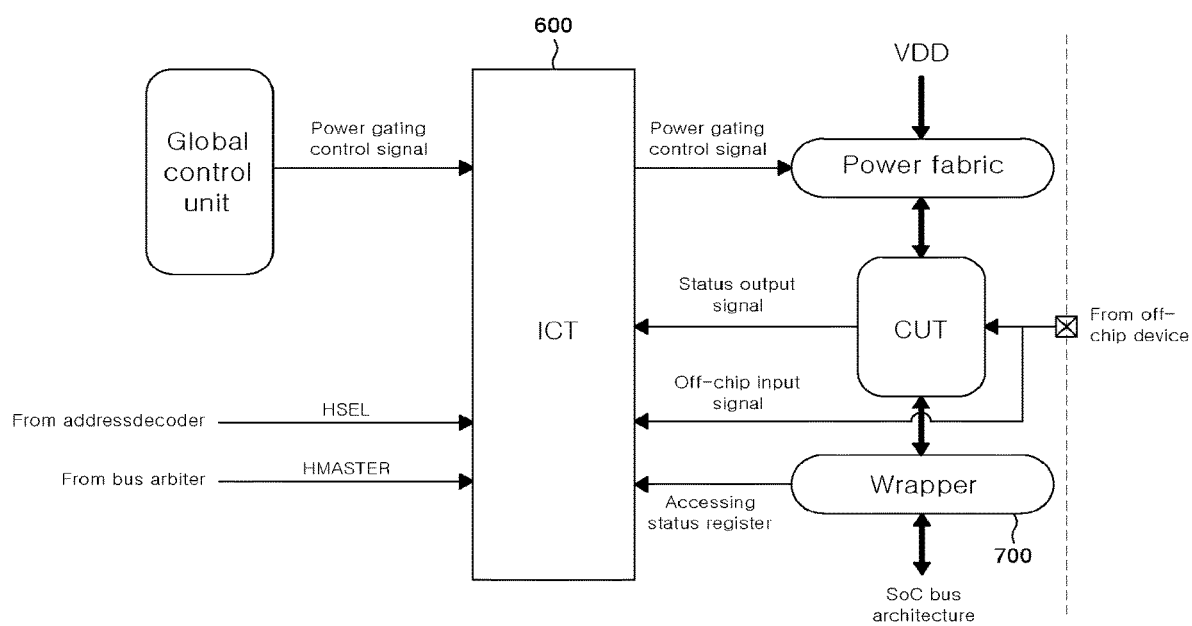
FIG. 12 is a block diagram specifically illustrating an operation of monitoring whether a functional component is in an idle state, by an ICT.

FIG. 12 illustrates an operation of monitoring whether a functional component is in an idle state by an ICT.

In order to detect whether the functional component is in an idle state during the normal operation mode, the ICT 600 may use one or both of two techniques. First, the ICT 600 may monitor whether the component is in an idle state or is in use, based on some hardware signals which directly or indirectly indicate whether to operate. For example, the ICT 600 may monitor a power gating control signal to disconnect the connection of the functional component to reduce the power consumption of the functional component. Further, the ICT 600 may determine whether the functional component is in an idle state, based on an output signal which directly or indirectly indicates whether the component operates or a value of a register which stores information related to the operation in the functional component. Second, the ICT 600 monitors a signal from a system bus via the wrapper 700 or monitors an input/output port of the functional component during a specific time period to determine whether the functional component is in an idle state.

II-4. Processing of Access Collision(s)

Figure 13:
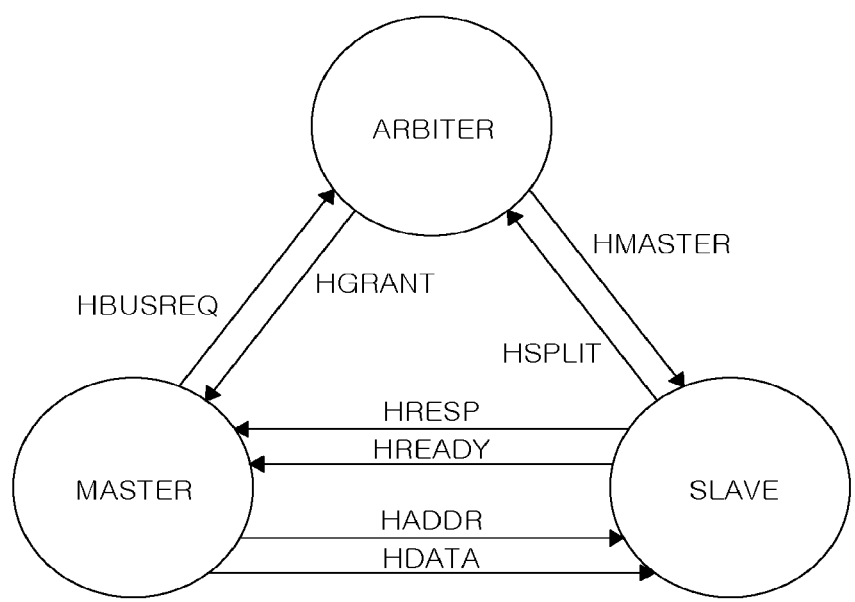
FIG. 13 is an exemplary view illustrating an operation between a master, a slave, and an arbiter which operate on a system bus.

FIG. 13 illustrates an operation between a master, a slave, and an arbiter which operate on a system bus.

The master on the system bus may be an entity which uses a slave, the slave may be an entity used by the master, and the arbiter may be an entity which performs arbitration and determination between the master and the slave.

The slave illustrated in FIG. 13 may be a functional component selected as a CUT and the arbiter may be an ICT.

When an access for a normal operation is detected from the system bus 500 while the functional component selected as a CUT is being tested, the ICT 600 may require a predetermined amount of time or more to recover the CUT to its previous state. The ICT 600 may temporally deactivate (or de-assert) an HREADY signal to temporally stop the system access from the master, stop (interrupt) the test activity, recover the register setting of the CUT, and change a direction of data which is input to or output from the wrapper. When the CUT which is the slave is ready to perform the task with the master, the HREADY signal may be turned on. However, according to the present disclosure, the ICT may induce some time delay for a bus separation operation. A specific process will be described below.

First, the master activates (or asserts) an HBUSREQ signal for a bus access. Second, during the arbitration or determination process, the arbiter activates (or asserts) an HGRANT signal to allow the bus access. By doing this, the master may transmit the data to the CUT which is a slave via the system bus. If the ICT is performing a processing operation for a test, the ICT transmits an HSPLIT signal to the arbiter together with a bit indicating a current master and activates (or asserts) an SPLIT signal in the HRESP signal, simultaneously. After the activation (assertion), the master nullifies the access to the CUT and the arbiter performs the arbitration or determination process without having intervention of the master. When the CUT is ready to respond to the access from the master, the ICT deactivates the HSPLIT signal and the master waits for a grant from the arbiter to resume the task to access the CUT.

Figure 14:
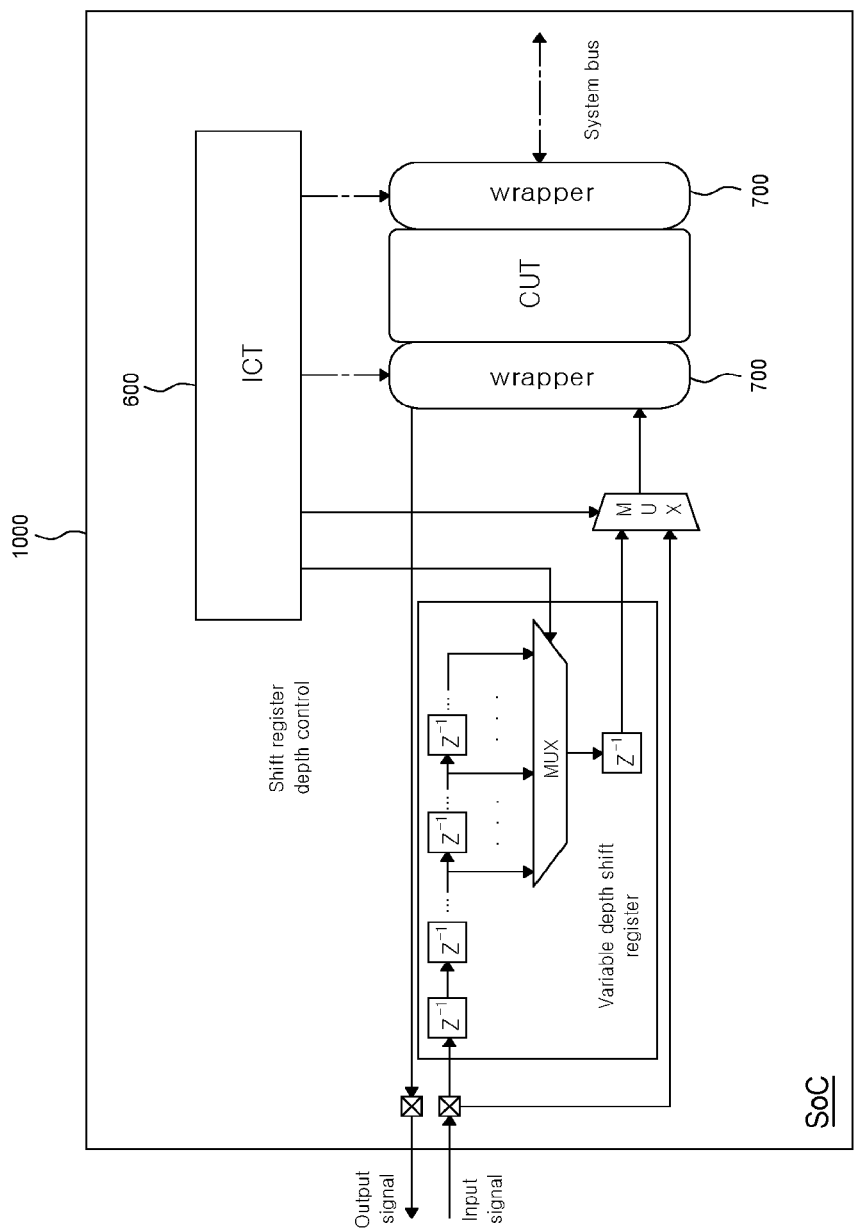
FIG. 14 is a view illustrating an example in which a shift register is added in an SoC chip.

FIG. 14 illustrates an example in which a shift register is added in an SoC chip or SiP.

The inventor of the present disclosure has recognized that the access to the I/O interface may not cause the collision on the system bus. For example, when the target CUT is a master, an external device connected through the I/O interface does not request the access for itself so that the collision may not occur. Accordingly, it may be effective to focus only on solving the collision problem generated when the CUT is a slave.

Instead, in order to delay data which is transmitted from the external device to the CUT during the restoring time, a shift register may be added between a port of the SoC and the external interface port of the CUT.

The shift register may be added to store the access signal input from the outside of the SoC while the CUT is restored. When the CUT is ready, the access signals are regenerated by the shift register to be output.

A depth of the shift register may be determined by the number of clock cycles required to restore the CUT to a normal operation. Specifically, when one or more functional components need to receive a signal from the outside of the SoC, the depth of the shift register may be variable. In this case, the depth of the shift register may be determined by the ICT.

II-5. Operation Order (or Sequence) of ICT

Figure 15:
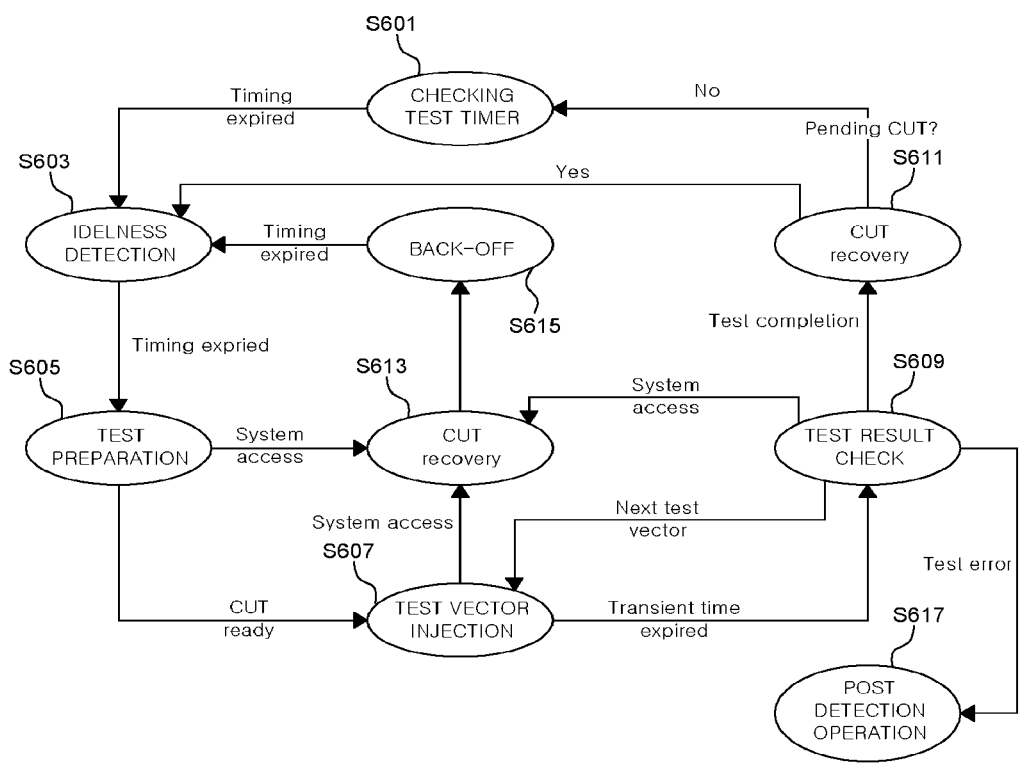
FIG. 15 is an exemplary view illustrating an operation order of an ICT.

FIG. 15 illustrates an operation order of an ICT.

Referring to FIG. 15, when a timer related to the test start of the ICT in the runtime expires (S601), the ICT monitors whether an arbitrary functional component is in an idle state and detects a functional component in an idle state (S603).

By doing this, the ICT performs a test preparation process (S605). The test preparation process may include selecting the functional component as a CUT, isolating the functional component selected as a CUT from the system bus, and generating a test vector as test input data. The isolation from the system bus may mean that the ICT changes the direction of the input and the output on the wrapper which communicates with the functional component selected as the CUT.

The ICT injects the test vector which is the test input data into the CUT (S607).

When the test is normally completed, the ICT checks the test result (S609). For the checking, the ICT may compare whether the test result matches the intended test result.

When the test result indicates that there is no problem in the functional component selected as the CUT (that is, no defect or damage), the ICT may recover the functional component to a normal operation state (S611).

In the meantime, when an access to the functional component selected as the CUT is detected from the system bus during the test preparation or the test, the ICT may recover the functional component selected as the CUT to a normal operation state (S613). The recovery may mean that a register setting value of the functional component selected as the CUT is recovered and the direction of the input and the output returns to an original state on the wrapper which communicates with the functional component selected as the CUT.

In this case, the ICT drives a back-off timer (S615) and when the back-off timer is expired, may return to the step S603.

In the meantime, when the test result indicates that there is a problem in the functional component selected as the CUT (that is, the defect or damage), the ICT may perform the post-operation (S617).

II-6. Test for Internal Memory

Figure 16:
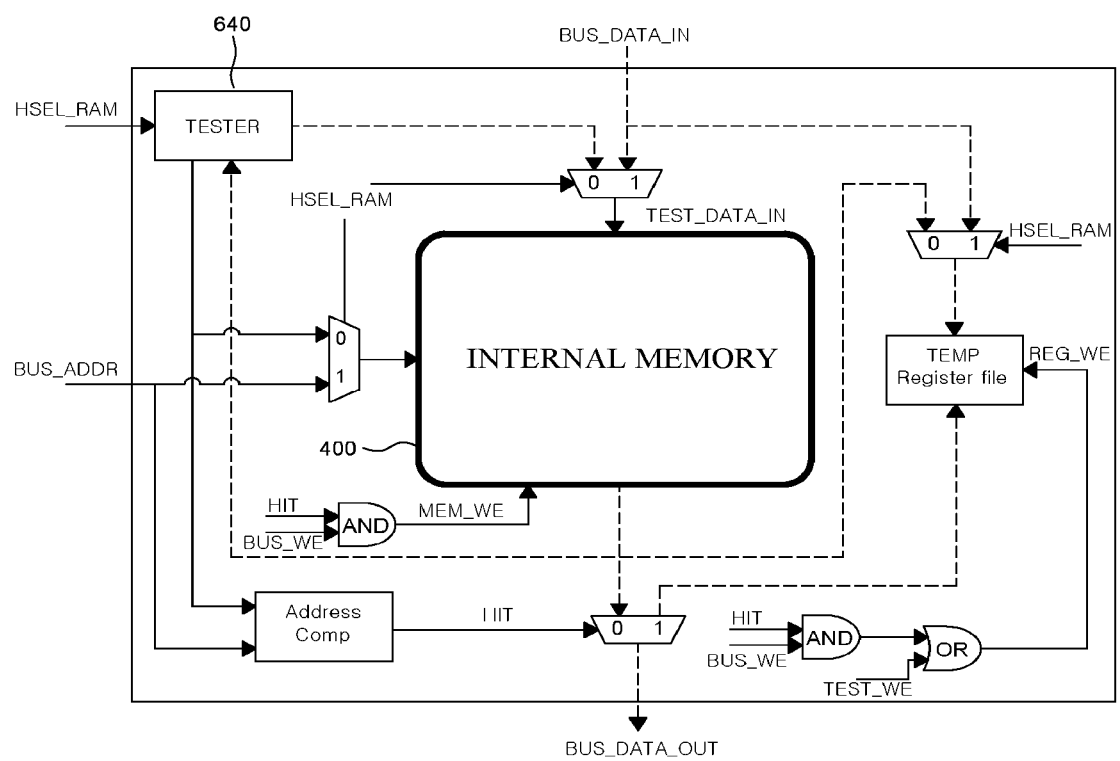
FIG. 16 is a block diagram illustrating for easy understanding of a test process of an internal memory.

FIG. 16 illustrates a test process of an internal memory.

The test for the internal memory may be different from the test for the functional component. Hereinafter, two test techniques for the internal memory will be proposed.

A first technique is a technique of detecting an error using an error detection code during a process of reading data from the internal memory. If an error detection code acquired during the reading process is different from a predetermined error detection code, the ICT may determine the code as an error.

A second technique is a technique of performing a read-write test in a hard way during a normal operation.

FIG. 16 illustrates the second technique. A test logic which encloses the internal memory may perform the read-write test during the runtime of the system and bypass the access from the system bus. In order to completely process the test, the tester in the ICT may be responsible for the address management. The illustrated temporally register file may temporally store original data which is prone to be deleted due to the test. When the test is completed, the original data in the temporary register file may be recorded in the internal memory again.

If an unpredictable access occurs during the test, data on the system bus may be recorded in the temporary register file, and in contrast, the data in the temporary register file may move to the system bus.

The test technique as described above may be applied not only to the internal memory, but also to the external memory in the same way.

II-7. Operation after Testing

When there is a hardware defect in the SoC or SiP, the operation after the test may be very important. For example, a user is notified of the defect in order to recommend stopping usage. To this end, the post action unit 670 of FIG. 11 may provide information about the functional component from which the defect is detected and information about test input data (that is, a test vector) which causes the defect. The above-described information may allow the user to know the position of the defective functional component. The usage of the functional component from which the defect is detected needs to be stopped and isolated. In order to prevent the defective functional component from degrading the performance of the entire system, the output signal of the functional component may be replaced by a predetermined signal. Alternatively, the functional component may be reset or gated. Alternatively, the power gating may be performed on the functional component.

In the meantime, when the functional component is isolated, the SoC or SiP may face another problem. Therefore, even though some functional components have defects, a method for allowing the SoC or SiP to still operate needs to be proposed. For example, when the SoC or SiP is mounted in a product which requires a high reliability, the SoC or SiP needs to further include a spare for some functional components. If some functional components have defects, the spare may operate instead of the functional component. However, when some functional components are duplicated, it may increase an area of the semiconductor device. In order to solve this problem, it may be effective to add a programmable logic in the SoC or SiP.

Figure 17:
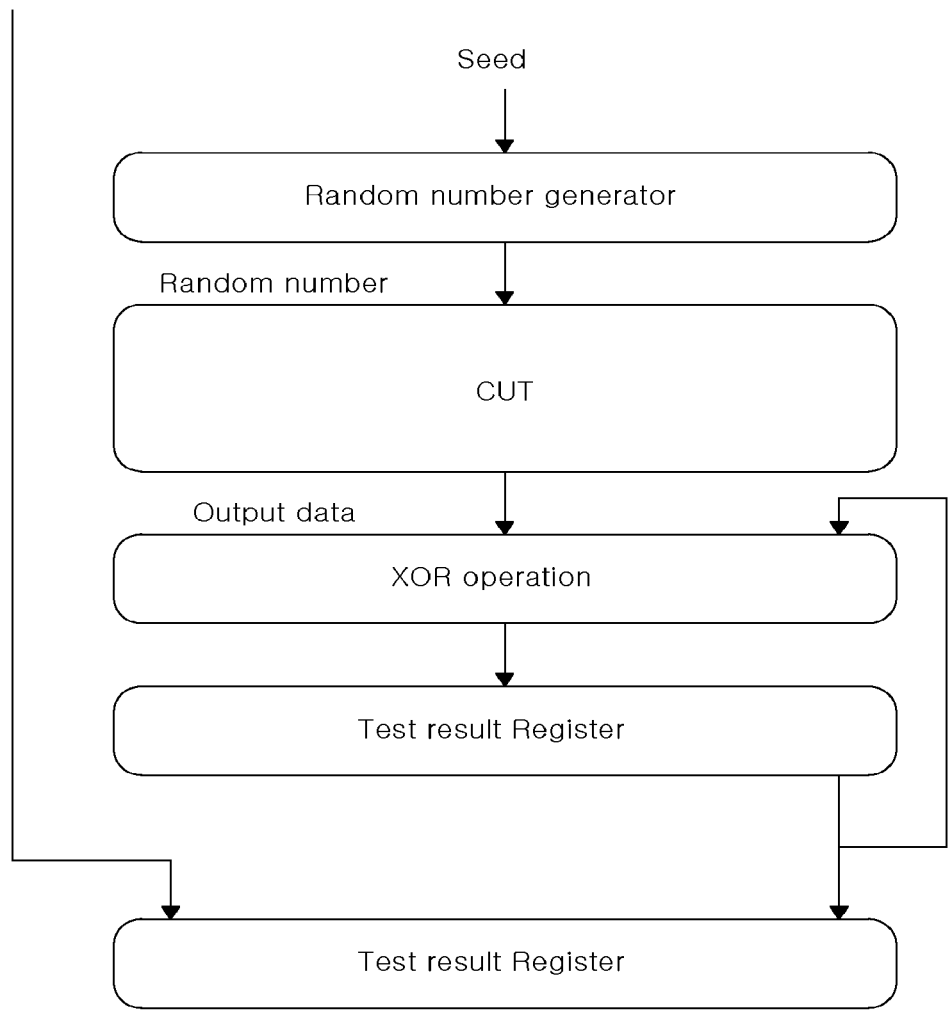
FIG. 17 is an exemplary view illustrating a process of testing a function using a random number generator.

III. Function Test During SoC or SiP Runtime or Test for Combination of Functions FIG. 17 illustrates a process of testing a function using a random number generator.

The function test is a test of injecting test input data (for example, a test vector) into a CUT and comparing whether an output from the CUT matches an intended output. In order to correctly evaluate based on the comparison, each input data needs to accurately induce an intended output. A test range of the test input data needs to be high to detect all defects.

In a specific design, there may be two test input data for the function test. First, a random number generator which is connected to an XOR operation may be used for the test operation illustrated in FIG. 17. Generally, the random number generator may generate a pseudo random number stream based on an input seed. The random number stream is injected into the CUT via the wrapper and the output is accumulated and stored in the test result register by means of the XOR operation. When the test is completed, the values stored in the test result register may be compared with the intended result corresponding to the test input data. If there is a difference in the comparison result, an error notification may be issued.

Second, all test patterns for test input data and corresponding prediction results may be fixed, respectively and stored in the internal memory in the SoC or SiP or an external memory. When the test input data (that is, a test vector) from the memory is input to the CUT, the output from the CUT and the intended result corresponding to the test input data may be compared.

In order to perform the function test during the runtime of the SoC or SiP, the ICT plays an important role to transmit data and communicate with the system bus, and monitor the state of the CUT. Specifically, when the CUT is in an idle state, the ICT needs to determine when the test is performed. During the test, the random number generator generates a random number stream as test input data and transmits the test input data to the CUT. If there is a difference between the test result and the intended test result, the ICT transmits the information to the post action unit.

During the function test, the functional components in the SoC may be used so that generally, a frequency for the test operation needs to be lower than or equal to a frequency for a normal operation to avoid the difference of the timing (that is, timing violation). In order to perform the test in real time during the normal operation, it is effective to perform the test when the functional component is in an idle state. Therefore, there is no choice but to perform the test at a high frequency.

IV. Test in Runtime of SoC or SiP Using Combination of DFT (Discrete Fourier Transform) and ICT IV-1. Multiple Clocks FIG. 18A illustrates an example of multiple clocks, FIG. 18B is an exemplary view illustrating an operation of a tester under the multiple clocks, and FIG. 18C illustrates a path of test input data.

During the test, with regard to the injection of one test input data (that is, a test vector), there may be two techniques.

Figure 18A:
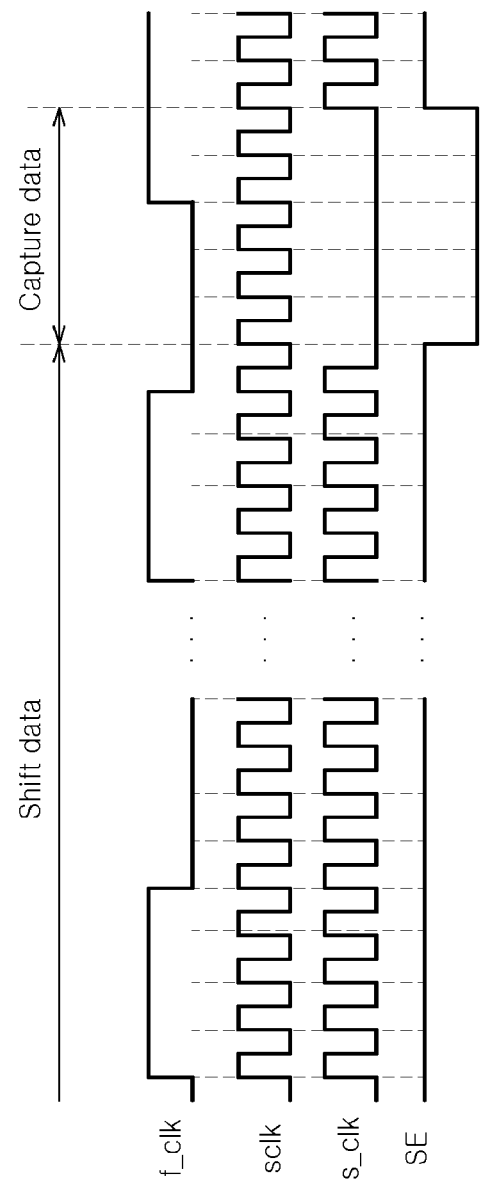
FIG. 18A is a view illustrating an example of multiple clocks.
Figure 18B:
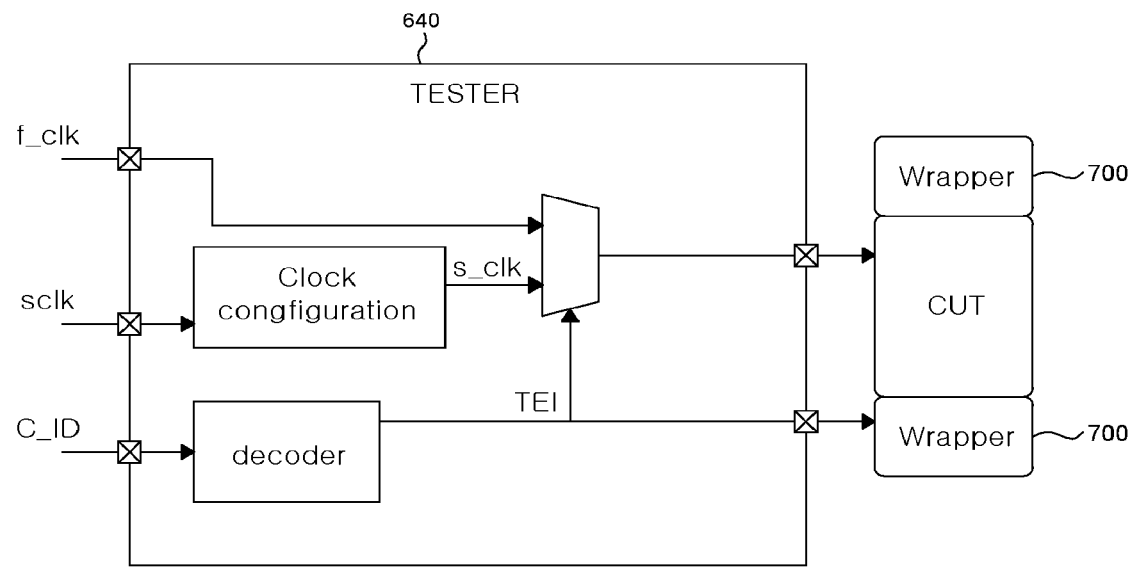
FIG. 18B is an exemplary view illustrating an operation of a tester under the multiple clocks.
Figure 18C:
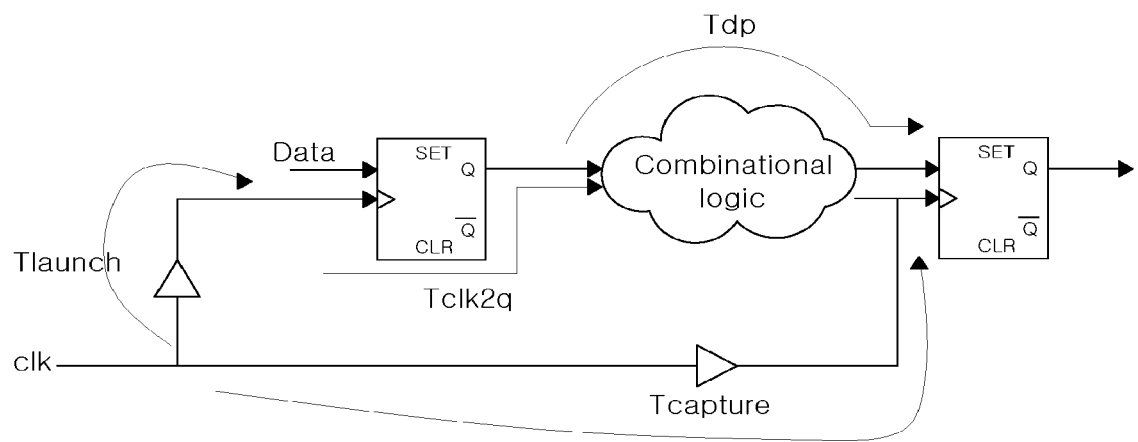
FIG. 18C is a view illustrating a path of test input data.

A first technique is to use a time period to "shift data" as illustrated in FIG. 18A. An SE (scan enable) port is enabled, and the Q output of a flip-flop is connected to the D input of another flip-flop. This connection may make a scan chain which connects the scan input to the scan output through a chain of the flip-flops.

Therefore, all the designed combinational logics may be disabled and there may be no reference logic cell for a data path (that is, a path from one flip-flop to another flip-flop).

When $T_{cycle}$ is defined as a clock cycle, $T_{launch}$ is defined as a time delay from a clock source of a first flip-flop to a CK pin, $T_{capture}$ is defined as a time delay from the clock source to a CP pin of a second flip-flop, $T_{clk2q}$ is defined as a time delay from a CK of the first flip-flop to a Q pin, and $T_{dpmax}$ is defined as a time delay from Q of the first flip-flop to D of the second flip-flop, $T_{cycle} > T_{launch} + T_{Clk2} + T_{dpmax} + T_{setup} + T_{margin} - T_{capture}$.

When the scan test is enabled, $T_{dpmax}$ may be reduced to zero from a viewpoint of the scan test. Ideally, $T_{dpmax}$ may be zero. However, in order to solve the timing violation, when a plurality of inverters or buffers is added, the time delay may be larger than zero.

As an alternative, $T_{dpmax} >> T_{Clk2q} + T_{setup} + T_{launch} - T_{capture}$. During a time period to "shift data," it may be processed at a higher frequency.

During a time period to "capture data" as illustrated in FIG. 18A, a scan enable pin is deactivated and thus the functional component is re-activated and a combinational logic may be activated on the data path. In order to solve the violation of the timing while data is captured, a time delay may be added between a clock located at one end in a time period to "shift data" and a clock located at one end in a time period to "capture data."

The delay between clock cycles may be greater than or equal to a clock cycle for a normal operation. In order to detect when the time period to "shift data" is completed based on a maximum number of flip-flops on the scan chain corresponding to a shifted value, a counter is added and in order to manage the time delay in a time period to "capture data," another counter may be added.

In FIG. 18B, a test block receives two input clocks. One is f_clk used for a normal operation and the other one is sclk to "shift data." A "clock configuration" is inserted into the tester block, so that s_clk signal may be set to be used in both the period to "shift data" and the period to "capture data."

In order to control the switching between f_clk for a normal operation and s_clk for test operation, a TE signal corresponding to the CUT may be used. When an ID (that is, C-ID) of the component is received from the scheduler, the test block in the ICT is ready to test. TEs of the CUTs which are available through the decoder may enable the test process.

Figure 19A:
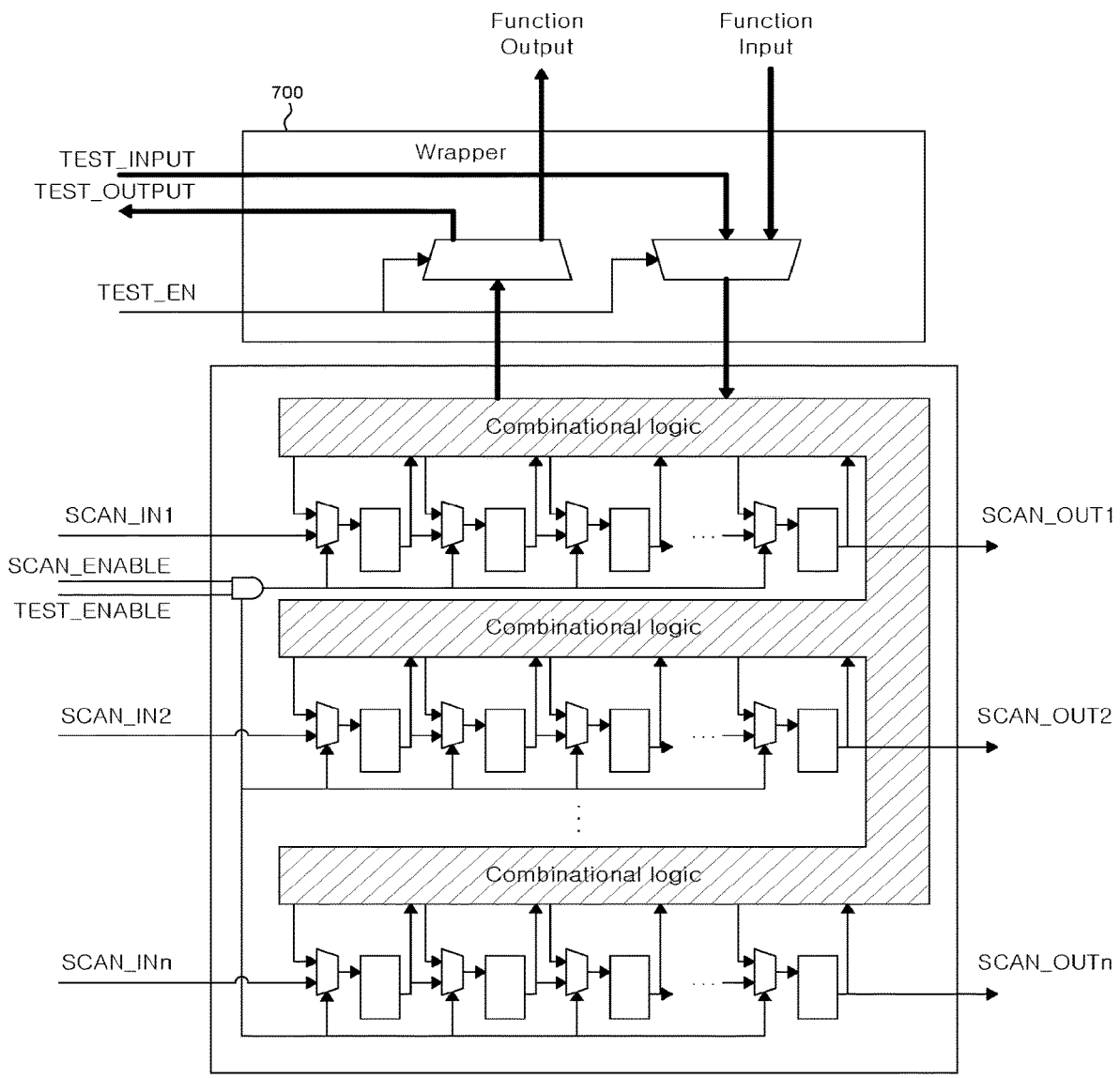
FIG. 19A is a view illustrating an example of a functional component.
Figure 19B:
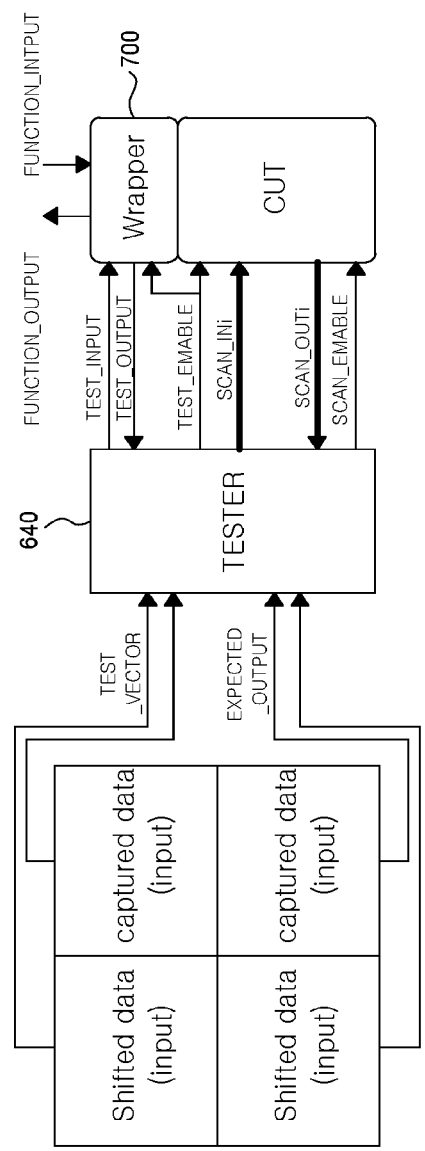
FIG. 19B is a view illustrating an example of test input data (for example, a test vector) injected into a tester in an ICT.

FIG. 19A illustrates an example of a functional component, and FIG. 19B illustrates an example that test input data (for example, a test vector) is injected into a tester in an ICT.

In order to apply a discrete Fourier transform (DFT) in the test during the runtime of the SoC or SiP, a scan chain is added in the CUT and all flip-flops may be enclosed by the scan flip-flop. A scan input, a scan output, and TEST_ENABLE, and SCAN_ENABLE signaling are connected to the tester in the ICT and an original input and an original output of the CUT may communicate with the system bus via the tester and the wrapper.

As illustrated in FIG. 19B, from a viewpoint of the memory which stores the test pattern, the block may be divided into four parts. A first part is a part which stores an input shift vector, a second part is a part which stores an output shift vector, a third part is a part which stores an input capture vector, and a fourth part is a part which stores an output capture vector. In order to start the test, the input shift data is loaded from the memory to input to the CUT through the tester.

In each scan chain, after all the flip-flops are filled with the shift vector, when the first input capture vector including a value for a scan input and an initial input is loaded, a first output capture vector including values for all scan outputs and initial outputs is loaded, and then compared with the actual output capture data. Each loaded shift vector is accompanied by output shift data and the actual output data and the output shift vector or an output capture vector may be compared.

Figure 20:
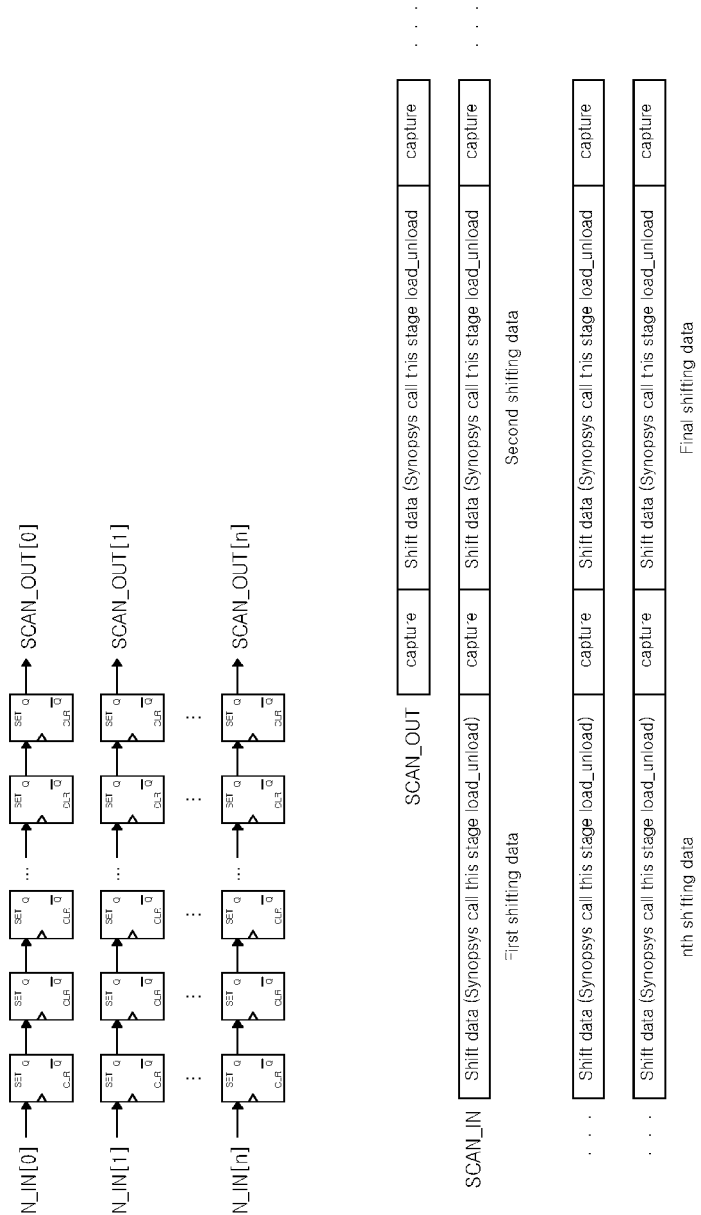
FIG. 20 is a view illustrating a test process using a DFT.
Figure 21:
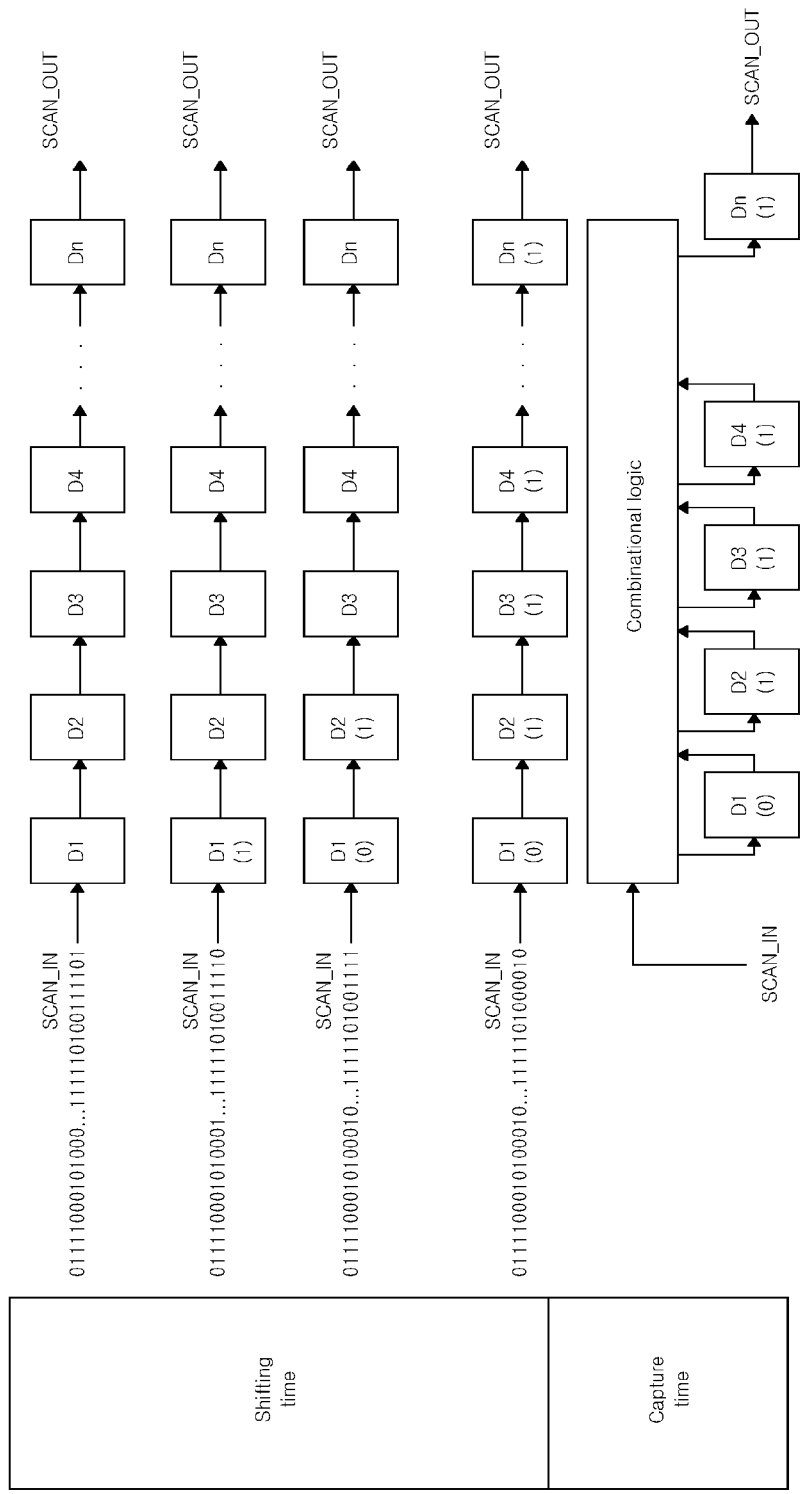
FIG. 21 is a view illustrating an example of shift data and capture data during a test process.

FIG. 20 illustrates a test process using a DFT, and FIG. 21 illustrates an example of shift data and capture data during a test process.

During a step of shifting data, when a scan_enable port is enabled, a SCAN_IN port may be connected to the SCAN_OUT port through the flip-flops without the combinational logic. An input shift vector may be loaded in all scan chains until all flop-flops have values shifted from the input shift vector. One shift value may pass through one flip-flop at each clock cycle. That is, a D pin of a previous flip-flop may be connected to a D pin of a subsequent flip-flop.

When during a capturing step, a scan_enable port is disabled, D pins of all flip-flops are not connected to the Q pins of the previous flip-flops, but may be directly connected to the combinational logic.

The capture vector output may be loaded in the Q output of all the flip-flops through the combinational logic at the positive (+) edge of a clock cycle. In a first data capturing step, a data transmitting process is prepared to compare the output data with intended output data and then the comparison is performed at every positive clock edge. All test vector inputs are loaded and the process returns to the first data shift step and each process starts over.

FIG. 21 illustrates shifting and capturing processes. A rectangular box in FIG. 21 indicates a flip-flop in each scan chain, and all flip-flops are filled at the end of the data shifting step.

Figure 22:
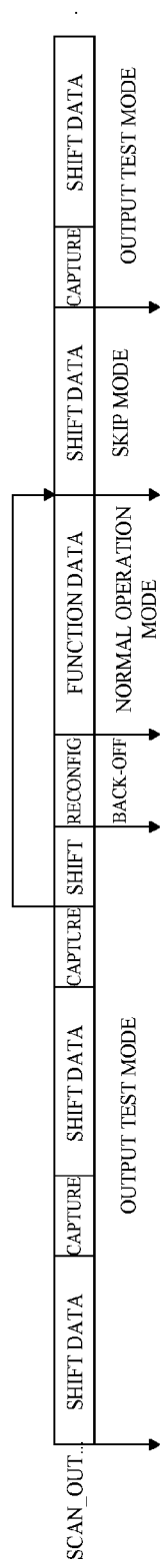
FIG. 22 is a view illustrating an example of switching a test mode to a normal operation mode.

FIG. 22 illustrates an example of switching a test mode to a normal operation mode.

As known with reference to FIG. 22, a data shifting process and a capturing step may be repeated during the output test mode. If there is an access to the CUT, the CUT is recovered to a normal operation mode and the test may be backed off. Thereafter, the skip mode is performed during a predetermined time period and then the output test mode may be performed again.

Figure 23:
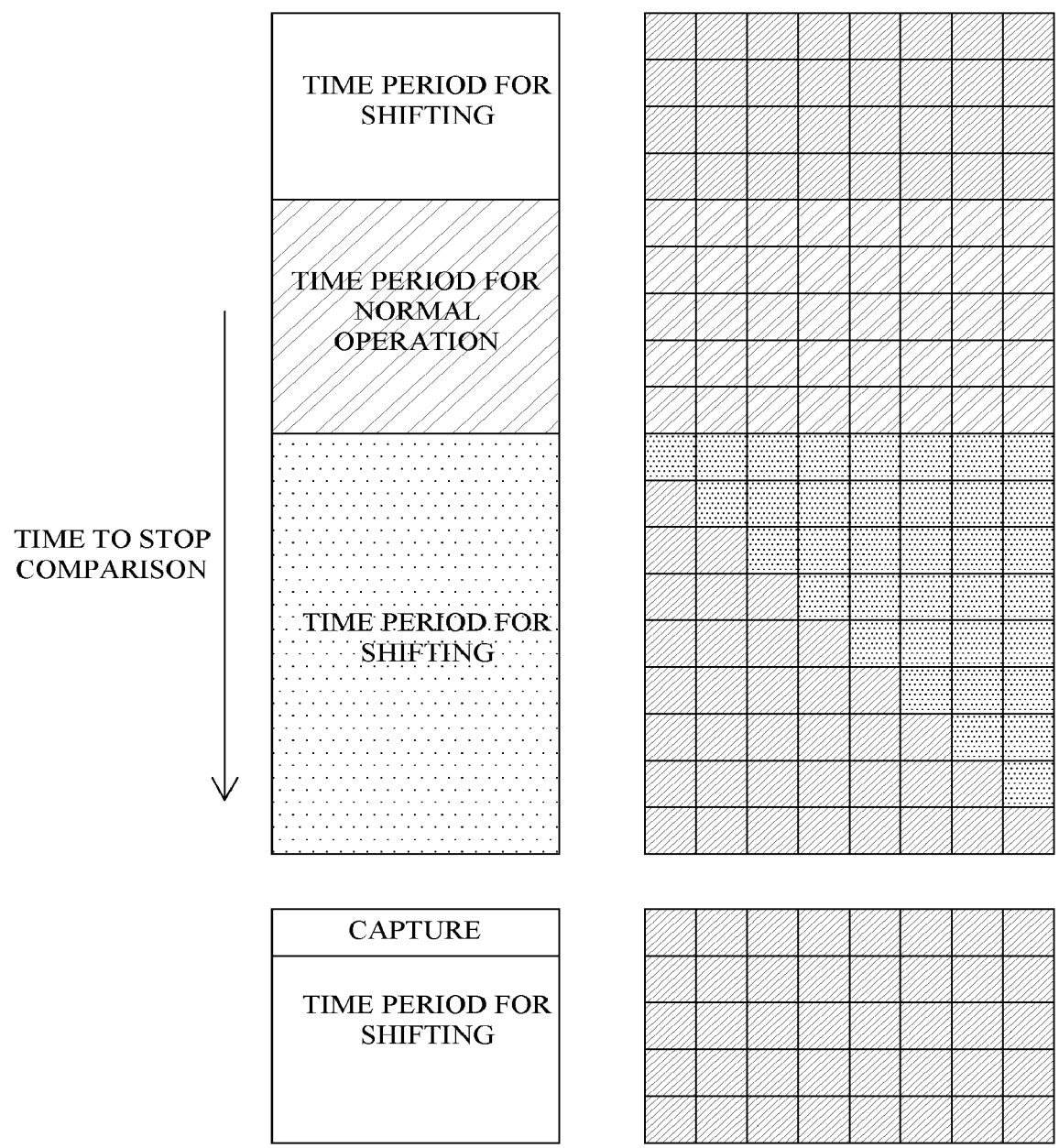
FIG. 23 is a view illustrating an example that flip-flops operate on a scan chain.
Figure 24:
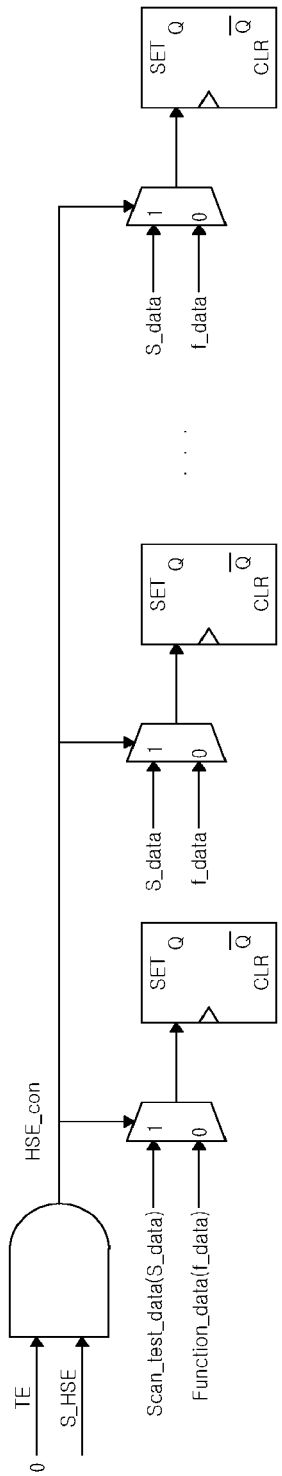
FIG. 24 is a view illustrating a part of a CUT which operates in a normal operation mode.

FIG. 23 illustrates an example that flip-flops operate on a scan chain, and FIG. 24 illustrates a part of a CUT which operates in a normal operation mode.

When an unexpected access to the CUT from the system bus is generated, TEST_ENABLE is disabled and the data shifting or capturing may be quickly stopped. The CUT is recovered to a normal operation mode and the test may be backed off.

When the CUT enters an idle state again, a previous data shift step may start over for the test. However, in a first shifting step after shifting from the normal operation mode to the test operation mode, the comparison of the output result is deactivated and the comparison of the output results may be performed from the subsequent capturing step.

That is, as illustrated in FIGS. 23 and 24, the shifted input values are not loaded in all the flip-flops at the scan chain, and the comparison may not be performed.

V. Simulations

In order to verify the above-described contents, simulations were performed from simple sub-cases to complex sub-cases using an electronic design automation tool of Synopsys, Inc. When the verification is successfully performed, a design implemented by software codes may be converted into a logic gate. As a next step, all D-flip-flops (DFFs) may be replaced by the scan flip-flop and scan chains may be generated. In order to increase a range covered by the test, Netlist may be repeatedly modified and tested. The ATPG tool may be used to generate the test vector and the intended result. When a scan and a test pattern into which the Netlist is inserted are prepared, the ICT may be applied to the design. Details of each test case will be described with reference to the drawings.

Figure 25:
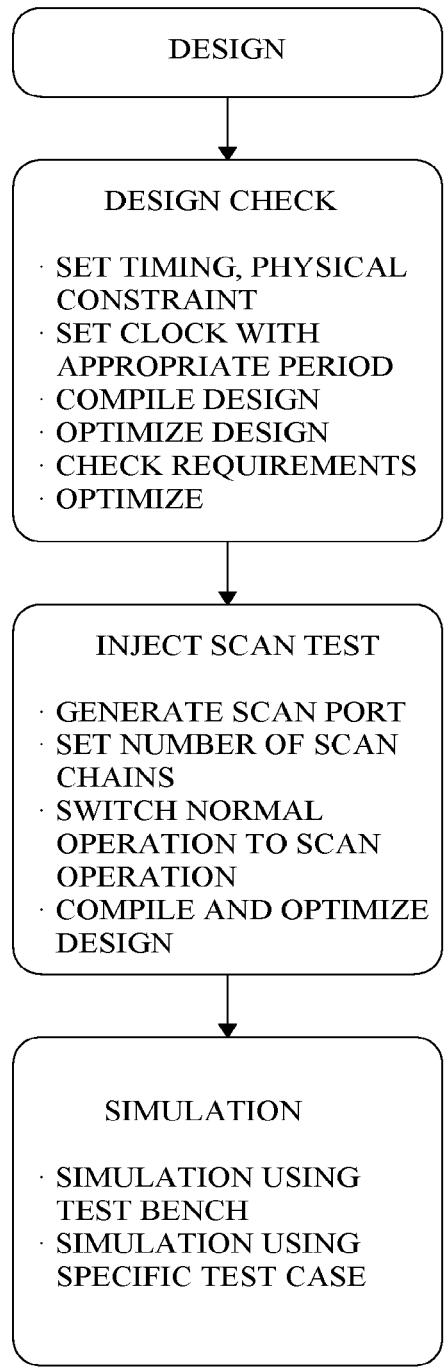
FIG. 25 is an exemplary view illustrating a process for simulation.

FIG. 25 illustrates a process for simulation.

The illustrated simulation process uses a design compiler tool of Synopsys, Inc. A design compiler (DC) too may be used to convert a software code into a logic gate level based on a timing restriction such as a period, conversion, capacitance, timing information included in a library package. When all restrictions are satisfied, the value optimization may be repeatedly performed. When the design does not satisfy the requirement, the restriction may be adjusted.

The output of the DC tool including the above-described timing restriction may be used as an input of a design for test (DFT).

In a scan test injecting step, the number of scan ports and a scan chain may be set. Generally, in order to minimize an additional port during the design, original input and output ports are used to generate a scan port. Further, the number of input scan ports is equal to the number of scan chains. The larger the number of scan chains, the smaller the number of shift clock cycles to shift the data. Accordingly, the maximizing of the number of scan chains is the best option for the test. When the scan setting is completed, the DFT compiler may replace all the flip-flops with the flip-flops for scanning and connects the scan input (scan_in) pin and a scan out (scan_out) pin to each other to generate a scan chain. Additional connection and the scan flip-flops make the design more complex and cause the time delay in most of the data path so that DFT compiler may continuously optimize the power and the timing after connecting the scan chains. After completing the scan test injection, the DFT DRC which follows the DFT rule checks whether all test connections are connected. The test input data (that is, a test vector) is ready.

In order to check the test range and generate the test pattern, the output of the DFT compiler is input to Tetramax of Synopsys, Inc. When the test range does not satisfy the intended requirement, the scan test injecting step may be performed again to modify the design. This task may be repeated until a desired test range is acquired.

V-1. Experiment for Design

As an experiment for design, a JPEG image encoder may be used. This test may use approximately 265,118 combinational cells, 72,345 sequential cells, and 31,439 inverter/buffer cells. As a result of performing based on cell library information and many threshold values, it was confirmed that a frequency which satisfies the timing restriction was 100 MHz and a frequency for shifting the test pattern was 1 GHz. Approximately 512 scan chains were used and the maximum number of flip-flops used at each scan chain was 75. Accordingly, it was confirmed that a time period used to shift the test pattern was approximately 75 cycles which correspond to 75 ns. One cycle is consumed to capture the data, which corresponds to approximately 10 ns. Approximately 256 test patterns are input and each test pattern includes approximately 75 test vectors for shifting and approximately one test vector may be used for capturing. In order to complete one test period, 13,260 (156×75+156×10) ns was taken.

Figure 26:
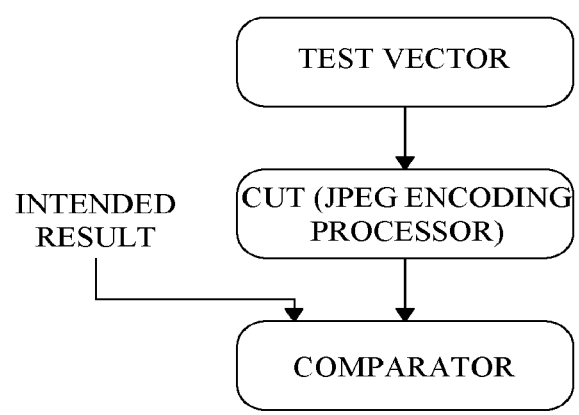
FIG. 26 is a view illustrating a test architecture for a JPEG image encoder.

FIG. 26 illustrates a test architecture for a JPEG image encoder.

As described above, in order to check whether a ratio of controllable and observable nodes is sufficient for the test, Tetramax is used to confirm the test range. Generally, 99.97% of test range and 1,483.5 K bytes were used for the test.

From the viewpoint of power consumption, each test was measured by different types of inputs. In the following Table 1, an internal power, a switching power, and a leaked power for each input are represented. Specifically, inputs which cannot be controlled for the test mode and the normal mode were implemented first. This is called static power measurement. After inputting to the power compiler tool, in order to estimate the power consumption in the test mode, a TE (test_enable) port was turned on and in order to estimate the power consumption in the normal operation mode, the TE (test_enable) port was turned off. Second, in order to estimate the power consumption, the inputs were controlled by a specific time interval. This is called dynamic power estimation. The controlling of inputs may be classified into three modes. First, the test mode is turned on and the test pattern is provided. Second, the test mode is turned off, and an input for the normal operation is provided. Third, after completing the test for each test pattern, the mode is switched to the normal operation mode. In order to obtain a power consumption value therefor, the test mode and the normal operation mode are switched.

The following table is a power consumption value of a JPEG image encoder.

TABLE 1

| Type of power consumption | Uncontrollable input | | Control input (114,360 ns) | | |
|---|---|---|---|---|---|
| | Test mode | Normal operation mode | Test mode | Normal operation mode | Switch_F_S |
| Switching power (mw) | 265.4368 | 3.4659 | 945.5015 | 76.6824 | 622.9294 |
| Internal power (mw) | 487.6708 | 2.9630 | 1.5978e+03 | 109.4660 | 1.0651e+03 |
| Leakage power (mw) | 4.05 | 4.0645 | 4.0479 | 4.058 | 4.0502 |
| Total power (mw) | 757.1588 | 10.4934 | 2.5474e+03 | 190.2058 | 1.6921e+03 |

Similar to the JPEG image encoder, a functional component for an advanced encryption standard (AES) was tested. Further, the functional component for image classification in an autonomous vehicle was also tested. The results are represented below.

The following Table 2 represents an AES design.

TABLE 2

| | |
|---|---|
| Number of combinational cell | 160,261 |
| Number of sequential cells | 11,701 |
| Number of buffers/inverters | 22,377 |
| Entire area | 400,464.797234 |
| Frequency of normal operation mode | 100 Mhz |
| Frequency of test mode | 1 Ghz |
| Tshift | 46 ns |
| Tcapture | 10 ns |
| Number of test patterns | 315 |
| Range of test | 100% |
| Memory size | 948.5 KBytes |

The following Table 3 represents a test for a functional component for AES.

TABLE 3

| Power estimate (mW) | No control input | | Control input (402 ns) | | Normal operation mode & Test mode |
|---|---|---|---|---|---|
| | Scan mode | Normal operation mode | Scan mode | Normal operation mode | |
| Switching power | 59.7507 | 23.0733 | 213.8727 | 1.7887 | 135.5754 |
| Internal power | 106.2405 | 32.7560 | 307.6255 | 2.6223 | 192.9561 |
| Leakage power | 1.3456 | 1.3455 | 1.3456 | 1.3516 | 1.3459 |
| Total power | 167.3375 | 57.1769 | 522.8372 | 5.7625 | 329.8691 |

The following Table 4 represents details of CONVO2.

TABLE 4

| | |
|---|---|
| Number of combinational cells | 2,245,932 |
| Number of sequential cells | 424,695 |
| Number of buffers/inverters | 154,510 |
| Frequency of normal operation mode | 50 Mhz |
| Frequency of test mode | 1 Ghz |
| Tshift | 829 ns |
| Tcapture | 20 ns |
| Number of test patterns | 183 |
| Range of test | 100% |
| Memory size | 18.634 Mbytes |

The following Table 5 represents power consumption for CONVO2.

TABLE 5

| Power estimate (mW) | No control input | |
|---|---|---|
| | Scan mode | Normal operation mode |
| Switching power | 3,721.1 | 390.9510 |
| Internal power | 5,759.5 | 633.5883 |
| Leakage power | 0.427 | 0.426 |
| Total power | 9,540.8 | 1,070 |

The function test and the test through the scan injection have advantages and disadvantages. The test through scan injection has a disadvantage in that more memories are used as compared with the function test and the time is delayed and has an advantage in that the range of the test is broad.

Specifically, when the SoC or SiP is mounted in a product which requires a high reliability like an autonomous vehicle, a drone, an urban air mobility (UAM) vehicle, an unmanned aerial vehicle (UAV), a scan injection type test having a broad test range may be advantageous. Further, the scan injection type test may increase a frequency for a test operation and reduce the test time. When it takes a long time to test, the possibility of the car accident may be increased so that it is not desirable. The scan injection type test may increase a frequency for a test operation so that more test patterns may be injected during the idle time and the hardware defect in the SoC may be more quickly detected. The normal function test has an advantage in that the power consumption is small, but in the environment in which the high reliability is required, such as the autonomous vehicle, a drone, an urban air mobility (UAM) vehicle, or an unmanned aerial vehicle (UAV), the power consumption does not matter.

The SoC has been mainly explained so far, but the disclosure of the present specification is not limited to the SoC and the contents of the present disclosure are also applicable to a system in package (SIP) or a printed circuit board (PCB)-based board level system. For example, each functional component is implemented by an independent semiconductor chip and is connected by a system bus which is implemented by an electrically conductive pattern formed on the PCB.

The examples of the present disclosure disclosed in the present specification and the drawings merely provide a specific example for easy description and better understanding of the technical description of the present disclosure, but are not intended to limit the scope of the present disclosure. It is obvious to those skilled in the art that other modifications are possible in addition to the examples described so far.

[National R&D Project Supporting This Invention]
[Project Identification Number] 1711175834
[Task Number] R-20210401-010439
[Name of Ministry] Ministry of Science and ICT
[Name of Task Management (Specialized) Institution] National IT Industry Promotion Agency
[Research Project Title] Intensive fostering of artificial intelligence semiconductor innovation companies
[Research Task Name] Development of Compiler and Runtime SW Technology for Artificial Neural Network Processors for Edge
[Name of the organization performing the task] DeepX Co., Ltd.
[Research Period] 2022.06.01~ 2023.02.28

What is claimed is:

1. A neural processing unit (NPU) for testing a component during runtime, the NPU comprising:
    a plurality of functional components including a first functional component and a second functional component,
    wherein the first functional component includes a plurality of processing elements (PEs) for an operation of an artificial neural network (ANN), and
    wherein a second group of PEs among the plurality of PEs is configured to perform the operation of the ANN if a first group of PEs among the plurality of PEs are selected as a component under test (CUT) and undergoes a test.

2. The NPU of claim 1,
wherein the second functional component includes at least one controller and at least one memory.

3. The NPU of claim 2, wherein the at least one memory is selected as a component under test (CUT) and undergoes a memory test.

4. The NPU of claim 2,
wherein the at least one memory includes a plurality of memory instances, the plurality of memory instances including a first group of memory instances and a second group of memory instances, and
wherein the second group of memory instances is configured to be used if the test is performed on the first group of memory instances.

5. The NPU of claim 3,
wherein the memory test is a first type of test or a second type of test,
wherein the first type of the test uses an error detection code, and
wherein the second type of test is a read-write test.

6. The NPU of claim 1, further comprising a component tester configured to monitor each state of the plurality of functional components.

7. The NPU of claim 1,
wherein the test is a first type of test or a second type of test, and
wherein the first type of the test is a scan test and the second type of test is a function test.

8. The NPU of claim 1, wherein the test is stopped, based on a detection of a collision due to an access to the first group of PEs.

9. The NPU of claim 1, wherein the test is started, when a collision due to an access to the first group of PEs is not detected.

10. A tester for detecting a defect of a neural processing unit (NPU), the tester comprising:
a component tester configured to:
communicate with a plurality of functional components including a first functional component and a second functional component, wherein the first functional component includes a plurality of processing elements (PEs) for an operation of an artificial neural network (ANN),
select a first group of PEs among the plurality of PEs as a component under test (CUT),
prepare a test for the selected CUT,
stop the test, based on a detection of a collision due to an access to the selected CUT, and
start and complete the test, when no collision is detected.

11. The tester of claim 10, wherein the component tester is included in the NPU or is disposed external to the NPU.

12. The tester of claim 10, further comprising an interface configured to enable communication between the component tester and the plurality of functional components.

13. The tester of claim 10, wherein the component tester is configured to perform the test during runtime of the NPU.

14. The tester of claim 10, further comprising a wrapper arranged in correspondence to each of the plurality of functional components.

15. A system comprising:
a neural processing unit (NPU) comprising a plurality of functional components including a first functional component and a second functional component,
wherein the first functional component includes a plurality of processing elements (PEs) for an operation of an artificial neural network (ANN), and
wherein a second group of PEs among the plurality of PEs is configured to perform the operation of the ANN if a first group of PEs among the plurality of PEs are selected as a component under test (CUT) and undergoes a test.

16. The system of claim 15,
wherein the second functional component includes at least one controller and at least one memory.

17. The system of claim 16, wherein the at least one memory is selected as a component under test (CUT) and undergoes a memory test.

18. The system of claim 17,
wherein the memory test is a first type of test or a second type of test,
wherein the first type of the test uses an error detection code, and
wherein the second type of test is a read-write test.

19. The system of claim 15, further comprising a component tester configured to monitor each state of the plurality of functional components.

20. The system of claim 15,
wherein the test is a first type of test or a second type of test, and
wherein the first type of the test is a scan test and the second type of test is a function test.

* * * * *